US009001412B2

(12) United States Patent
Chui et al.

(10) Patent No.: US 9,001,412 B2
(45) Date of Patent: *Apr. 7, 2015

(54) ELECTROMECHANICAL DEVICE WITH OPTICAL FUNCTION SEPARATED FROM MECHANICAL AND ELECTRICAL FUNCTION

(71) Applicant: QUALCOMM MEMS Technologies, Inc., San Diego, CA (US)

(72) Inventors: Clarence Chui, San Jose, CA (US); William Cummings, Hsinchu (TW); Brian James Gally, Los Gatos, CA (US); Lior Kogut, Haifa (IL); Ming-Hau Tung, San Francisco, CA (US); Yeh-Jiun Tung, Sunnyvale, CA (US); Chih-Wei Chiang, Hsin-Chu (TW); Denis Endisch, Cupertino, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/648,750

(22) Filed: Oct. 10, 2012

(65) Prior Publication Data
US 2013/0069958 A1    Mar. 21, 2013

Related U.S. Application Data

(63) Continuation of application No. 13/086,113, filed on Apr. 13, 2011, now Pat. No. 8,289,613, which is a continuation of application No. 11/772,777, filed on Jul. 2, 2007, now Pat. No. 7,944,599, which is a (Continued)

(51) Int. Cl.
*G02B 26/00* (2006.01)
*G02F 1/29* (2006.01)
(Continued)

(52) U.S. Cl.
CPC .............. *G02B 26/001* (2013.01); *G02B 26/08* (2013.01); *G09G 3/3696* (2013.01); *G02F 1/29* (2013.01);
(Continued)

(58) Field of Classification Search
CPC .. G02B 26/00; G02B 26/001; G02B 26/0841; G02B 26/06; G02B 26/023; G02B 26/08; G02B 26/007; G02B 26/0816; G02B 5/0858; G02B 5/201; G02F 1/29; G02F 1/01; G02F 1/0128; G02F 1/133621; G09G 3/3466; G09G 3/3696
USPC ........... 359/223.1, 224.1, 290–292, 295, 298, 359/318, 224.2; 348/770, 771; 345/85, 108
See application file for complete search history.

(56) References Cited

U.S. PATENT DOCUMENTS 2,534,846 A     12/1950   Ambrose et al.
2,590,906 A     4/1952    Tripp
(Continued)

FOREIGN PATENT DOCUMENTS

CN     1474954      2/2004
CN     1755498      4/2006
(Continued)

OTHER PUBLICATIONS

Billard, Tunable Capacitor, 5th Annual Review of LETI, Jun. 24, 2003, p. 7.
(Continued)

*Primary Examiner* — Evelyn A Lester
(74) *Attorney, Agent, or Firm* — Knobbe Martens Olson & Bear, LLP

(57) ABSTRACT

A microelectromechanical (MEMS) device includes a substrate, a movable element over the substrate, and an actuation electrode above the movable element. The movable element includes a deformable layer and a reflective element. The deformable layer is spaced from the reflective element.

42 Claims, 23 Drawing Sheets

Related U.S. Application Data continuation of application No. 11/112,734, filed on Apr. 22, 2005, now Pat. No. 7,372,613.

(60) Provisional application No. 60/613,486, filed on Sep. 27, 2004, provisional application No. 60/613,499, filed on Sep. 27, 2004.

(51) Int. Cl.
| | | |
|---|---|---|
| *G02B 26/02* | (2006.01) | |
| *B81B 3/00* | (2006.01) | |
| G02B 26/08 | (2006.01) | |
| G09G 3/36 | (2006.01) | |
| G02F 1/1335 | (2006.01) | |
| G02F 1/01 | (2006.01) | |
| G09G 3/34 | (2006.01) | |

(52) U.S. Cl.
CPC ......... *G02F 1/133621* (2013.01); *G02F 1/0128* (2013.01); *G02B 26/023* (2013.01); *G02F 1/01* (2013.01); *G09G 3/3466* (2013.01); *B81B 3/0051* (2013.01); *B81B 2201/047* (2013.01)

(56) References Cited

U.S. PATENT DOCUMENTS

| | | |
|---|---|---|
| 2,677,714 A | 5/1954 | Auwarter |
| 3,247,392 A | 4/1966 | Thelen |
| 3,439,973 A | 4/1969 | Bernt et al. |
| 3,443,854 A | 5/1969 | Herbert |
| 3,653,741 A | 4/1972 | Alvin |
| 3,656,836 A | 4/1972 | Baudoin et al. |
| 3,679,313 A | 7/1972 | Rosenberg |
| 3,725,868 A | 4/1973 | Malmer et al. |
| 3,728,030 A | 4/1973 | Malmer, Jr. et al. |
| 3,813,265 A | 5/1974 | Marks |
| 3,886,310 A | 5/1975 | Guldberg |
| 3,955,190 A | 5/1976 | Teraishi |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,421,381 A | 12/1983 | Ueda et al. |
| 4,441,789 A | 4/1984 | Pohlack |
| 4,441,791 A | 4/1984 | Hornbeck |
| 4,445,050 A | 4/1984 | Marks |
| 4,459,182 A | 7/1984 | Te Velde |
| 4,482,213 A | 11/1984 | Piliavin et al. |
| 4,497,974 A | 2/1985 | Deckman et al. |
| 4,498,953 A | 2/1985 | Cook et al. |
| 4,500,171 A | 2/1985 | Penz et al. |
| 4,519,676 A | 5/1985 | Te Velde |
| 4,531,126 A | 7/1985 | Sadones |
| 4,560,435 A | 12/1985 | Brown et al. |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,655,554 A | 4/1987 | Armitage |
| 4,662,746 A | 5/1987 | Hornbeck |
| 4,663,083 A | 5/1987 | Marks |
| 4,666,254 A | 5/1987 | Itoh et al. |
| 4,681,403 A | 7/1987 | Te Velde et al. |
| 4,705,361 A | 11/1987 | Frazier et al. |
| 4,710,732 A | 12/1987 | Hornbeck |
| 4,748,366 A | 5/1988 | Taylor |
| 4,779,959 A | 10/1988 | Saunders |
| 4,786,128 A | 11/1988 | Birnbach |
| 4,790,635 A | 12/1988 | Apsley |
| 4,822,993 A | 4/1989 | Dillon et al. |
| 4,856,863 A | 8/1989 | Sampsell et al. |
| 4,857,978 A | 8/1989 | Goldburt et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,973,131 A | 11/1990 | Carnes |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,062,689 A | 11/1991 | Koehler |
| 5,075,796 A | 12/1991 | Schildkraut et al. |
| 5,078,479 A | 1/1992 | Vuilleumier |
| 5,079,544 A | 1/1992 | Demond et al. |
| 5,083,857 A | 1/1992 | Hornbeck |
| 5,091,983 A | 2/1992 | Lukosz |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | Demond et al. |
| 5,170,283 A | 12/1992 | O'Brien et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | Demond et al. |
| 5,212,582 A | 5/1993 | Nelson |
| 5,214,419 A | 5/1993 | Demond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |

(56) References Cited

U.S. PATENT DOCUMENTS

| | | |
|---|---|---|
| 5,452,138 A | 9/1995 | Mignardi et al. |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,471,341 A | 11/1995 | Warde et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 4,925,259 A | 5/1996 | Emmett |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,550,373 A | 8/1996 | Cole et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,561,523 A | 10/1996 | Blomberg et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,365 A | 4/1997 | Rhoads et al. |
| 5,619,366 A | 4/1997 | Rhoads et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,729 A | 7/1997 | Koskinen et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,661,591 A | 8/1997 | Lin et al. |
| 5,661,592 A | 8/1997 | Bornstein et al. |
| 5,665,997 A | 9/1997 | Weaver et al. |
| 5,673,139 A | 9/1997 | Johnson |
| 5,683,591 A | 11/1997 | Offenberg |
| 5,699,181 A | 12/1997 | Choi |
| 5,703,710 A | 12/1997 | Brinkman et al. |
| 5,710,656 A | 1/1998 | Goossen |
| 5,719,068 A | 2/1998 | Suzawa et al. |
| 5,726,480 A | 3/1998 | Pister |
| 5,734,177 A | 3/1998 | Sakamoto |
| 5,739,945 A | 4/1998 | Tayebati |
| 5,740,150 A | 4/1998 | Uchimaru et al. |
| 5,745,193 A | 4/1998 | Urbanus et al. |
| 5,745,281 A | 4/1998 | Yi et al. |
| 5,751,469 A | 5/1998 | Arney et al. |
| 5,771,116 A | 6/1998 | Miller et al. |
| 5,784,190 A | 7/1998 | Worley |
| 5,784,212 A | 7/1998 | Hornbeck |
| 5,786,927 A | 7/1998 | Greywall et al. |
| 5,793,504 A | 8/1998 | Stoll |
| 5,808,780 A | 9/1998 | McDonald |
| 5,808,781 A | 9/1998 | Arney et al. |
| 5,818,095 A | 10/1998 | Sampsell |
| 5,825,528 A | 10/1998 | Goossen |
| 5,835,255 A | 11/1998 | Miles |
| 5,838,484 A | 11/1998 | Goossen et al. |
| 5,842,088 A | 11/1998 | Thompson |
| 5,867,302 A | 2/1999 | Fleming |
| 5,870,221 A | 2/1999 | Goossen |
| 5,905,482 A | 5/1999 | Hughes et al. |
| 5,912,758 A | 6/1999 | Knipe et al. |
| 5,914,804 A | 6/1999 | Goossen |
| 5,920,418 A | 7/1999 | Shiono et al. |
| 5,943,158 A | 8/1999 | Ford et al. |
| 5,959,763 A | 9/1999 | Bozler et al. |
| 5,961,848 A | 10/1999 | Jacquet et al. |
| 5,986,796 A | 11/1999 | Miles |
| 5,994,174 A | 11/1999 | Carey et al. |
| 6,028,689 A | 2/2000 | Michalicek et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,046,659 A | 4/2000 | Loo et al. |
| 6,046,840 A | 4/2000 | Huibers |
| 6,049,317 A | 4/2000 | Thompson et al. |
| 6,055,090 A | 4/2000 | Miles |
| 6,056,406 A | 5/2000 | Park |
| 6,061,075 A | 5/2000 | Nelson et al. |
| 6,097,145 A | 8/2000 | Kastalsky et al. |
| 6,099,132 A | 8/2000 | Kaeriyama |
| 6,100,861 A | 8/2000 | Cohen et al. |
| 6,100,872 A | 8/2000 | Aratani et al. |
| 6,113,239 A | 9/2000 | Sampsell et al. |
| 6,124,851 A | 9/2000 | Jacobsen |
| 6,147,790 A | 11/2000 | Meier et al. |
| 6,158,156 A | 12/2000 | Patrick |
| 6,160,833 A | 12/2000 | Floyd et al. |
| 6,171,945 B1 | 1/2001 | Mandal et al. |
| 6,172,797 B1 | 1/2001 | Huibers |
| 6,180,428 B1 | 1/2001 | Peeters et al. |
| 6,195,196 B1 | 2/2001 | Koichi et al. |
| 6,201,633 B1 | 3/2001 | Peeters et al. |
| 6,215,221 B1 | 4/2001 | Cabuz et al. |
| 6,232,936 B1 | 5/2001 | Gove et al. |
| 6,239,777 B1 | 5/2001 | Sugahara et al. |
| 6,242,932 B1 | 6/2001 | Hembree |
| 6,243,149 B1 | 6/2001 | Swanson et al. |
| 6,262,697 B1 | 7/2001 | Stephenson |
| 6,282,010 B1 | 8/2001 | Sulzbach et al. |
| 6,288,472 B1 | 9/2001 | Cabuz et al. |
| 6,288,824 B1 | 9/2001 | Kastalsky |
| 6,295,154 B1 | 9/2001 | Laor et al. |
| 6,301,000 B1 | 10/2001 | Johnson |
| 6,323,982 B1 | 11/2001 | Hornbeck |
| 6,323,987 B1 | 11/2001 | Rinaudo et al. |
| 6,327,071 B1 | 12/2001 | Kimura |
| 6,331,909 B1 | 12/2001 | Dunfield |
| 6,335,235 B1 | 1/2002 | Bhakta et al. |
| 6,335,831 B2 | 1/2002 | Kowarz et al. |
| 6,351,329 B1 | 2/2002 | Greywall |
| 6,356,254 B1 | 3/2002 | Kimura |
| 6,356,378 B1 | 3/2002 | Huibers |
| 6,358,021 B1 | 3/2002 | Cabuz |
| 6,376,787 B1 | 4/2002 | Martin et al. |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |

(56) References Cited

U.S. PATENT DOCUMENTS

| | | |
|---|---|---|
| 6,407,851 B1 | 6/2002 | Islam et al. |
| 6,417,868 B1 | 7/2002 | Bock et al. |
| 6,433,917 B1 | 8/2002 | Mei et al. |
| 6,437,583 B1 | 8/2002 | Tartagni et al. |
| 6,438,282 B1 | 8/2002 | Takeda et al. |
| 6,447,126 B1 | 9/2002 | Hornbeck |
| 6,449,084 B1 | 9/2002 | Guo |
| 6,452,712 B2 | 9/2002 | Atobe et al. |
| 6,456,420 B1 | 9/2002 | Goodwin-Johansson |
| 6,465,355 B1 | 10/2002 | Horsley |
| 6,466,190 B1 | 10/2002 | Evoy |
| 6,466,354 B1 | 10/2002 | Gudeman |
| 6,466,358 B2 | 10/2002 | Tew |
| 6,473,072 B1 | 10/2002 | Comiskey et al. |
| 6,473,274 B1 | 10/2002 | Maimone et al. |
| 6,480,177 B2 | 11/2002 | Doherty et al. |
| 6,496,122 B2 | 12/2002 | Sampsell |
| 6,519,073 B1 | 2/2003 | Goossen |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,556,338 B2 | 4/2003 | Han et al. |
| 6,574,033 B1 | 6/2003 | Chui et al. |
| 6,597,490 B2 | 7/2003 | Tayebati |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,624,944 B1 | 9/2003 | Wallace et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,643,069 B2 | 11/2003 | Dewald |
| 6,650,455 B2 | 11/2003 | Miles |
| 6,657,832 B2 | 12/2003 | Williams et al. |
| 6,660,656 B2 | 12/2003 | Cheung et al. |
| 6,661,561 B2 | 12/2003 | Fitzpatrick et al. |
| 6,666,561 B1 | 12/2003 | Blakley |
| 6,674,090 B1 | 1/2004 | Chua et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,741,377 B2 | 5/2004 | Miles |
| 6,741,383 B2 | 5/2004 | Huibers et al. |
| 6,741,384 B1 | 5/2004 | Martin et al. |
| 6,741,503 B1 | 5/2004 | Farris et al. |
| 6,747,785 B2 | 6/2004 | Chen et al. |
| 6,747,800 B1 | 6/2004 | Lin |
| 6,768,555 B2 | 7/2004 | Chen |
| 6,775,174 B2 | 8/2004 | Huffman et al. |
| 6,778,155 B2 | 8/2004 | Doherty et al. |
| 6,794,119 B2 | 9/2004 | Miles |
| 6,809,788 B2 | 10/2004 | Yamada et al. |
| 6,811,267 B1 | 11/2004 | Allen et al. |
| 6,813,059 B2 | 11/2004 | Hunter et al. |
| 6,819,469 B1 | 11/2004 | Koba |
| 6,822,628 B2 | 11/2004 | Dunphy et al. |
| 6,829,132 B2 | 12/2004 | Martin et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,862,127 B1 | 3/2005 | Ishii |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,959,990 B2 | 11/2005 | Penn |
| 6,960,305 B2 | 11/2005 | Doan et al. |
| 6,980,350 B2 | 12/2005 | Hung et al. |
| 6,982,820 B2 | 1/2006 | Tsai |
| 7,002,726 B2 | 2/2006 | Patel et al. |
| 7,006,272 B2 | 2/2006 | Tsai |
| 7,008,812 B1 | 3/2006 | Carley |
| 7,009,754 B2 | 3/2006 | Huibers |
| 7,012,732 B2 | 3/2006 | Miles |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,053,737 B2 | 5/2006 | Schwartz et al. |
| 7,072,093 B2 | 7/2006 | Piehl et al. |
| 7,075,700 B2 | 7/2006 | Muenter |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,126,741 B2 | 10/2006 | Wagner et al. |
| 7,130,104 B2 | 10/2006 | Cummings |
| 7,138,984 B1 | 11/2006 | Miles |
| 7,142,346 B2 | 11/2006 | Chui et al. |
| 7,161,728 B2 | 1/2007 | Sampsell et al. |
| 7,184,195 B2 | 2/2007 | Yang |
| 7,184,202 B2 | 2/2007 | Miles et al. |
| 7,187,489 B2 | 3/2007 | Miles |
| 7,196,837 B2 | 3/2007 | Sampsell et al. |
| 7,198,873 B2 | 4/2007 | Lin et al. |
| 7,198,973 B2 | 4/2007 | Lin et al. |
| 7,221,495 B2 | 5/2007 | Miles et al. |
| 7,236,284 B2 | 6/2007 | Miles |
| 7,242,512 B2 | 7/2007 | Chui et al. |
| 7,245,285 B2 | 7/2007 | Yeh et al. |
| 7,250,315 B2 | 7/2007 | Miles |
| 7,289,259 B2 | 10/2007 | Chui et al. |
| 7,297,471 B1 | 11/2007 | Miles |
| 7,301,704 B2 | 11/2007 | Miles |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,355,782 B2 | 4/2008 | Miles |
| 7,369,296 B2 | 5/2008 | Floyd |
| 7,372,613 B2 | 5/2008 | Chui et al. |
| 7,372,619 B2 | 5/2008 | Miles |
| 7,379,227 B2 | 5/2008 | Miles |
| 7,382,515 B2 | 6/2008 | Chung et al. |
| 7,385,748 B2 | 6/2008 | Miles |
| 7,388,697 B2 | 6/2008 | Chui et al. |
| 7,388,706 B2 | 6/2008 | Miles |
| RE40,436 E | 7/2008 | Kothari et al. |
| 7,405,852 B2 | 7/2008 | Hagood, IV et al. |
| 7,405,863 B2 | 7/2008 | Tung et al. |
| 7,417,746 B2 | 8/2008 | Lin et al. |
| 7,417,784 B2 | 8/2008 | Sasagawa et al. |
| 7,420,725 B2 | 9/2008 | Kothari |
| 7,436,573 B2 | 10/2008 | Doan et al. |
| 7,459,402 B2 | 12/2008 | Doan et al. |
| 7,460,291 B2 | 12/2008 | Sampsell et al. |
| 7,460,292 B2 | 12/2008 | Chou |
| 7,463,421 B2 | 12/2008 | Miles |
| 7,471,444 B2 | 12/2008 | Miles |
| 7,476,327 B2 | 1/2009 | Tung et al. |
| 7,477,440 B1 | 1/2009 | Huang |
| 7,483,197 B2 | 1/2009 | Miles |
| 7,486,867 B2 | 2/2009 | Wang |
| 7,489,428 B2 | 2/2009 | Sampsell et al. |
| 7,492,503 B2 | 2/2009 | Chui |
| 7,508,566 B2 | 3/2009 | Feenstra et al. |
| 7,513,327 B1 | 4/2009 | Peterson |

(56) References Cited

U.S. PATENT DOCUMENTS

| | | | |
|---|---|---|---|
| 7,527,995 B2 | 5/2009 | Sampsell |
| 7,527,996 B2 | 5/2009 | Luo et al. |
| 7,532,377 B2 | 5/2009 | Miles |
| 7,532,381 B2 | 5/2009 | Miles |
| 7,532,386 B2 | 5/2009 | Cummings et al. |
| 7,534,640 B2 | 5/2009 | Sasagawa et al. |
| 7,535,466 B2 | 5/2009 | Sampsell et al. |
| 7,535,621 B2 | 5/2009 | Chiang |
| 7,542,189 B2 | 6/2009 | Tanimura et al. |
| 7,545,554 B2 | 6/2009 | Chui et al. |
| 7,547,565 B2 | 6/2009 | Lin |
| 7,550,794 B2 | 6/2009 | Miles et al. |
| 7,550,810 B2 | 6/2009 | Mignard et al. |
| 7,554,711 B2 | 6/2009 | Miles |
| 7,554,714 B2 | 6/2009 | Chui et al. |
| 7,556,917 B2 | 7/2009 | Miles |
| 7,561,321 B2 | 7/2009 | Heald |
| 7,564,612 B2 | 7/2009 | Chui |
| 7,564,613 B2 | 7/2009 | Sasagawa et al. |
| 7,566,664 B2 | 7/2009 | Yan et al. |
| 7,566,940 B2 | 7/2009 | Sasagawa et al. |
| 7,569,488 B2 | 8/2009 | Rafanan |
| 7,586,484 B2 | 9/2009 | Sampsell et al. |
| 7,605,969 B2 | 10/2009 | Miles |
| 7,612,932 B2 | 11/2009 | Chui et al. |
| 7,619,810 B2 | 11/2009 | Miles |
| 7,623,287 B2 | 11/2009 | Sasagawa et al. |
| 7,630,119 B2 | 12/2009 | Tung et al. |
| 7,630,121 B2 | 12/2009 | Endisch et al. |
| 7,642,110 B2 | 1/2010 | Miles |
| 7,649,671 B2 | 1/2010 | Kothari et al. |
| 7,660,031 B2 | 2/2010 | Floyd |
| 7,660,058 B2 | 2/2010 | Qiu et al. |
| 7,663,794 B2 | 2/2010 | Cummings |
| 7,672,035 B2 | 3/2010 | Sampsell et al. |
| 7,679,627 B2 | 3/2010 | Sampsell et al. |
| 7,679,812 B2 | 3/2010 | Sasagawa et al. |
| 7,684,104 B2 | 3/2010 | Chui et al. |
| 7,692,844 B2 | 4/2010 | Miles |
| 7,704,772 B2 | 4/2010 | Tung et al. |
| 7,704,773 B2 | 4/2010 | Kogut et al. |
| 7,711,239 B2 | 5/2010 | Sasagawa et al. |
| 7,719,500 B2 | 5/2010 | Chui |
| 7,719,754 B2 | 5/2010 | Patel et al. |
| 7,723,015 B2 | 5/2010 | Miles |
| 7,738,157 B2 | 6/2010 | Miles |
| 7,747,109 B2 | 6/2010 | Zhong et al. |
| 7,768,690 B2 | 8/2010 | Sampsell |
| 7,776,631 B2 | 8/2010 | Miles |
| 7,781,850 B2 | 8/2010 | Miles et al. |
| 7,782,522 B2 | 8/2010 | Lan |
| 7,782,525 B2 | 8/2010 | Sampsell et al. |
| 7,787,173 B2 | 8/2010 | Chui |
| 7,791,787 B2 | 9/2010 | Miles |
| 7,800,809 B2 | 9/2010 | Miles |
| 7,808,694 B2 | 10/2010 | Miles |
| 7,826,120 B2 | 11/2010 | Miles |
| 7,830,586 B2 | 11/2010 | Miles |
| 7,830,587 B2 | 11/2010 | Miles |
| 7,830,588 B2 | 11/2010 | Miles |
| 7,830,589 B2 | 11/2010 | Floyd |
| 7,835,093 B2 | 11/2010 | Wang |
| 7,839,556 B2 | 11/2010 | Miles |
| 7,839,557 B2 | 11/2010 | Chui et al. |
| 7,839,559 B2 | 11/2010 | Miles |
| 7,846,344 B2 | 12/2010 | Miles |
| 7,848,001 B2 | 12/2010 | Miles |
| 7,848,004 B2 | 12/2010 | Miles |
| 7,852,544 B2 | 12/2010 | Sampsell |
| 7,852,545 B2 | 12/2010 | Miles |
| 7,864,402 B2 | 1/2011 | Chui et al. |
| 7,872,792 B2 | 1/2011 | Miles |
| 7,875,485 B2 | 1/2011 | Sasagawa et al. |
| 7,884,989 B2 | 2/2011 | Gally et al. |
| 7,889,415 B2 | 2/2011 | Kothari |
| 7,893,919 B2 | 2/2011 | Kothari et al. |
| 7,898,722 B2 | 3/2011 | Miles |
| 7,898,723 B2 | 3/2011 | Khazeni et al. |
| 7,903,316 B2 | 3/2011 | Kothari et al. |
| 7,907,319 B2 | 3/2011 | Miles |
| 7,916,980 B2 | 3/2011 | Lasiter et al. |
| 7,920,135 B2 | 4/2011 | Sampsell et al. |
| 7,924,494 B2 | 4/2011 | Tung et al. |
| 7,929,197 B2 | 4/2011 | Miles |
| 7,936,031 B2 | 5/2011 | Sampsell et al. |
| 7,936,497 B2 | 5/2011 | Chui et al. |
| 7,944,500 B2 | 5/2011 | Nihei et al. |
| 7,944,599 B2 | 5/2011 | Chui et al. |
| 7,944,603 B2 | 5/2011 | Sasagawa et al. |
| 7,948,671 B2 | 5/2011 | Tung et al. |
| 7,982,700 B2 | 7/2011 | Chui et al. |
| 7,999,993 B2 | 8/2011 | Chui et al. |
| 8,009,347 B2 | 8/2011 | Chui et al. |
| 8,014,059 B2 | 9/2011 | Miles |
| 8,023,167 B2 | 9/2011 | Sampsell |
| 8,035,883 B2 | 10/2011 | Kothari |
| 8,035,884 B2 | 10/2011 | Miles |
| 8,054,532 B2 | 11/2011 | Miles |
| 8,058,549 B2 | 11/2011 | Kothari et al. |
| 8,059,326 B2 | 11/2011 | Miles |
| 8,064,124 B2 | 11/2011 | Chung et al. |
| 8,081,369 B2 | 12/2011 | Miles |
| 8,081,370 B2 | 12/2011 | Sampsell |
| 8,081,373 B2 | 12/2011 | Kothari et al. |
| 8,098,416 B2 | 1/2012 | Kothari et al. |
| 8,105,496 B2 | 1/2012 | Miles |
| 8,115,988 B2 | 2/2012 | Chui et al. |
| 8,120,125 B2 | 2/2012 | Sasagawa et al. |
| 8,124,434 B2 | 2/2012 | Gally et al. |
| 8,149,497 B2 | 4/2012 | Sasagawa et al. |
| 8,213,075 B2 | 7/2012 | Chui et al. |
| 8,218,229 B2 | 7/2012 | Sasagawa et al. |
| 8,229,253 B2 | 7/2012 | Zhong et al. |
| 8,264,763 B2 | 9/2012 | Miles |
| 8,278,726 B2 | 10/2012 | Miles et al. |
| 8,284,474 B2 | 10/2012 | Miles |
| 8,289,613 B2 * | 10/2012 | Chui et al. ............. 359/290 |
| 8,298,847 B2 | 10/2012 | Kogut et al. |
| 8,344,470 B2 | 1/2013 | Sampsell et al. |
| 8,368,124 B2 | 2/2013 | Miles et al. |
| 8,416,487 B2 | 4/2013 | Miles |
| 8,422,108 B2 | 4/2013 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0054424 A1 | 5/2002 | Miles |
| 2002/0070931 A1 | 6/2002 | Ishikawa |
| 2002/0075555 A1 | 6/2002 | Miles |
| 2002/0114558 A1 | 8/2002 | Nemirovsky |
| 2002/0126364 A1 | 9/2002 | Miles |
| 2002/0139981 A1 | 10/2002 | Young |
| 2002/0146200 A1 | 10/2002 | Kurdle et al. |
| 2002/0149828 A1 | 10/2002 | Miles |
| 2002/0149834 A1 | 10/2002 | Mei et al. |
| 2002/0149850 A1 | 10/2002 | Heffner et al. |
| 2002/0154422 A1 | 10/2002 | Sniegowski et al. |
| 2002/0167072 A1 | 11/2002 | Andosca |
| 2002/0167730 A1 | 11/2002 | Needham et al. |
| 2002/0186483 A1 | 12/2002 | Hagelin et al. |
| 2002/0197761 A1 | 12/2002 | Patel et al. |
| 2003/0011864 A1 | 1/2003 | Flanders |
| 2003/0015936 A1 | 1/2003 | Yoon et al. |
| 2003/0016428 A1 | 1/2003 | Kato et al. |
| 2003/0029705 A1 | 2/2003 | Qiu et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |

(56) References Cited

U.S. PATENT DOCUMENTS

| | | |
|---|---|---|
| 2003/0138669 A1 | 7/2003 | Kojima et al. |
| 2003/0156315 A1 | 8/2003 | Li et al. |
| 2003/0173504 A1 | 9/2003 | Cole et al. |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0056742 A1 | 3/2004 | Dabbaj |
| 2004/0058532 A1 | 3/2004 | Miles et al. |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0124483 A1 | 7/2004 | Partridge et al. |
| 2004/0125281 A1 | 7/2004 | Lin et al. |
| 2004/0125347 A1 | 7/2004 | Patel et al. |
| 2004/0136045 A1 | 7/2004 | Tran |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard et al. |
| 2004/0150939 A1 | 8/2004 | Huff |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0184134 A1 | 9/2004 | Makigaki |
| 2004/0184766 A1 | 9/2004 | Kim et al. |
| 2004/0188599 A1 | 9/2004 | Viktorovitch et al. |
| 2004/0201908 A1 | 10/2004 | Kaneko |
| 2004/0207897 A1 | 10/2004 | Lin |
| 2004/0209195 A1 | 10/2004 | Lin |
| 2004/0212026 A1 | 10/2004 | Van Brocklin et al. |
| 2004/0217264 A1 | 11/2004 | Wood et al. |
| 2004/0217378 A1 | 11/2004 | Martin et al. |
| 2004/0217919 A1 | 11/2004 | Pichi et al. |
| 2004/0218251 A1 | 11/2004 | Piehl et al. |
| 2004/0218334 A1 | 11/2004 | Martin et al. |
| 2004/0227493 A1 | 11/2004 | Van Brocklin et al. |
| 2004/0233503 A1 | 11/2004 | Kimura |
| 2004/0240138 A1 | 12/2004 | Martin et al. |
| 2004/0245588 A1 | 12/2004 | Nikkel et al. |
| 2004/0259010 A1 | 12/2004 | Kanbe |
| 2005/0001828 A1 | 1/2005 | Martin et al. |
| 2005/0002082 A1 | 1/2005 | Miles |
| 2005/0003667 A1 | 1/2005 | Lin et al. |
| 2005/0014374 A1 | 1/2005 | Partridge et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068627 A1 | 3/2005 | Nakamura et al. |
| 2005/0069209 A1 | 3/2005 | Damera-Venkata et al. |
| 2005/0078348 A1 | 4/2005 | Lin |
| 2005/0117190 A1 | 6/2005 | Iwauchi et al. |
| 2005/0117623 A1 | 6/2005 | Shchukin et al. |
| 2005/0128543 A1 | 6/2005 | Phillips et al. |
| 2005/0133761 A1 | 6/2005 | Thielemans |
| 2005/0168849 A1 | 8/2005 | Lin |
| 2005/0179378 A1 | 8/2005 | Oooka et al. |
| 2005/0195462 A1 | 9/2005 | Lin |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0038643 A1 | 2/2006 | Xu et al. |
| 2006/0044654 A1 | 3/2006 | Vandorpe et al. |
| 2006/0065940 A1 | 3/2006 | Kothari |
| 2006/0066596 A1 | 3/2006 | Sampsell et al. |
| 2006/0066641 A1 | 3/2006 | Gally et al. |
| 2006/0066926 A1 | 3/2006 | Kwak et al. |
| 2006/0067633 A1 | 3/2006 | Gally |
| 2006/0077155 A1 | 4/2006 | Chui et al. |
| 2006/0077503 A1 | 4/2006 | Palmateer et al. |
| 2006/0082588 A1 | 4/2006 | Mizuno et al. |
| 2006/0082863 A1 | 4/2006 | Piehl et al. |
| 2006/0132927 A1 | 6/2006 | Yoon |
| 2006/0176241 A1 | 8/2006 | Sampsell |
| 2006/0180886 A1 | 8/2006 | Tsang |
| 2006/0220160 A1 | 10/2006 | Miles |
| 2007/0020948 A1 | 1/2007 | Piehl et al. |
| 2007/0040777 A1 | 2/2007 | Cummings |
| 2007/0075942 A1 | 4/2007 | Martin et al. |
| 2007/0077525 A1 | 4/2007 | Davis et al. |
| 2007/0097694 A1 | 5/2007 | Faase et al. |
| 2007/0138608 A1 | 6/2007 | Ikehashi |
| 2007/0139758 A1 | 6/2007 | Miles |
| 2007/0153860 A1 | 7/2007 | Chang-Hasnain et al. |
| 2007/0216987 A1 | 9/2007 | Hagood et al. |
| 2007/0249078 A1 | 10/2007 | Tung et al. |
| 2007/0285761 A1 | 12/2007 | Zhong et al. |
| 2008/0068697 A1 | 3/2008 | Haluzak et al. |
| 2008/0110855 A1 | 5/2008 | Cummings |
| 2008/0157413 A1 | 7/2008 | Lin |
| 2008/0191978 A1 | 8/2008 | Miles |
| 2008/0297880 A1 | 12/2008 | Steckl et al. |
| 2009/0021884 A1 | 1/2009 | Nakamura |
| 2009/0078316 A1 | 3/2009 | Khazeni et al. |
| 2009/0159123 A1 | 6/2009 | Kothari et al. |
| 2009/0211885 A1 | 8/2009 | Steeneken et al. |
| 2009/0256218 A1 | 10/2009 | Mignard et al. |
| 2009/0267953 A1 | 10/2009 | Sampsell et al. |
| 2009/0279162 A1 | 11/2009 | Chui |
| 2009/0293955 A1 | 12/2009 | Kothari et al. |
| 2010/0085625 A1 | 4/2010 | Endisch et al. |
| 2010/0096006 A1 | 4/2010 | Griffiths et al. |
| 2010/0096011 A1 | 4/2010 | Griffiths et al. |
| 2010/0134503 A1 | 6/2010 | Sampsell et al. |
| 2010/0220248 A1 | 9/2010 | Miles |
| 2010/0236624 A1 | 9/2010 | Khazeni et al. |
| 2010/0290102 A1 | 11/2010 | Lan |
| 2011/0019380 A1 | 1/2011 | Miles |
| 2011/0026096 A1 | 2/2011 | Miles |
| 2011/0043891 A1 | 2/2011 | Miles |
| 2011/0058243 A1 | 3/2011 | Wang |
| 2011/0080632 A1 | 4/2011 | Miles |
| 2011/0148828 A1 | 6/2011 | Sampsell et al. |
| 2011/0157010 A1 | 6/2011 | Kothari et al. |
| 2011/0170166 A1 | 7/2011 | Miles |
| 2011/0170167 A1 | 7/2011 | Miles |
| 2011/0177745 A1 | 7/2011 | Lasiter |
| 2011/0188110 A1 | 8/2011 | Miles |
| 2012/0062310 A1 | 3/2012 | Miles |
| 2012/0085731 A1 | 4/2012 | Miles |
| 2012/0088027 A1 | 4/2012 | Kothari et al. |
| 2012/0099174 A1 | 4/2012 | Miles |
| 2012/0105385 A1 | 5/2012 | Sasagawa et al. |
| 2012/0127556 A1 | 5/2012 | Gally et al. |
| 2012/0134008 A1 | 5/2012 | Bita et al. |
| 2012/0139976 A1* | 6/2012 | Chui et al. .......... 345/690 |
| 2012/0162232 A1 | 6/2012 | He et al. |
| 2012/0182595 A1 | 7/2012 | Miles |
| 2012/0188215 A1 | 7/2012 | Bushankuchu |
| 2012/0194897 A1 | 8/2012 | Zhong et al. |

(56) References Cited

U.S. PATENT DOCUMENTS

| | | |
|---|---|---|
| 2012/0287138 A1 | 11/2012 | Zhong et al. |
| 2013/0249964 A1 | 9/2013 | Sampsell et al. |

FOREIGN PATENT DOCUMENTS

| | | |
|---|---|---|
| DE | 4108966 A1 | 9/1992 |
| DE | 10228946 A1 | 1/2004 |
| EP | 0 035 299 | 9/1983 |
| EP | 0310176 A2 | 4/1989 |
| EP | 0361981 A2 | 4/1990 |
| EP | 0 668 490 | 8/1995 |
| EP | 0667548 A1 | 8/1995 |
| EP | 0 695 959 | 2/1996 |
| EP | 0788005 A2 | 8/1997 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 403 212 | 3/2004 |
| EP | 1435336 A2 | 7/2004 |
| EP | 1 473 581 | 11/2004 |
| EP | 1473691 A2 | 11/2004 |
| EP | 1484635 A1 | 12/2004 |
| EP | 1 640 765 | 3/2006 |
| EP | 1643288 | 6/2006 |
| FR | 2 824 643 | 11/2002 |
| JP | 56-088111 | 7/1981 |
| JP | 62082454 | 4/1987 |
| JP | 04276721 | 10/1992 |
| JP | 5-49238 | 2/1993 |
| JP | 5-281479 | 10/1993 |
| JP | 5275401 A | 10/1993 |
| JP | 08-051230 | 2/1996 |
| JP | 9127439 | 5/1997 |
| JP | 11-211999 | 8/1999 |
| JP | 2000 147262 | 5/2000 |
| JP | 2000306515 A | 11/2000 |
| JP | 2001-221913 | 8/2001 |
| JP | 2001 249283 | 9/2001 |
| JP | 2002-062490 | 2/2002 |
| JP | 2002-221678 | 8/2002 |
| JP | 2002277771 A | 9/2002 |
| JP | 2003-340795 | 2/2003 |
| JP | 2003 177336 | 6/2003 |
| JP | 2003195201 A | 7/2003 |
| JP | 2004-012642 | 1/2004 |
| JP | 2004157527 A | 6/2004 |
| JP | 2004-212638 | 7/2004 |
| JP | 2004-212680 | 7/2004 |
| JP | 2004235465 | 8/2004 |
| JP | 2004286825 A | 10/2004 |
| JP | 2005 279831 | 10/2005 |
| JP | 2005-308871 | 11/2005 |
| JP | 2007 027150 | 2/2007 |
| TW | 157313 | 5/1991 |
| TW | 585834 B | 5/2004 |
| TW | 200522132 | 7/2005 |
| TW | 200605392 | 2/2006 |
| WO | WO 98/14804 | 4/1998 |
| WO | WO 98/43129 | 10/1998 |
| WO | WO 01/53113 | 7/2001 |
| WO | WO 02/24570 | 3/2002 |
| WO | WO 02/086582 | 10/2002 |
| WO | WO-02079853 A1 | 10/2002 |
| WO | WO-03014789 A2 | 2/2003 |
| WO | WO-03054925 A2 | 7/2003 |
| WO | WO 03/069413 | 8/2003 |
| WO | WO-03069404 A1 | 8/2003 |
| WO | WO-03085728 A1 | 10/2003 |
| WO | WO 03/105198 | 12/2003 |
| WO | WO-2005006364 A1 | 1/2005 |
| WO | WO 2005/122123 | 12/2005 |
| WO | WO 2006/036386 | 4/2006 |
| WO | WO-2006035698 A1 | 4/2006 |
| WO | WO-2007036422 | 4/2007 |
| WO | WO-2007045875 A1 | 4/2007 |
| WO | WO-2007053438 A1 | 5/2007 |
| WO | WO 2008/057228 | 5/2008 |

OTHER PUBLICATIONS

Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.

Cacharelis et al., 1997, A Reflective-mode PDLC Light Valve Display Technology, Proceedings of European Solid State Device Research Conference (ESSDERC), pp. 596-599.

Conner, Hybrid Color Display Using Optical Interference Filter Array, SID Digest, pp. 577-580 (1993).

Hohlfeld et al., Jun. 2003, Micro-machined tunable optical filters with optimized band-pass spectrum, 12th International Conference on Transducers, Solid-State Sensors, Actuators and Microsystems, 2:1494-1497.

Jerman et al., A Miniature Fabry-Perot Interferometer with a Corrugated Silicon Diaphragm Support, (1988).

Jerman et al., Miniature Fabry-Perot Interferometers Micromachined in Silicon for Use in Optical Fiber WDM Systems, Transducers, San Francisco, Jun. 24-27, 1991, Proceedings on the Int'l Conf. on Solid State Sensors and Actuators, Jun. 24, 1991, pp. 372-375.

Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.

Longhurst, 1963, Chapter IX: Multiple Beam Interferometry, in Geometrical and Physical Optics, pp. 153-157.

Maier et al., 1996, 1.3"active matrix liquid crystal spatial light modulator with 508 dpi resolution, SPIE vol. 2754, pp. 171-179.

Mehregany et al., 1996, MEMS applications in optical systems, IEEE/LEOS 1996 Summer Topical Meetings, pp. 75-76.

Miles et al, Oct. 21, 1997, A MEMS based interferometric modulator (IMOD) for display applications, Proceedings of Sensors Expo, pp. 281-284.

Miles, A New Reflective FPD Technology Using Interferometric Modulation, Journal of the SID, May 4, 1997.

Miles, Interferometric modulation: MOEMS as an enabling technology for high performance reflective displays, Proceedings of SPIE, 4985:131-139, 2003.

Nakagawa et al., Feb. 1, 2002, Wide-field-of-view narrow-band spectral filters based on photonic crystal nanocavities, Optics Letters, 27(3):191-193.

Nieminen et al., 2004, Design of a temperature-stable RF MEMS capacitor, IEEE Journal of Microelectromechanical Systems, 13(5):705-714.

Pape et al., Characteristics of the deformable mirror device for optical information processing, Optical Engineering, 22(6):676-681, Nov.-Dec. 1983.

Tolansky, 1948, Chapter II: Multiple-Beam Interference, in Multiple-bean Interferometry of Surfaces and Films, Oxford at the Clarendon Press, pp. 8-11.

Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.

Office Action dated Jan. 7, 2010 in U.S. Appl. No. 12/115,829.

Official Communication dated Jun. 6, 2011 in European App. No. 05255637.0.

Extended European Search Report dated Aug. 19, 2011 in App. No. 08075221.5.

First Office Action in Chinese App. No. 200510105050.7, dated Mar. 28, 2008.

Second Office Action in Chinese App. No. 200510105050.7, dated Oct. 24, 2008.

(56) References Cited

OTHER PUBLICATIONS

Office Action dated Apr. 13, 2011 in Chinese App. No. 200880023131.4.
Office Action dated Oct. 24, 2011 in Chinese App. No. 200880023131.4.
Notice of Reasons for Rejection dated Aug. 26, 2008 in Japanese App. No. 2005-250539.
Final Notice of Rejection dated Nov. 10, 2009 in Japanese App. No. 2005-250539.
Notice of Reasons for Rejection dated Apr. 3, 2012 in Japanese App. No. 2010-515043.
Notice to Submit a Response dated Mar. 12, 2012 in Korean App. No. 10-2011-0133844.
ISR and WO for PCT/US08/068063 filed Jun. 24, 2008.
Office Action mailed Apr. 20, 2007 in U.S. Appl. No. 11/112,734.
Office Action mailed Oct. 10, 2007 in U.S. Appl. No. 11/112,734.
Office Action dated Jun. 24, 2010 in U.S. Appl. No. 11/772,777.
Office Action dated Dec. 1, 2010 in U.S. Appl. No. 11/772,777.
Office Action dated Dec. 13, 2011 in U.S. Appl. No. 13/086,113.
European Search Report for App. No. 05255637.0, dated Nov. 22, 2005.
Office Action dated May 17, 2012 in Chinese App. No. 200880023131.4.
Notice to Submit a Response dated Sep. 25, 2012 in Korean App. No. 10-2011-0133844.
IPRP for PCT/US08/068063 dated Sep. 24, 2009.
Office Action dated Dec. 25, 2012 in Taiwanese patent application No. 094128428.
Extended European Search Report dated Aug. 5, 2013 in patent application No. 13172251.4.
Akasaka Y., "Three-Dimensional IC Trends," Proceedings of IEEE, Dec. 1986, vol. 74 (12), pp. 1703-1714.
Aratani K, et al., "Process and Design Considerations for Surface Micromachined Beams for a Tuneable Interferometer Array in Silicon," Proc. IEEE Microelectromechanical workshop fort Lauderdale FL, Feb. 1993, pp. 230-235.
Aratani K. et al., "Surface Micromachined Tuneable Interferometer Array," Sensors and Actuators A, Elsevier Sequoia S.A., Lausanne, CH, A, 1994, 43(1/3), pp. 17-23.
Austrian Search Report for Ex144/2005 dated Aug. 11, 2005.
Austrian Search Report No. 140/2005, dated Jul. 15, 2005.
Austrian Search Report No. 150/2005, dated Jul. 29, 2005.
Austrian Search Report No. 161/2005, dated Jul. 15, 2005.
Austrian Search Report No. 162/2005, dated Jul. 14, 2005.
Austrian Search Report No. 164/2005, dated Jul. 4, 2005.
Austrian Search Report No. 66/2005 Dated May 9, 2005.
Bass, M., et al., Handbook of Optics vol. I: Fundamentals, Techniques, and Design. Second Edition, McGraw-Hill, Inc., New York, 1995, pp. 2.29-2.36.
Butler, et al., "An Embedded Overlay Concept for Microsystems Packaging," IEEE Transactions on Advanced Packaging IEEE, Nov. 2000, vol. 23 (4), pp. 617-622.
Chiou, et al., "A Novel Capacitance Control Design of Tunable Capacitor using Multiple Electrostatic Driving Electrodes," IEEE Nanoelectronics and Giga-Scale Systems, Oct. 29, 2001, pp. 319-324.
Dokmeci, et al., "Two-Axis Single-Crytal Silicon Micromirror Arrays," Journal of Microelectromechanical Systems, Dec. 2004, 13(6), 1006-1017.
Fan, et al., "Channel Drop Filters in Photonic Crystals," Optics Express, Jul. 6, 1998, vol. 3(1), pp. 4-11.
Feenstra, et al., "Electrowetting displays," Liquavista BV, Jan. 2006, 16 pp.
Giles, et al., "A Silicon Mems Optical Switch Attenuator and its Use In Lightwave Subsystems," IEEE Journal of Selected Topics in Quantum Electronics, Jan.-Feb. 1999, 5 (1), pp. 18-25.
Goossen, et al., "Silicon Modulator Based on Mechnically-Active Anti-Reflection Layer With 1 Mbit/Sec Capability for Fiber-In-The-Loop Applications," IEEE Photonics Technology Letters, Sep. 1994, pp. 1119-1121.
Goossen K.W. et al., "Possible Display Applications of the Silicon Mechanical Antireflection Switch," Society for Information Display, Aug. 24, 1994, 4 Pages.
Goossen K.W., "MEMS-Based Variable Optical Interference Devices, IEEE/Lens International Conference on Optical Mems," Conference Digest, Piscataway, NJ, USA, IEEE Aug. 21, 2000, pp. 17-18.
Gosch, "West Germany Grabs the Lead in X-Ray Lithography," Electronics, Feb. 5, 1987, pp. 78-80.
Howard, et al., "Nanometer-Scale Fabrication Techniques," VLSI Electronics: Microstructure Science, 1982, vol. 5, p. 145-153 and 166-173.
Ibbotson, et al., "Comparison of $XeF_2$ and F-atom Reactions with Si and $SiO_2$," Applied Physics Letters, Mar. 28, 1984, 44 (12), pp. 1129-1131.
Jackson, "Classical Electrodynamics," John Wiley & Sons Inc, Nov. 1962, pp. 568-573.
Jerman, et al., "A Miniature Fabry-Perot Interferometer Fabricated Using Silicon Micromachining Techniques," IEEE Electron Devices Society, 1988, 3 Pages.
Joannopoulos, et al., "Photonic Crystals Molding the Flow of Light," Princeton University Press, 1995, 73 Pages.
Johnson, "Optical Scanners," Microwave Scanning Antennas, 1964, vol. 1 (2), pp. 251-261.
Kim, et al., "Control of Optical Transmission Through Metals Perforated With Subwave-Length Hole Arrays," Optic Letters, Feb. 15, 1999, vol. 24 (4), pp. 256-258.
Light Over Matter Circle No. 36, Jun. 1993.
Lin, et al., "Free-Space Micromachined Optical Switches for Optical NetWorking," IEEE Journal of Selected Topics in Quantum Electronics, Jan./Feb. 1999, vol. 5 (1), pp. 4-9.
Little, et al., "Vertically Coupled Glass Microring Resonator Channel Dropping Filters," IEEE Photonics Technology Letters, Feb. 1999, 11(2), 215-217.
Londergan, et al., "Advanced processes for MEMS-based displays," Proceedings of the Asia Display, 2007, SID, vol. 1, pp. 107-112.
Magel G.A., "Integrated Optic Devices using Micromachined Metal Membranes," SPIE, 1996, vol. 2686, pp. 54-63.
Nagami, et al., "Plastic Cell Architecture: Towards Reconfigurable Computing for General-Purpose, 0-8186-8900," IEEE, 1998, pp. 68-77.
Newsbreaks, "Quantum-trench devices might operated at terahertz frequencies", Laser Focus World, May 1993.
Oliner, "Radiating Elements and Mutual Coupling," Microwave Scanning Antennas, 1966, vol. 2, pp. 131-157 and 190-194.
Peerlings et al., "Long Resonator Micromachined Tunable GaAs-A1As Fabry-Perot Filter," IEEE Photonics Technology Letters, IEEE Service Center, Sep. 1997, vol. 9 (9), pp. 1235-1237.
Raley, et al., "A Fabry-Perot Microinterferometer for Visible Wavelengths," IEEE Solid-State Sensor and Actuator Workshop, 1992, pp. 170-173.
Schnakenberg, et al., "TMAHW Etchants for Silicon Micromachining," International Conference on Solid State Sensors and Actuators-Digest of Technical Papers, 1991, pp. 815-818.
Science and Technology, The Economist, pp. 89-90, (May 22, 1999).
Sperger, et al., "High Performance Patterned All-Dielectric Interference Colour Filter for Display Applications," SID Digest, 1994, pp. 81-83.
Stone J.M., "Radiation and Optics, An Introduction to the Classic Theory," 1963, McGraw-Hill, pp. 340-343.
Taii Y. et al., "A Transparent Sheet Display by Plastic MEMS," Journal of the SID, 2006, vol. 14 (8), pp. 735-741.
Taiwan Search Report—TW100121729—TIPO—Feb. 21, 2014.
Walker, et al., "Electron-Beam-Tunable Interference Filter Spatial Light Modulator," Optics Letters, Feb. 1988, vol. 13 (5), pp. 345-347.
Wang, et al., "Flexible Circuit-Based RF MEMS Switches," Proceedings of 2001 ASME International Mechanical Engineering Congress and Exposition, Nov. 11-16, 2001 pp. 757-762.
Williams, et al., "Etch Rates for Micromachining Processing," Journal of Microelectromechanical Systems, Dec. 1996, vol. 5 (4), pp. 256-269.
Winters, et al., "The Etching of Silicon with XeF2 Vapor," Applied Physics Letters, Jan. 1, 1979, vol. 34 (1), pp. 70-73.
Winton et al., "A novel way to capture solar energy," Chemical Week, pp. 17-18 (May 15, 1985).

(56) References Cited

OTHER PUBLICATIONS

Wu, et al., "Design of a Reflective Color LCD using Optical Interference Reflectors," Asia Display, Changchun Institute of Physics, 1995, 929-931.

Wu, et al., "MEMS Designed for Tunable Capacitors," Microwave Symposium Digest, IEEE MTT-S Int'l., 1998, vol. 1, pp. 127-129.

Zhou et al., "Waveguide Panel Display Using Electromechanism Spatial Modulators," SID Digest, 1998, vol. XXIX, 4 Pages.

* cited by examiner

ELECTROMECHANICAL DEVICE WITH OPTICAL FUNCTION SEPARATED FROM MECHANICAL AND ELECTRICAL FUNCTION

CROSS-REFERENCE TO RELATED APPLICATIONS

This application is a continuation of U.S. patent application Ser. No. 13/086,113, filed Apr. 13, 2011 and issued as U.S. Pat. No. 8,289,613 on Oct. 16, 2012, which is a continuation of U.S. patent application Ser. No. 11/772,777, filed Jul. 2, 2007 and issued as U.S. Pat. No. 7,944,599 on May 17, 2011, which is a continuation-in-part of U.S. patent application Ser. No. 11/112,734, filed Apr. 22, 2005 and issued as U.S. Pat. No. 7,372,613 on May 13, 2008, which claims the benefit of U.S. Provisional Application No. 60/613,486, filed Sep. 27, 2004, and U.S. Provisional Application No. 60/613,499, filed Sep. 27, 2004, each of which is incorporated herein by reference in its entirety.

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate, the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Preferred Embodiments" one will understand how the features of this invention provide advantages over other display devices.

In certain embodiments, a microelectromechanical (MEMS) device comprises a substrate, a movable element over the substrate, and an actuation electrode above the movable element. The movable element comprises a deformable layer and a reflective element. The deformable layer is spaced from the reflective element.

In certain embodiments, a microelectromechanical (MEMS) device comprises means for moving a portion of the device, means for supporting moving means, and means for actuating the moving means. The actuating means is above the moving means. The moving means comprises means for deforming and means for reflecting. The deforming means is spaced from the reflecting means.

In certain embodiments, a method of manufacturing a microelectromechanical (MEMS) device comprises forming a first sacrificial layer over a substrate, forming a reflective element over the first sacrificial layer, forming a second sacrificial layer over the reflective element, forming a deformable layer over the second sacrificial layer, forming a third sacrificial layer over the deformable layer, forming an actuation electrode over the third sacrificial layer, and removing the first, second, and third sacrificial layers. The deformable layer is mechanically coupled to the reflective element.

In certain embodiments, a method of modulating light comprises providing a display element comprising a substrate, a movable element over the substrate, and an actuation electrode. The movable element comprises a deformable layer and a reflective element. The deformable layer is spaced from the reflective element. The actuation electrode is above the movable element. The method further comprises applying a voltage to the actuation electrode. The voltage generates an attractive force on the movable element, thereby causing the movable element to move away from the substrate.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices. Moreover, all figures herein have been drawn to depict the relationships between certain elements, and therefore are highly diagrammatic and should not be considered to be to scale.

In certain embodiments, an actuation electrode disposed above the reflective element and the deformable layer of a movable element is provided. The actuation electrode is not in the optical path, which allows it to comprise a non-transparent conductor and to be thicker, thereby improving power consumption. In some embodiments, the deformable layer, rather than the reflective surface, contacts a stationary portion of the MEMS device upon actuation, which reduces, in turn, stiction, spring constant, electrostatic force, and capacitor area, thus enabling fast and low power operation. In some embodiments, surface roughening and other anti-stiction features may be formed between the actuation electrode and the deformable layer without impacting optical performance because the features are not in the optical path. In some embodiments, the reflective surface does not contact anything upon actuation, allowing it to be substantially smooth and flat without the danger of stiction. In some embodiments, a second actuation electrode is provided below the movable element or between the deformable layer and the reflective surface such that the reflective surface is stable in at least three states.

Figure 1:
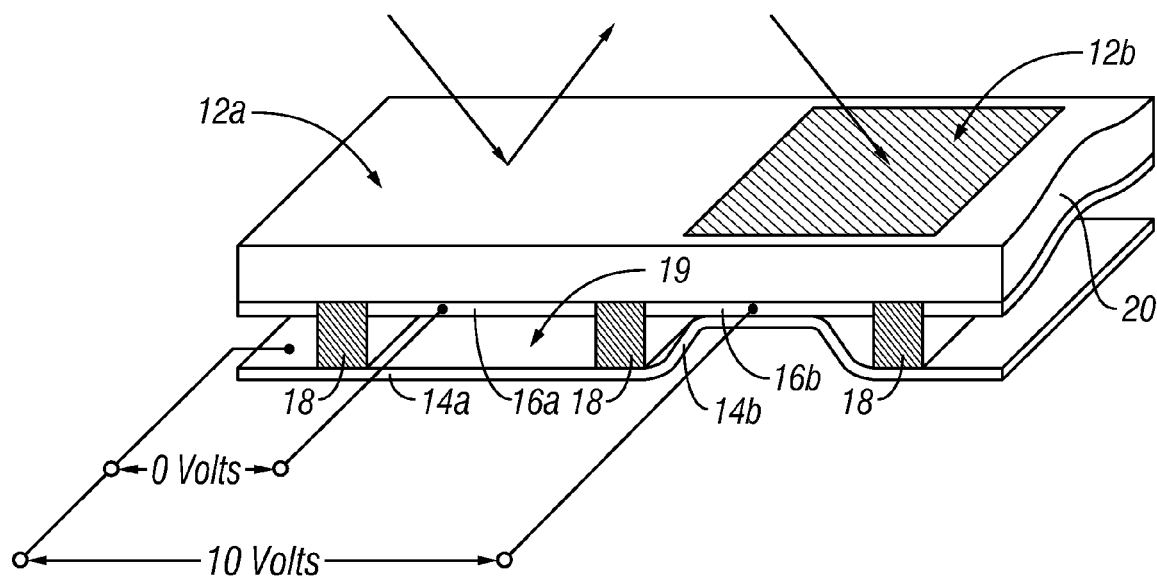
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as the optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more layers of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the deformable metal layers 14a, 14b are separated from the optical stacks 16a, 16b by a defined air gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
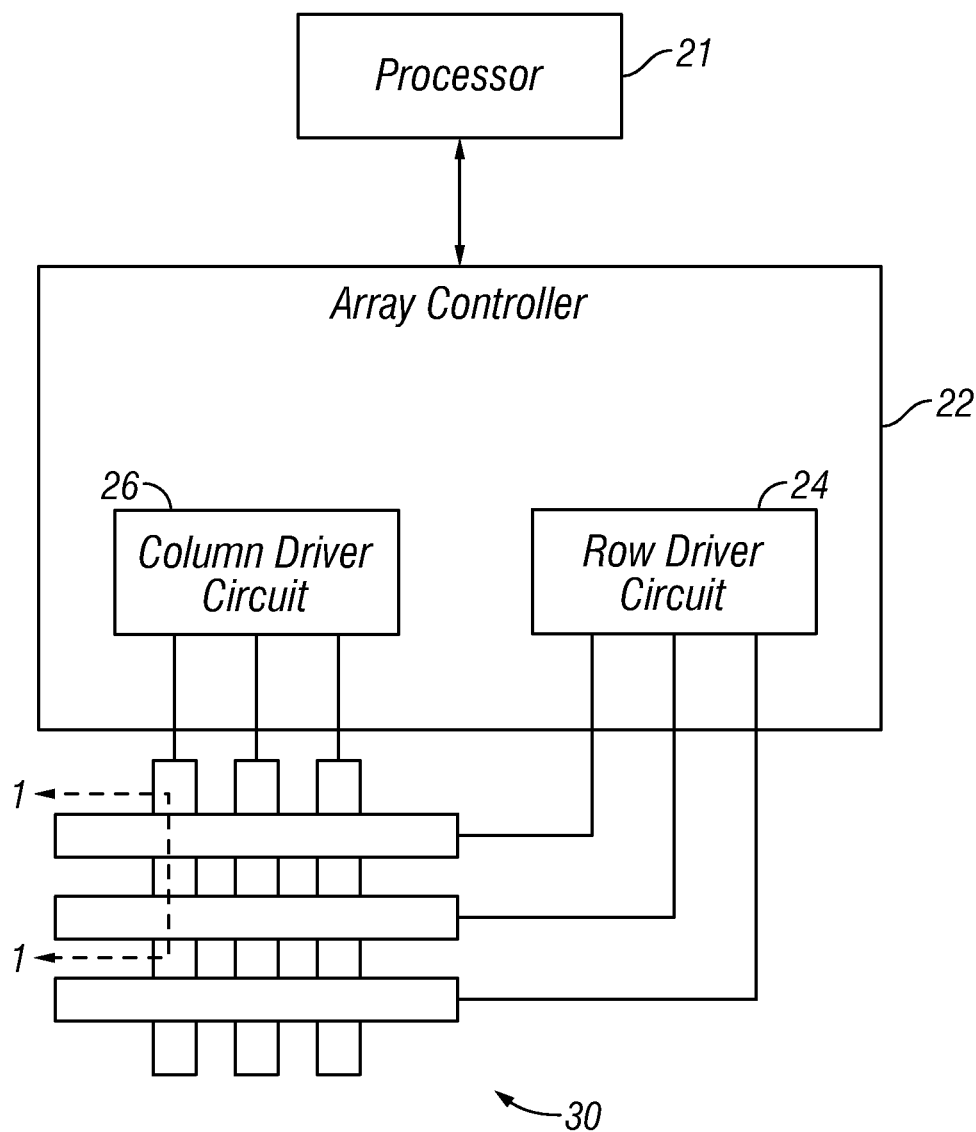
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
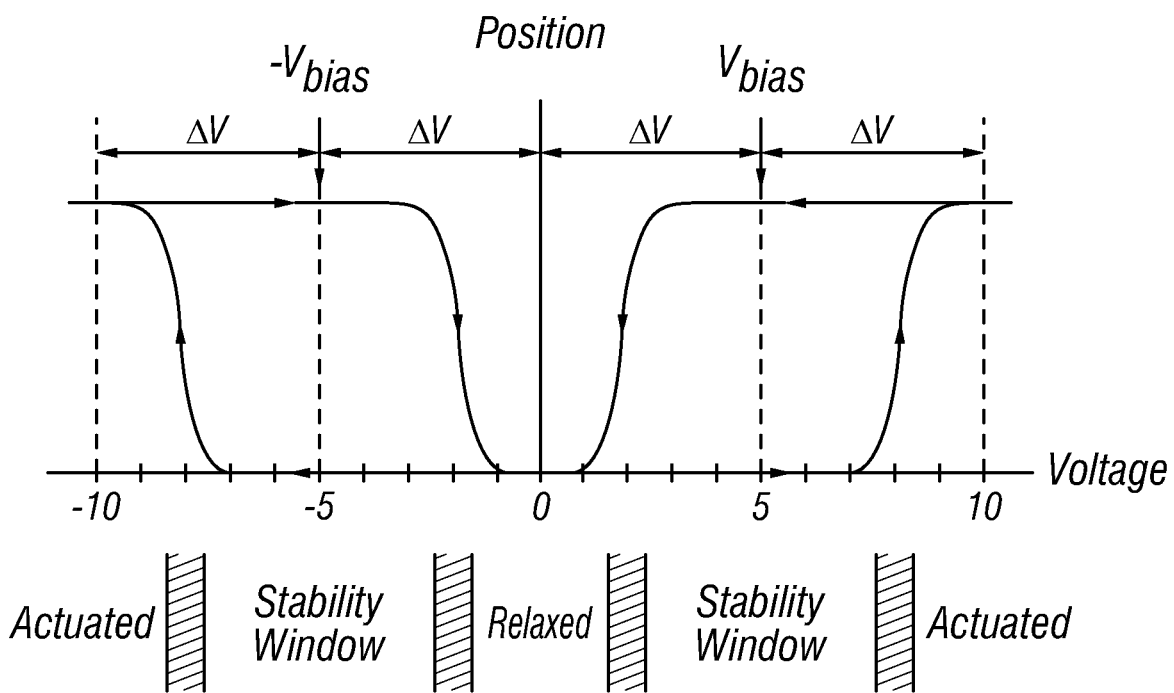
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
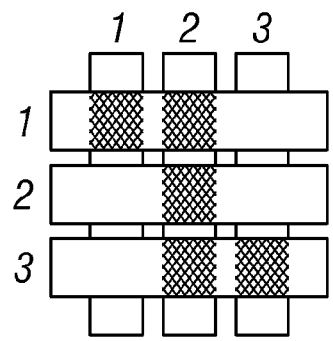
FIG. 5A illustrates one exemplary frame of display data in the 3×3 interferometric modulator display of FIG. 2.
Figure 5B:
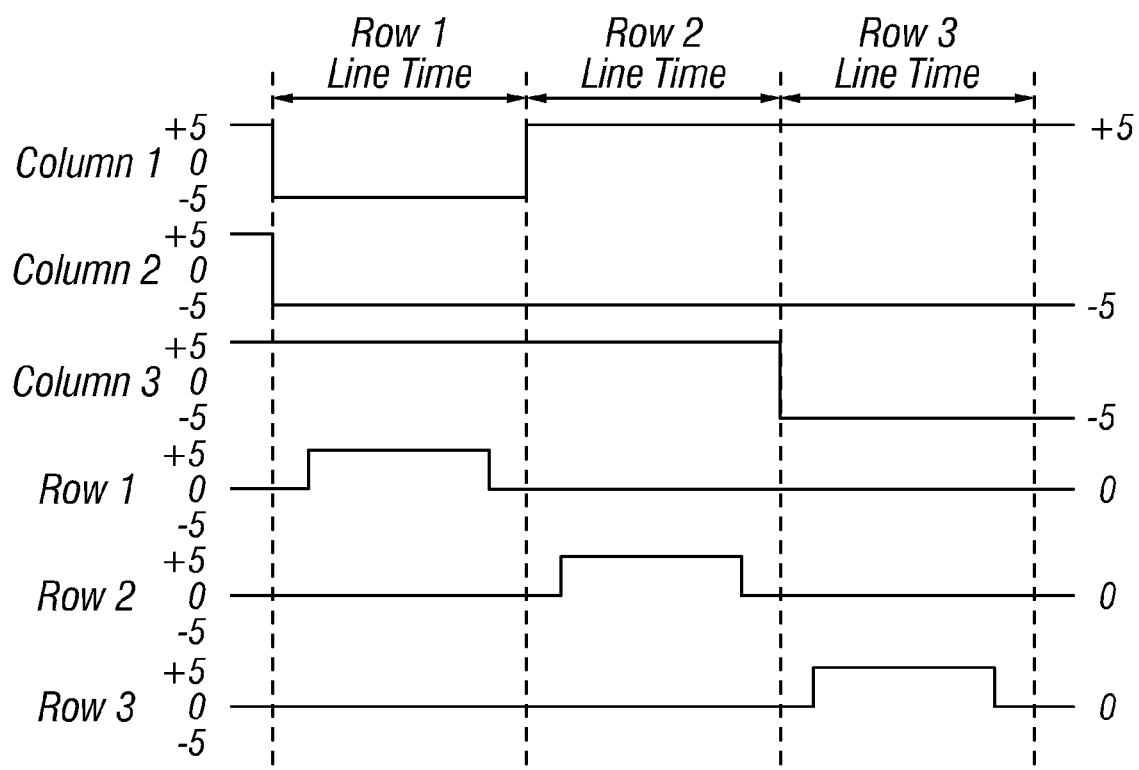
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
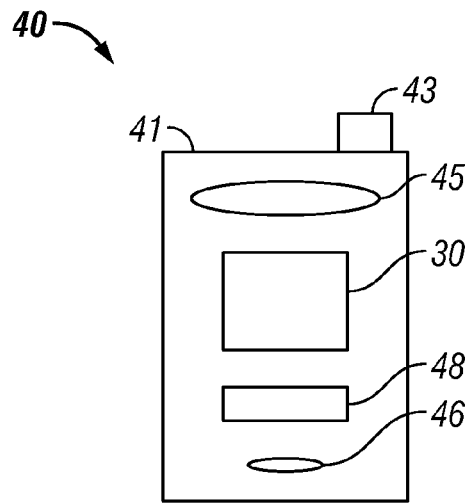
FIGS. 6A and 6B are system block diagrams illustrating an embodiment of a visual display device comprising a plurality of interferometric modulators.
Figure 6B:
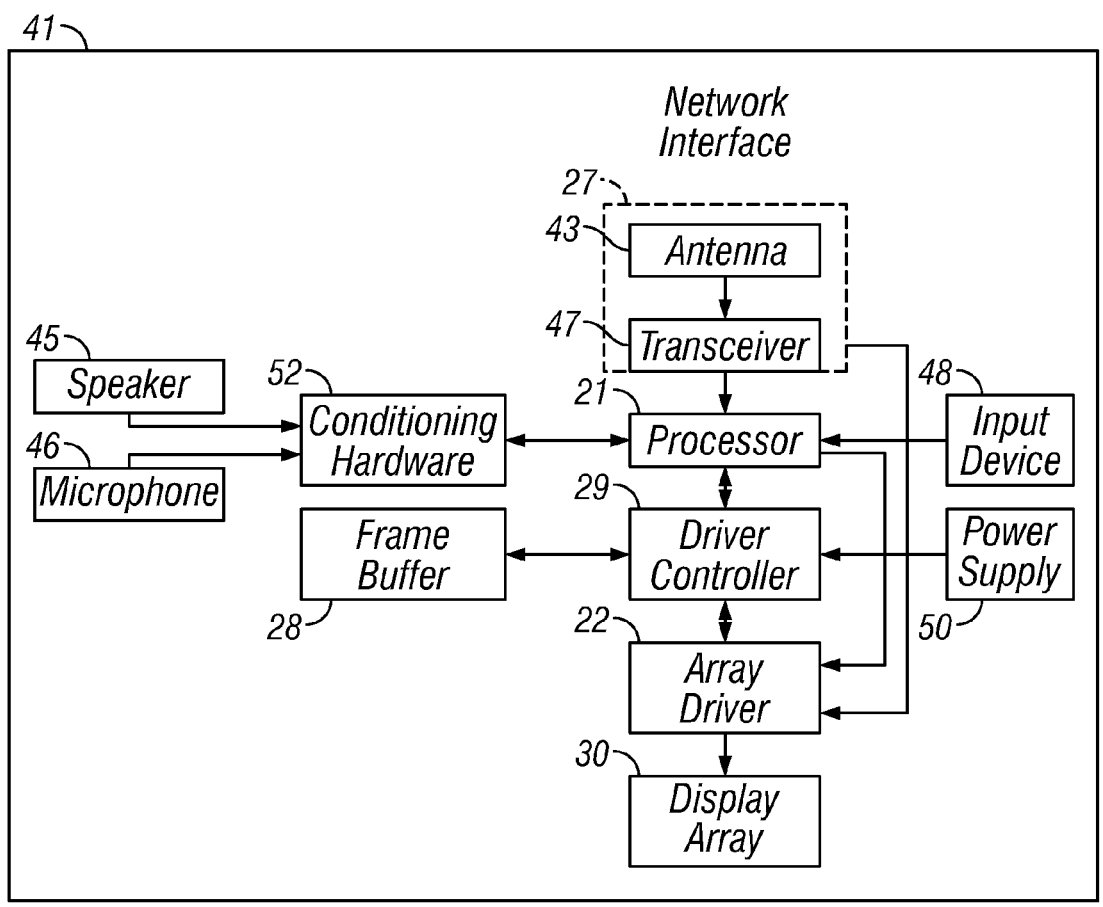

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and grayscale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
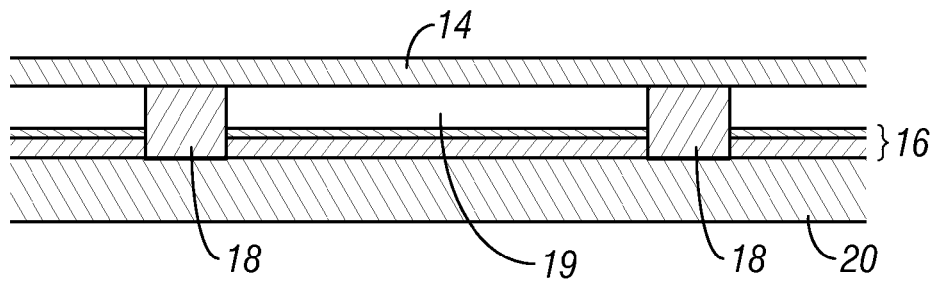
FIG. 7A is a cross section of the device of FIG. 1.
Figure 7B:
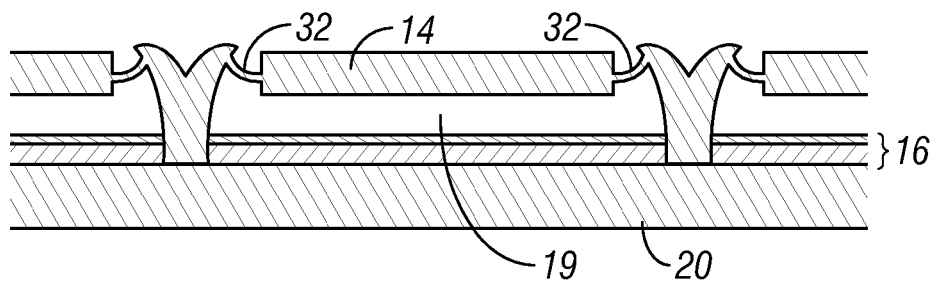
FIG. 7B is a cross section of an alternative embodiment of an interferometric modulator.
Figure 7C:
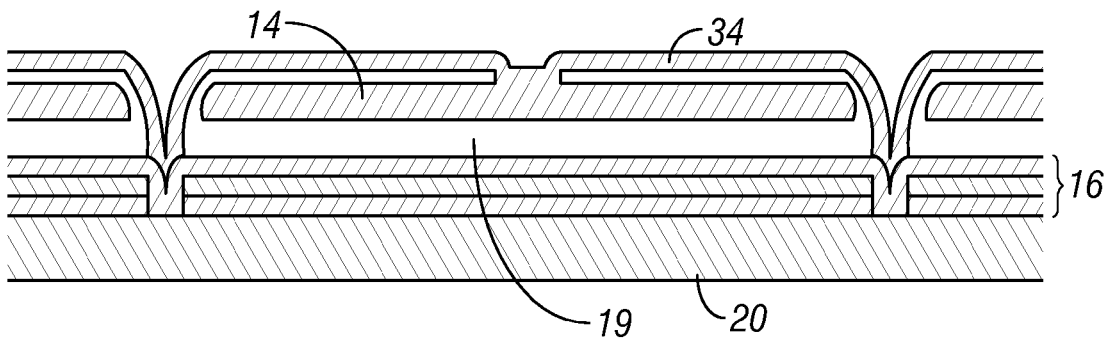
FIG. 7C is a cross section of another alternative embodiment of an interferometric modulator.
Figure 7D:
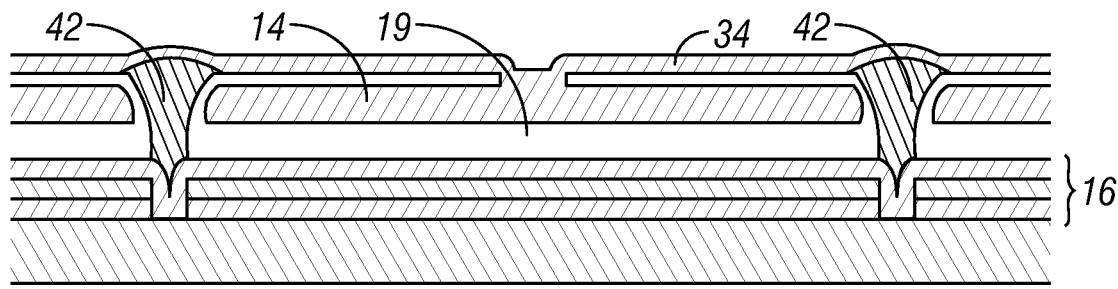
FIG. 7D is a cross section of yet another alternative embodiment of an interferometric modulator.
Figure 7E:
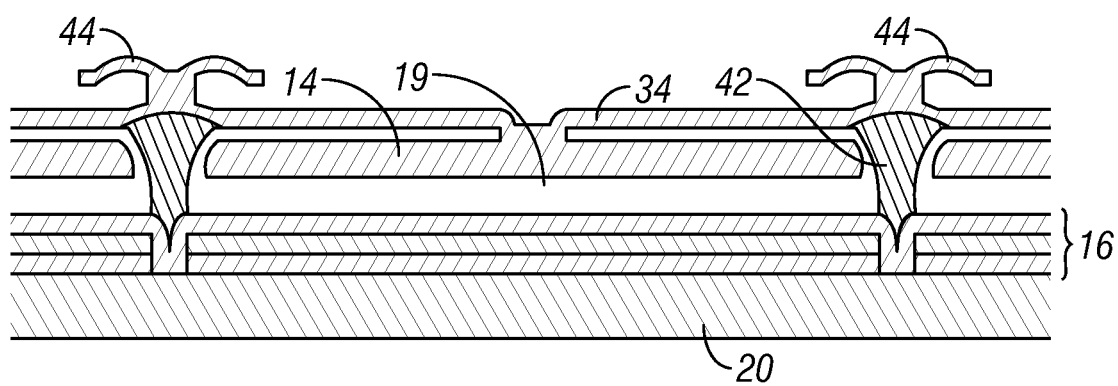
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the moving mirror structure. FIG. 7A is a cross section of the embodiment of FIG. 1, where a strip of metal material 14 is deposited on orthogonally extending supports 18. In FIG. 7B, the movable reflective material 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective material 14 can be optimized with respect to the optical properties, and the structural design and materials used for the deformable layer 34 can be optimized with respect to desired mechanical properties.

Embodiments of interferometric modulators described above operate in one of a reflective state, which produces white light, or light of a color determined by the distance between the mirror 14 and the partially reflective layer of the optical stack 16, or in a non-reflective, e.g., black, state. In other embodiments, for example embodiments disclosed in U.S. Pat. No. 5,986,796, the movable mirror 14 may be positioned at a range of positions relative to the partially reflective layer in the optical stack 16 to vary the size of the resonant gap 19, and thus to vary the color of reflected light.

Figure 8:
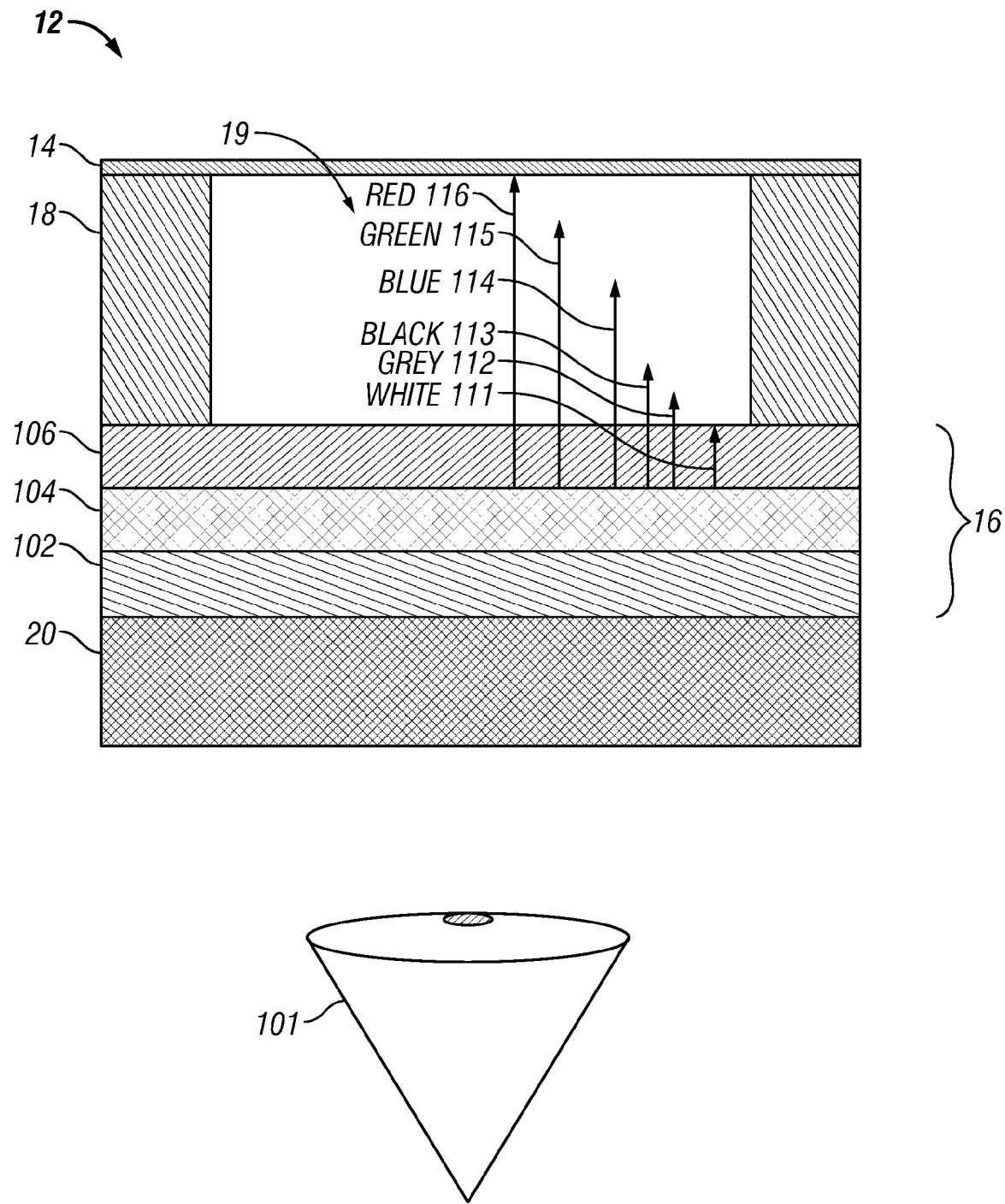
FIG. 8 is a side cross-sectional view of an example interferometric modulator that illustrates the spectral characteristics of produced light.

FIG. 8 is a side cross-sectional view of an example interferometric modulator 12 that illustrates the spectral characteristics of light that would be produced by positioning the movable mirror 14 at a range of positions 111-115. As discussed above, a potential difference between row and column electrodes causes the movable mirror 14 to deflect. The modulator 12 includes a conductive layer 102 of indium-tinoxide (ITO) acting as a column electrode. In the example modulator 12, the mirror 14 includes the row electrode.

In one embodiment, a dielectric layer 106 of a material such as aluminum oxide ($Al_2O_3$ or "alumina") is positioned over a layer of partially reflective material 104 (e.g., comprising chromium) that forms a reflective surface of the optical stack 16. As discussed above with reference to FIG. 1, the dielectric layer 106 inhibits shorting and controls the separation distance between the mirror 14 and the partially reflective layer 104 when the mirror 14 deflects. The optical cavity formed between the mirror 14 and the partially reflective layer 104 thus includes the dielectric layer 106. The relative sizes of items in FIG. 8 have been selected for purposes of conveniently illustrating the modulator 12. Thus, such distances and thicknesses are not to scale and are not intended to be representative of any particular embodiment of the modulator 12.

Figure 9:
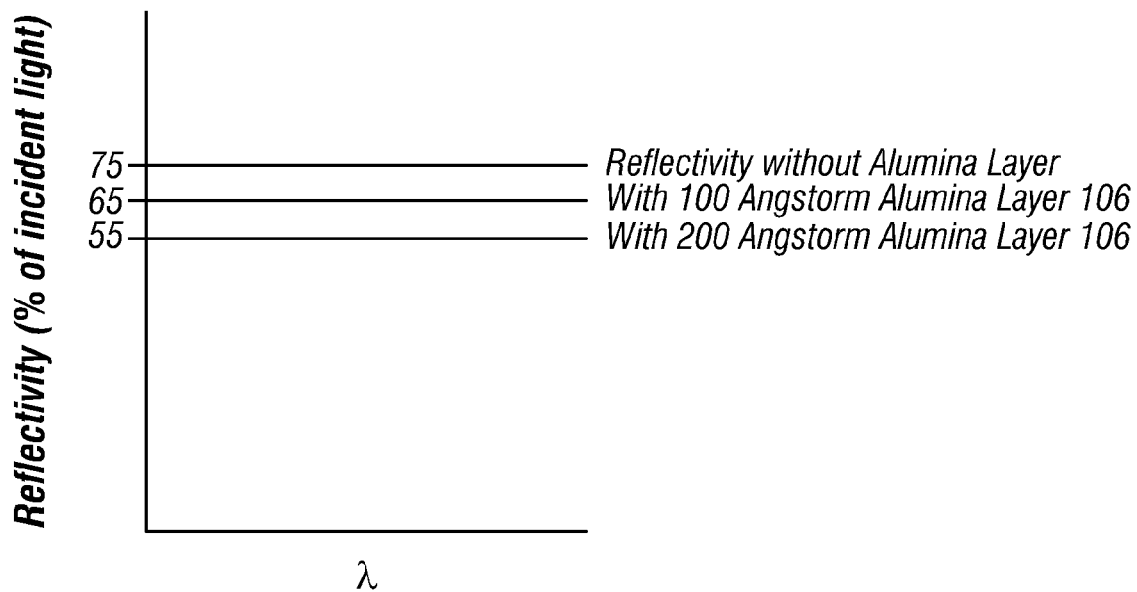
FIG. 9 is a graphical illustration of reflectivity versus wavelength for mirrors of several example interferometric modulators.

FIG. 9 is a graphical illustration of reflectivity versus wavelength for several example optical stacks 16 having various thicknesses of dielectric layers 106. The horizontal axis represents a range of wavelengths of visible light incident on the optical stacks. The vertical axis represents the reflectivity of each optical stack 16 as a percentage of incident light at a particular wavelength. In embodiments in which the optical stack 16 does not include a dielectric layer 106, the reflectivity of the optical stack 16 including a layer of chromium is approximately 75%. An optical stack 16 including a dielectric layer 106 comprising a 100 Å thick layer of alumina results in approximately 65% reflectivity, and an optical stack 16 including a dielectric layer 104 comprising a 200 Å thick layer of alumina results in approximately 55% reflectivity. As shown, reflectivity does not vary according to wavelength in these particular embodiments. Accordingly, by adjusting the thickness of an $Al_2O_3$ layer 106, the reflectivity of the optical stack 16 can be controlled consistently across the visible spectrum to allow specific properties of interferometric modulators 12 to be selected. In certain embodiments, the dielectric layer 106 comprises a layer of $Al_2O_3$ having a thickness between about 50 and 250 Å. In certain other embodiments, the dielectric layer 106 comprises a layer of $Al_2O_3$ having a thickness between about 50 and 100 Å and a layer of bulk $SiO_2$ having a thickness between about 400 and 2,000 Å.

As discussed above, the modulator 12 includes an optical cavity formed between the mirror 14 and the reflective surface of the optical stack 16. The characteristic distance, or effective optical path length, L, of the optical cavity determines the resonant wavelength, $\lambda$, of the optical cavity 19, and thus of the interferometric modulator 12. The resonant wavelength, $\lambda$, of the interferometric modulator 12 generally corresponds to the perceived color of light reflected by the modulator 12. Mathematically, the distance $L=\frac{1}{2} \times N \times \lambda$, where N is an integer. A given resonant wavelength, $\lambda$, is thus reflected by interferometric modulators 12 having distances, L, of $\lambda/2$ (N=1), $\lambda$ (N=2), $3\lambda/2$ (N=3), etc. The integer N may be referred to as the "order" of interference of the reflected light.

As used herein, the order of a modulator 12 also refers to the order N of light reflected by the modulator 12 when the mirror 14 is in at least one position. For example, a first order red interferometric modulator 12 may have a distance, L, of about 325 nm, corresponding to a wavelength $\lambda$ of about 650 nm. Accordingly, a second order red interferometric modulator 12 may have a distance, L, of about 650 nm. Generally, higher order modulators 12 reflect light over a narrower range of wavelengths, and thus produce colored light that is more saturated.

Note that in certain embodiments, the distance, L, is substantially equal to the distance between the mirror 14 and the partially reflective layer 104. Where the space between the mirror 14 and the partially reflective layer 104 comprises only a gas (e.g., air) having an index of refraction of approximately 1, the effective optical path length is substantially equal to the distance, L, between the mirror 14 and the partially reflective layer 104. In embodiments that include the dielectric layer 106, which has an index of refraction greater than one, the optical cavity 19 is formed to have the desired optical path length by selecting the distance between the mirror 14 and the partially reflective layer 104 and by selecting the thickness and index of refraction of the dielectric layer 106, or of any other layers between the mirror 14 and the partially reflective layer 104. In one embodiment, the mirror 14 may be deflected to one or more positions within a range of positions to output a corresponding range of colors. For example, the voltage potential difference between the row and column electrodes may be adjusted to deflect the mirror 14 to one of a range of positions in relation to the partially reflective layer 104. In general, the greatest level of control of the position of the mirror by adjusting voltage is near the undeflected position of the path of the mirror 14 (for example, for smaller deflections, such as deflections within about $\frac{1}{3}$rd of the maximum deflection from the undeflected position of the mirror 14).

Each of a particular group of positions 111-115 of the movable mirror 14 is denoted in FIG. 8 by a line extending from the partially reflective layer 104 to an arrow point indicating the positions 111-115. Thus, the distances 111-115 are selected so as to account for the thickness and index of refraction of the dielectric layer 106. When the movable mirror 14 deflects to each of the positions 111-115, each corresponding to a different distance, L, the modulator 12 outputs light to a viewing position 101 with a different spectral response that corresponds to different colors of incident light being reflected by the modulator 12. Moreover, at position 111, the movable mirror 14 is sufficiently close to the partially reflective layer 104 (e.g., less than about 200 Å, preferably less than about 100 Å) that the effects of interference are negligible and modulator 12 acts as a mirror that reflects substantially all colors of incident visible light substantially equally, e.g., as white light. The broadband mirror effect is caused because the distance, L, is too small for optical resonance in the visible band. The mirror 14 thus merely acts as a reflective surface with respect to visible light.

As the gap 19 is increased to the position 112, the modulator 12 exhibits a shade of gray, as the increased gap 19 distance between the mirror 14 and the partially reflective layer 104 reduces the reflectivity of the mirror 14. At the position 113, the distance, L, is such that the cavity 19 operates interferometrically but reflects substantially no visible wavelengths of light because the resonant wavelength is outside the visible range, thereby producing black.

As the distance, L, is increased further, a peak spectral response of the modulator 12 moves into visible wavelengths. Thus, when the movable mirror 14 is at position 114, the modulator 12 reflects blue light. When the movable mirror 14 is at the position 115, the modulator 12 reflects green light. When the movable mirror 14 is at the non-deflected position 116, the modulator 12 reflects red light.

In designing a display using interferometric modulators 12, the modulators 12 may be formed so as to increase the color saturation of reflected light. Saturation refers to the intensity of the hue of color light. A highly saturated hue has a vivid, intense color, while a less saturated hue appears more muted and gray. For example, a laser, which produces a very narrow range of wavelengths, produces highly saturated light. Conversely, a typical incandescent light bulb produces white light that may have a desaturated red or blue color. In some embodiments, the modulator 12 is formed with a distance, L, corresponding to higher order interference, e.g., 2nd or 3rd order, to increase the saturation of reflected color light.

An example color display includes red, green, and blue display elements. Other colors can be produced in such a display by varying the relative intensity of light produced by the red, green, and blue elements. Mixtures of primary colors such as red, green, and blue are perceived by the human eye as other colors. The relative values of red, green, and blue in such a color system may be referred to as tristimulus values in reference to the stimulation of red, green, and blue light sensitive portions of the human eye. In general, the more saturated the primary colors, the greater the range of colors that can be produced by the display. In other embodiments, the display may include modulators 12 having sets of colors that define other color systems in terms of sets of primary colors other than red, green, and blue (e.g., red, yellow, and blue; magenta, yellow, and cyan).

Figure 10:
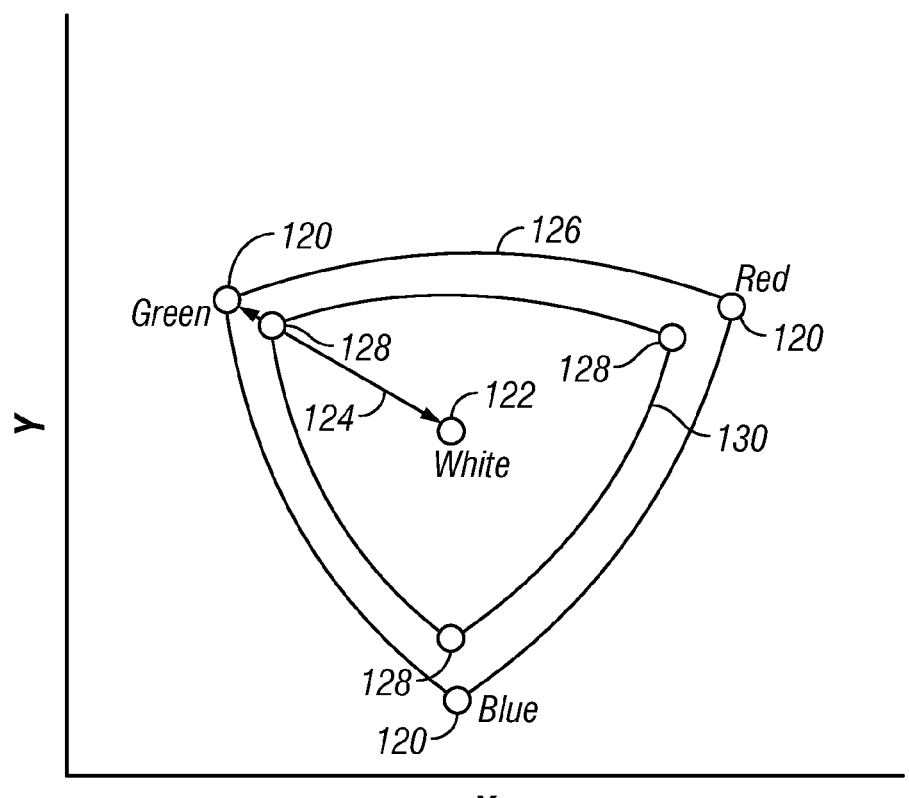
FIG. 10 is a chromaticity diagram that illustrates the colors that can be produced by a color display that includes example sets of red, green, and blue interferometric modulators.

FIG. 10 is a chromaticity diagram that illustrates the colors that can be produced by a color display that includes two sets of example red, green, and blue interferometric modulators. The horizontal and vertical axes define a chromaticity coordinate system on which spectral tristimulus values may be depicted. In particular, points 120 illustrate the color of light reflected by example red, green, and blue interferometric modulators 12. White light is indicated by a point 122. The distance from each point 120 to the point 122 of white light, e.g., the distance 124 between the point 122 for white and the point 120 for green light, is indicative of the saturation of light produced by the corresponding modulator 12. The region enclosed by the triangular trace 126 corresponds to the range of colors that can be produced by mixing the light produced at points 120. This range of colors may be referred to as the "color gamut" of the display.

Points 128 indicate the spectral response of another set of example modulators 12. As indicated by the smaller distance between the points 128 and the white point 122 than between points 120 and point 122, the modulators 12 corresponding to the points 128 produce less saturated light that do the modulators 12 corresponding to the points 120. The trace 130 indicates the range of colors that can be produced by mixing the light of points 128. As is shown in FIG. 10, the trace 126 encloses a larger area than does the trace 130, graphically illustrating the relationship between the saturation of the display elements 12 and the size of the color gamut of the display.

In a reflective display, white light produced using such saturated interferometric modulators 12 tends to have a relatively low intensity to a viewer because only a small range of incident wavelengths is reflected to form the white light. In contrast, a mirror reflecting broadband white light, e.g., substantially all incident wavelengths, has a greater intensity because a greater range of incident wavelengths is reflected. Thus, designing reflective displays using combinations of primary colors to produce white light generally results in a tradeoff between the color saturation and color gamut of the display and the brightness of white light output by the display.

Figure 11:
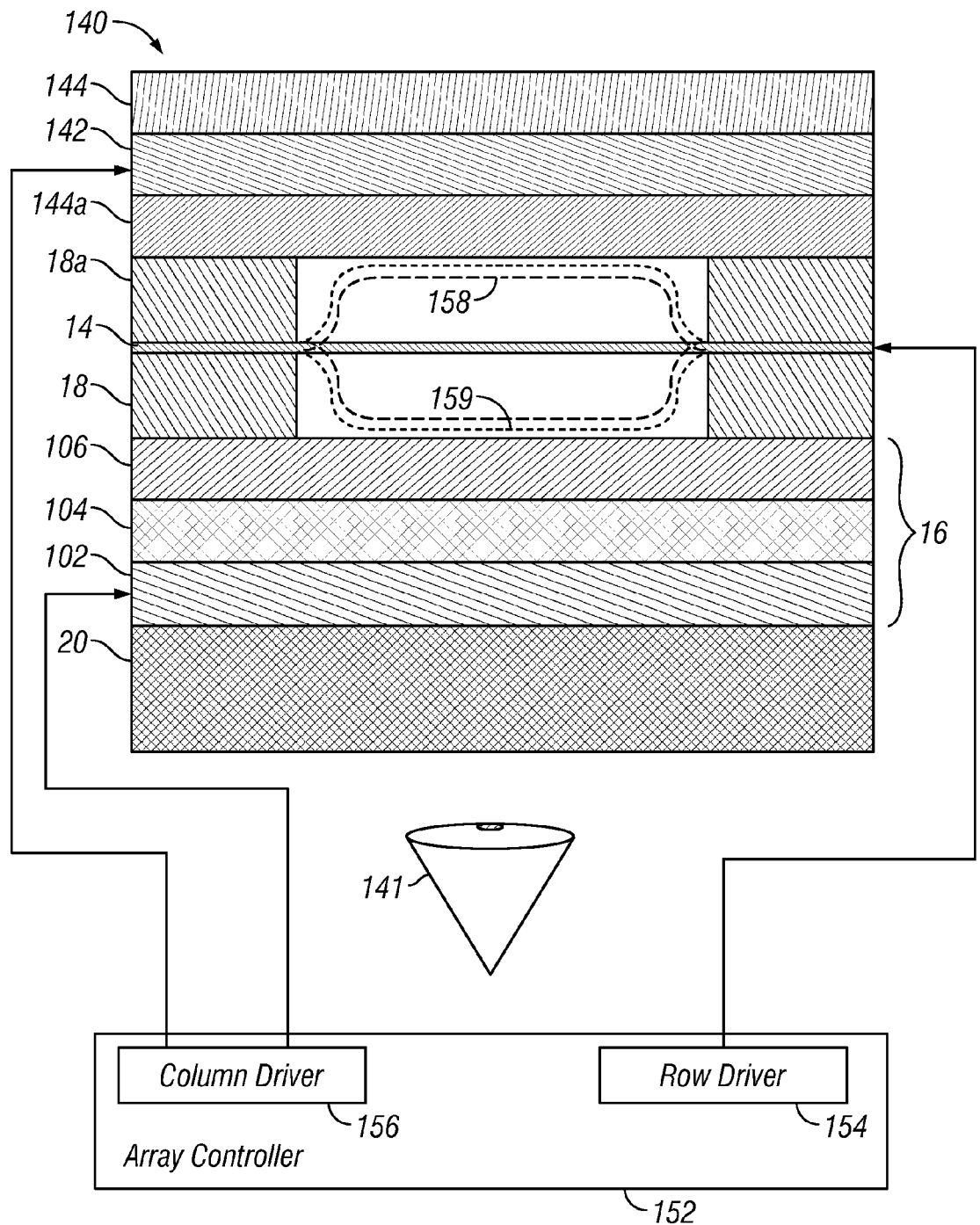
FIG. 11 is a side cross-sectional view of an example multistate interferometric modulator.

FIG. 11 is a side cross-sectional view of an example multistate interferometric modulator 140 that can produce highly saturated color light in one state and relatively intense white light in another state. The example modulator 140 thus decouples color saturation from the brightness of output white light. The modulator 140 includes a movable mirror 14 that is positioned between two electrodes 102 and 142. The modulator 140 also includes a second set of posts 18a that are formed on the opposite side of the mirror 14 as the posts 18.

In certain embodiments, each of the mirror 14 and the partially reflective layer 104 may be part of a stack of layers defining a reflector or reflective member that perform functions other than reflecting light. For example, in the example modulator of FIG. 11, the mirror 14 is formed of one or more layers of a conductive and reflective material such as aluminum. Thus, the mirror 14 may also function as a conductor. Similarly, the partially reflective layer 104 may be formed of one or more layers of reflective material and one or more layers of an electrically conductive material so as to perform the functions of the electrode 102. Furthermore, each of the mirror 14 and the partially reflective layer 104 may also include one or more layers having other functions, such as to control the mechanical properties affecting deflection of the mirror 14. In one embodiment, the movable mirror 14 is suspended from an additional deformable layer such is described in connection with FIGS. 7C-7E.

In one embodiment that includes modulators 12 that reflect red, green, and blue light, different reflective materials are used for the mirrors 14 of the modulators 12 that reflect different colors, so as to improve the spectral response of such modulators 12. For example, the movable mirror 14 may include gold in the modulators 12 configured to reflect red light.

In one embodiment, dielectric layers 144, 144a may be positioned on either side of the conductor 142. The dielectric layers 144a and 106 advantageously inhibit electrical shorts between conductive portions of the mirror 14 and other portions of the modulator 140. In one embodiment, the partially reflective layer 104 and the electrode 102 collectively form a reflective member.

In certain embodiments, the distance between the partially reflective layer 104 and the movable mirror 14 in its undriven position corresponds to the optical path length, L, in which the modulator 140 is non-reflective or "black." In certain embodiments, the optical path length, L, between the partially reflective layer 104 and the movable mirror 14 when driven towards the partially reflective layer 104 corresponds to the optical path length, L, in which the modulator 140 reflects white light. In the exemplary embodiment, the distance between the partially reflective layer 104 and the movable mirror 14 when driven towards the conductor 142 corresponds to the optical path length, L, in which the modulator 140 reflects light of a color such as red, blue, or green. In certain embodiments, the distance, L, between the undriven movable mirror 14 and the partially reflective layer 104 is substantially equal to the distance, L, between the undriven movable mirror 14 and the electrode 142. Such embodiments may be considered to be two modulators positioned around the single movable mirror 14.

When no or small voltage potential differences are applied between the mirror 14 and either the electrode 102 or the electrode 142, the mirror 14 does not deflect with respect to the partially reflective layer 104 to define a first optical path length that corresponds to an undriven state. When a first voltage potential difference is applied between the mirror 14 and the electrode 102, the mirror 14 deflects towards the partially reflective layer 104 to define a second optical path length that corresponds to a first driven state. In this first driven state, the movable mirror 14 is closer to the partially reflective layer 104 than in the undriven state. When a second voltage potential difference is applied between the mirror 14 and the electrode 142, the mirror 14 is deflected away from the partially reflective layer 104 to define a third optical path length that corresponds to a second driven state. In this second driven state, the movable mirror 14 is farther from the partially reflective layer 104 than in the undriven state. In certain embodiments, at least one of the first driven state and second driven state is achieved by applying voltage potential differences both between the mirror 14 and the electrode 102 and between the mirror 14 and the electrode 142. In certain embodiments, the second voltage difference is selected to provide a desired deflection of the mirror 14.

As illustrated in FIG. 11, in the first driven state, the mirror 14 deflects to a position indicated by the dashed line 159. In the exemplary modulator 140, the distance between the mirror 14 and the partially reflective layer 104 in this first driven state corresponds to the thickness of the dielectric layer 106. In the exemplary modulator 140, the mirror 14 acts as a broadband mirror in this driven position, substantially reflecting all visible wavelengths of light. As such, the modulator 140 produces a broadband white light when illuminated by broadband white light.

In the second driven state, the mirror 14 deflects to a position indicated by the dashed line 158. In the exemplary modulator 140, this distance corresponds to a color of light, e.g., blue light. In the undriven state, the mirror 14 is positioned as shown in FIG. 11. In the undeflected position, the mirror 14 is spaced at a distance from the partially reflective layer 104 so that substantially no visible light is reflected, e.g., an "off" or non-reflective state. Thus, the modulator 140 defines an interferometric modulator having at least three discrete states. In other embodiments, the positions of the movable mirror 14 in the three states may be selected so as to produce different sets of colors, including black and white, as desired.

In one embodiment, light enters the modulator 12 through the substrate 20 and is output to a viewing position 141. In another embodiment, the stack of layers illustrated in FIG. 11 is reversed, with layer 144 closest to the substrate 20 rather than layer 102. In certain such embodiments, the modulator 12 may be viewed through the opposite side of the stack from the substrate 20 rather than through the substrate 20. In one such embodiment, a layer of silicon dioxide is formed on the ITO layer 102 to electrically isolate the ITO layer 102.

As noted above, having a separate state for outputting white light in a modulator 140 decouples the selection of the properties of the modulator controlling color saturation from the properties of the modulator affecting the brightness of white output. The distance and other characteristics of the modulator 140 may thus be selected to provide a highly saturated color without affecting the brightness of the white light produced in the first state. For example, in an exemplary color display, one or more of the red, green, and blue modulators 140 may be formed with optical path lengths corresponding to a higher order of interference.

The modulator 140 may be formed using lithographic techniques known in the art, and such as described above with reference to the modulator 12. For example, the partially reflective layer 104 may be formed by depositing one or more layers of chromium onto the substantially transparent substrate 20. The electrode 102 may be formed by depositing one or more layers of a transparent conductor such as ITO onto the substrate 20. The conductor layers are patterned into parallel strips, and may form columns of electrodes. The movable mirror 14 may be formed as a series of parallel strips of a deposited metal layer or layers (e.g., oriented substantially orthogonal to the column electrodes 102) deposited on top of posts 18 and an intervening sacrificial material deposited between the posts 18. Vias through one or more of the layers described above may be provided so that etchant gas, such as xenon diflouride ($XeF_2$) in embodiments in which the sacrificial layer comprises molybdenum, can reach the sacrificial layers. When the sacrificial material is etched away, the deformable metal layers are separated from the optical stack 16 by an air gap. A highly conductive and reflective material such as aluminum may be used for the deformable layers, and these strips may form row electrodes in a display device. The conductor 142 may be formed by depositing posts 18a over the movable mirror 14, depositing an intervening sacrificial material between the posts 18a, depositing one or more layers of a conductor such as aluminum on top of the posts 18a, and depositing a conductive layer over the sacrificial material. When the sacrificial material is etched away, the conductive layer can serve as the electrode 142, which is separated from the mirror 14 by a second air gap. Each of the air gaps provides a cavity in which the mirror 14 may move to achieve each of the states described above.

As further illustrated in FIG. 11, in the exemplary modulator 140, the conductive mirror 14 is connected to the row driver 154 of the array controller 152. In the exemplary modulator 140, the conductors 102 and 142 are connected to separate columns in the column driver 156. In one embodiment, the state of the modulator 140 is selected by applying the appropriate voltage potential differences between the mirror 14 and the column conductors 102 and 142 according to the method described with reference to FIGS. 3 and 4.

Figure 12A:
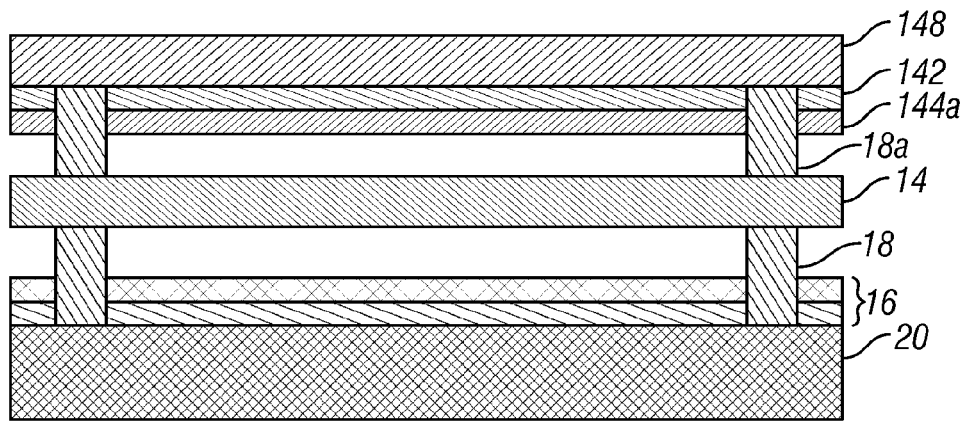
FIG. 12A-12C are side cross-sectional views of another example multistate interferometric modulator.
Figure 12B:
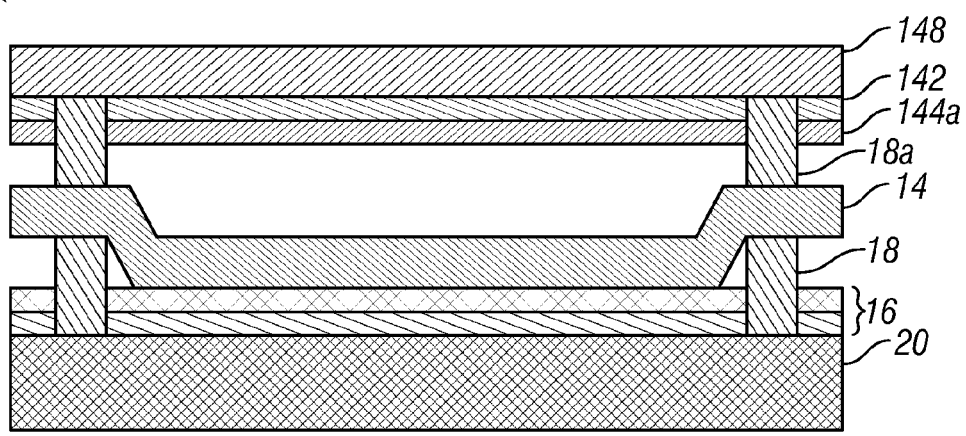
Figure 12C:
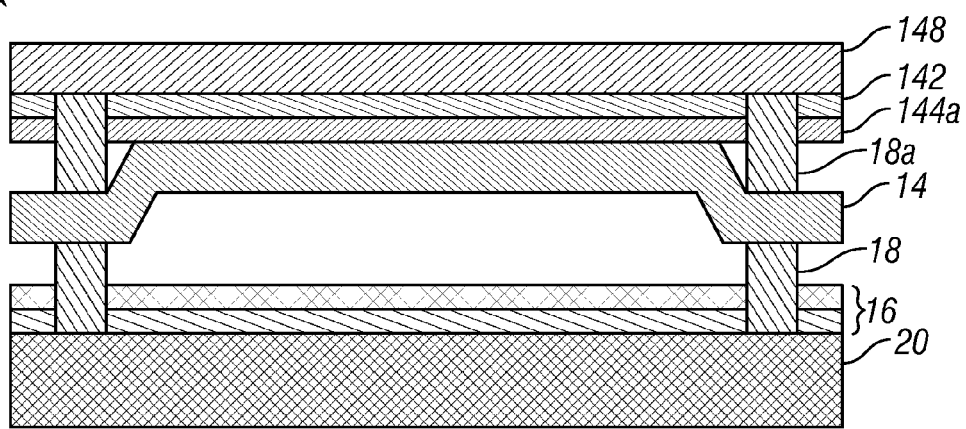

FIGS. 12A-12C illustrates another exemplary interferometric modulator 150 that provides more than two states. In the exemplary modulator 150, the optical stack 16 includes both a reflective layer and a conductive layer so as to perform the function of the electrode 102 of FIG. 11. The conductive layer 142 can also be protected by a second dielectric layer 144a and supported by a support surface 148 that is maintained some distance above the movable mirror 14 through a second set of supports 18a.

FIG. 12A illustrates the undriven state of the modulator 150. As with the modulator 140 of FIG. 11, the mirror 14 of the exemplary modulator 150 of FIGS. 12A-12C is deflectable towards the dielectric layer 104 (e.g., downwards), as in the driven state illustrated FIG. 12B, and is deflectable in the reverse or opposite direction (e.g., upwards), as illustrated in FIG. 12C. This "upwardly" deflected state may be called the "reverse driven state."

As will be appreciated by one of skill in the art, this reverse driven state can be achieved in a number of ways. In one embodiment, the reverse driven state is achieved through the use of an additional charge plate or conductive layer 142 that can electrostatically pull the mirror 14 in the upward direction, as depicted in FIG. 12C. The exemplary modulator 150 includes what is basically two interferometric modulators positioned symmetrically around a single movable mirror 14. This configuration allows each of the conductive layer of the optical stack 16 and the conductive layer 142 to attract the mirror 14 in opposite directions.

In certain embodiments, the additional conductive layer 142 may be useful as an electrode in overcoming stictional forces (static friction) that may develop when the mirror 14 comes in close proximity, or contacts, the dielectric layer 106. These forces can include van der Waals or electrostatic forces, as well as other possibilities as appreciated by one of skill in the art. In one embodiment, a voltage pulse applied to the conductive layer of the optical stack 16 may send the movable mirror 14 into the "normal" driven state of FIG. 12B. Similarly, the next voltage pulse can be applied to the conductive layer 142 to attract the movable mirror 14 away from the optical stack 16. In certain embodiments, such a voltage pulse applied to the conductive layer 142 can be used to accelerate the recovery of the movable mirror 14 back to the undriven state illustrated in FIG. 12A from the driven state illustrated in FIG. 12B by driving the movable mirror 14 towards the reverse driven state. Thus, in certain embodiments, the modulator 150 may operate in only two states, the undriven state of FIG. 12A and the driven state of FIG. 12B, and can employ the conductive layer 142 as an electrode to help overcome stictional forces. In one embodiment, the conductive layer 142 may be driven as described above each time that the modulator 150 changes from the driven position of FIG. 12B to the undriven position of FIG. 12A.

As will be appreciated by one of skill in the art, not all of these elements will be required in every embodiment. For example, if the precise relative amount of upward deflection (e.g., as shown in FIG. 12C) is not relevant in the operation of such embodiments, then the conductive layer 142 can be positioned at various distances from the movable mirror 14. Thus, there may be no need for support elements 18a, the dielectric layer 144a, or a separate support surface 148. In these embodiments, it is not necessarily important how far upward the movable mirror 14 deflects, but rather that the conductive layer 142 is positioned to attract the mirror 14 at the appropriate time, such as to unstick the modulator 12. In other embodiments, the position of the movable mirror 14 as shown in FIG. 12C may result in altered and desirable optical characteristics for the interferometric modulator 150. In these embodiments, the precise distance of deflection of the movable mirror 14 in the upward direction can be relevant in improving the image quality of the device.

As will be appreciated by one of skill in the art, the materials used to produce the layers 142, 144a, and support surface 148 need not be similar to the materials used to produce the corresponding layers 102, 104, and 20, respectively. For example, light need not pass through the layer 148. Additionally, if the conductive layer 142 is positioned beyond the reach of the movable mirror 14 in its deformed upward position, then the modulator 150 may not include the dielectric layer 144a. Additionally, the voltages applied to the conductive layer 142 and the movable mirror 14 can be accordingly different based on the above differences.

As will be appreciated by one of skill in the art, the voltage applied to drive the movable mirror 14 from the driven state of FIG. 12B, back to the undriven state of FIG. 12A may be different than that required to drive the movable mirror 14 from the undriven state of FIG. 12A to the upward or reverse driven state of FIG. 12C, as the distance between the conductive layer 142 and movable mirror 14 may be different in the two states. Such requirements can depend upon the desired application and amounts of deflection, and can be determined by one of skill in the art in view of the present disclosure.

In some embodiments, the amount of force or duration that a force is applied between the conductive layer 142 and the movable mirror 14 is such that it only increases the rate at which the interferometric modulator 150 transitions between the driven state and the undriven state. Since the movable mirror 14 can be attracted to either conductive layer 142 or the conductive layer of the optical stack 16, which are located on opposite sides of movable mirror 14, a very brief driving force can be provided to weaken the interaction of movable mirror 14 with the opposite layer. For example, as the movable mirror 14 is driven to interact with the optical stack 16, a pulse of energy to the opposite conductive layer 142 can be used to weaken the interaction of the movable mirror 14 and the optical stack 16, thereby make it easier for the movable mirror 14 to move to the undriven state.

In certain embodiments, a MEMS device comprises a substrate, a movable element over the substrate, and an actuation electrode. The movable element comprises a deformable layer and a reflective element spaced from the deformable layer. As described above, in certain embodiments the optical properties of the movable element are separated from the mechanical properties of the movable element (e.g., by providing a deformable layer and a reflective element). In certain such embodiments, the optical properties of the movable element are separated from the electrical properties of the movable element as well as the mechanical properties of the movable element by positioning the actuation electrode above the movable element.

Figure 13A:
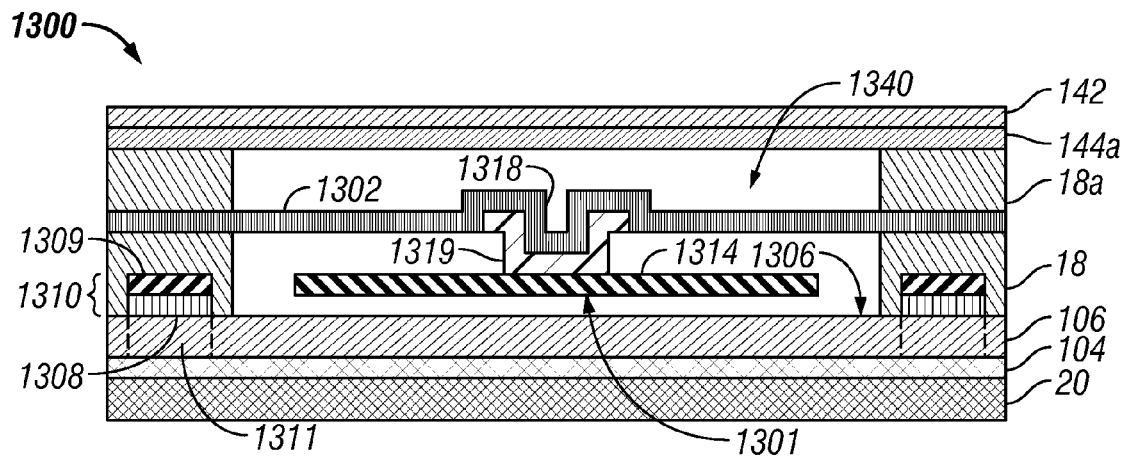
FIG. 13A is a cross-sectional view of an example embodiment of a MEMS device having the optical function separated from the electrical function and the mechanical function.

FIG. 13A illustrates an embodiment of a MEMS device 1300 in the unactuated (or "relaxed") state. The MEMS device 1300 comprises a movable element 1340 over a substrate 20. The movable element 1340 comprises a deformable layer 1302 and a reflective element 1314 having a reflective surface 1301. The MEMS device 1300 further comprises an actuation electrode 142 above the movable element 1340. In certain embodiments, the deformable layer 1302 is attracted towards the actuation electrode 142 by electrostatic forces, which pull the deformable layer 1302 towards the actuation electrode 142. The reflective element 1314 is mechanically coupled to the deformable layer 1302 such that, as the deformable layer 1302 moves towards the actuation electrode 142, the reflective surface 1301 of the reflective element 1314 moves a corresponding distance relative to and away from a first reflective surface 104, which in some embodiments is formed on the substrate 20. The movement of the reflective surface 1301 turns the MEMS device 1300 "on" or "off," as described above. By decoupling the electrical function from the optical function, the area of the electrically active portion of the movable element 1340 can be reduced to be smaller than the area of the optical portion of the movable element 1340.

Figure 13B:
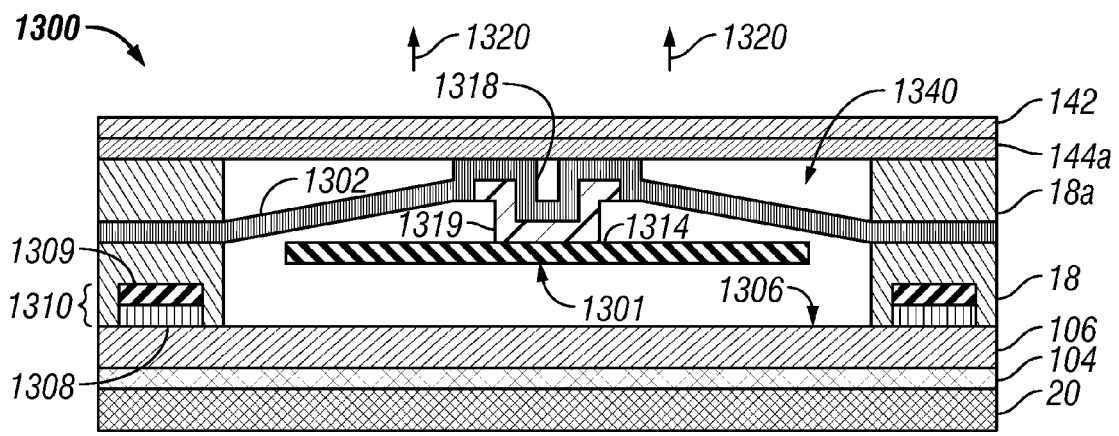
FIG. 13B is a cross-sectional view of the MEMS device of FIG. 13A in an actuated state.

FIG. 13B illustrates the MEMS device 1300 of FIG. 13A in an actuated state. Electrostatic attractive forces created by applying voltages to the actuation electrode 142 act on the deformable layer 1302. The movable element 1340 is responsive to the attractive forces by moving in a direction towards the actuation electrode 142, as indicated by the arrows 1320. An upper surface of the deformable layer 1302 contacts a stationary portion of the MEMS device 1300 (e.g., the insulating layer 144a), stopping the movement of the movable element 1340.

The MEMS device 1300 further comprises a first support structure (or "post") 18 between the substrate 20 and the deformable layer 1302, a second support structure 18a between the deformable layer 1302 and the actuation electrode 142, and insulating layers 106, 144a. Other configurations are also possible. For example, although the illustrated embodiment has a deformable layer 1302 supported by support structures 18, other embodiments are also possible (e.g., as illustrated in FIGS. 7C-7E, as described below). For another example, one or both of the insulating layers 106, 144a may be omitted in some embodiments.

The MEMS device 1300 further comprises an optical layer (first reflective layer) 104. In certain embodiments, the substrate 20 comprises the optical layer 104 (e.g., in embodiments in which the first reflective layer 104 is formed over the substrate 20). Light incident on the reflective element 1314 is reflected from the reflective element. The incident light and the reflected light propagate through the optical layer 104, but do not propagate through the actuation electrode 142 (e.g., because the actuation electrode 142 is positioned above the reflective element 1314). Thus, in contrast to the interferometric modulators 140, 150, the MEMS device 1300 does not have an electrode in the optical path.

Figure 13C:
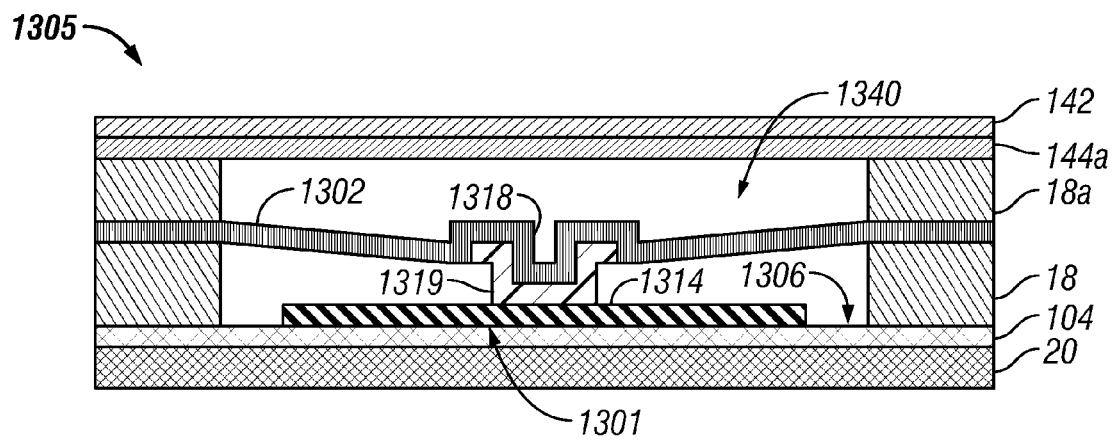
FIG. 13C is a cross-sectional view of another example embodiment of a MEMS device having the optical function separated from the electrical function and the mechanical function.

In some embodiments, the movable element 1340 comprises a connecting element 1318 that mechanically couples the deformable layer 1302 and the reflective element 1314 together. In embodiments in which the connecting element 1318 is electrically conductive and electrically couples the deformable layer 1302 and the reflective element 1314 together, any potential that builds up on the reflective element 1314 can discharge through the deformable layer 1302. Such discharge can reduce arcing that can result from two conductors (e.g., the reflective element 1314 and the first reflective layer 104) at different potentials. In certain embodiments, the movable element 1340 further comprises a connecting element 1319, as schematically illustrated in FIGS. 13A-13C. The connecting element 1319 may be insulating (e.g., comprising $SiO_2$, $Al_2O_3$) or conductive (e.g., comprising nickel, aluminum, etc.). Certain embodiments in which the connecting layer 1319 is electrically conductive may advantageously decrease an amount of curvature and/or tilt of the reflective element 1314 (e.g., in embodiments in which the materials for the deformable layer 1302 and the reflective element 1314 have different internal stresses and/or coefficients of thermal expansion, the connecting element 1319 may decrease and/or absorb the stresses).

The MEMS device 1300 further comprises a black mask 1310 comprising a first layer 1308 and a reflective layer 1309. Light incident on the black mask 1310 reflects between the reflective layer 1309 and the first reflective layer 104 in the area 1311, and is therefore absorbed by the MEMS device 1300 rather than being reflected. As such, the portions of the MEMS device 1300 comprising the black mask 1310 appear black to a viewer of the MEMS device 1300. Black masks may also be used in other portions of the MEMS device 1300, for example to prevent undesired modulation of light and/or to minimize the reflectance of areas that do not modulate light, thereby improving contrast ratio.

As illustrated in FIG. 13A, in certain embodiments the top surface 1306 of the substrate 20 is spaced from the reflective element 1314 when no voltage is applied to the actuation electrode 142. In certain alternative embodiments, the top surface 1306 of the substrate 20 is in contact with the reflective element 1314 when no voltage is applied to the actuation electrode 142. FIG. 13C illustrates an embodiment of a MEMS device 1305 in which the deformable layer 1302 is configured such that the movable element 1340 "launches" negatively (e.g., towards the substrate 20) in the relaxed state. For example, the residual stresses between the deformable layer 1302 and the support structure 18 and/or the support structure 18a may be designed such that the deformable layer 1302 deflects downward upon removal of sacrificial layers. The actuated state of the MEMS device 1305 of FIG. 13C may be substantially the same as depicted in FIG. 13B.

The response time of a MEMS device is proportional to a product of the resistance of the conductors and the capacitance. A MEMS device comprising an actuation electrode 142 above the movable element 1340 may advantageously reduce resistance and/or and capacitance, thereby reducing response time. Reducing the response time can increase the screen refresh rate and enhance temporal modulation. In addition to decreasing response time, reducing the capacitance of the MEMS device can decrease the power consumption of the MEMS device.

In embodiments in which an actuation electrode 102 is in the optical path of the MEMS device (e.g., as depicted in FIG. 8), it comprises a material that is transparent to light, for example, but not limited to, ITO, ZnTO, indium zinc oxide (IZO), and indium oxide (IO). In general, transparent conductors have poor electrical resistance compared to non-transparent conductors, which can result in poor power dissipation and high electrical time constants for MEMS devices comprising transparent actuation electrodes 102. However, an actuation electrode 142 above the movable element 1340 is not in the optical path, which allows the actuation electrode 142 to comprise non-transparent conductors such as aluminum, copper, silver, gold, etc., as well as transparent conductors. Certain MEMS devices comprising a non-transparent actuation electrode 142 can advantageously have lower power dissipation and/or shorter electrical response times than MEMS devices comprising a transparent actuation electrode 102 because non-transparent conductors can have a lower resistance than transparent conductors.

Certain transparent conductors such as ITO are sensitive to high temperature processes, such that the maximum processing temperature of the MEMS device is limited after formation of the actuation electrode 102. For example, ITO degrades at temperatures around 350° C. and higher, increasing the resistivity of an actuation electrode 102 comprising ITO. As such, certain processes (e.g., chemical vapor deposition (CVD) greater than 350° C.) are not typically performed on structures comprising ITO. However, MEMS devices comprising an actuation electrode 142 above the movable element 1340 may have an actuation electrode 142 comprising a variety of conductors that can withstand high temperature processing, which increases process flexibility for components of the MEMS device. For example, certain depositions can be performed at high temperatures. For another example, certain deposition processes may be CVD rather than physical vapor deposition (PVD) (e.g., sputter), which can enhance deposition conformality and uniformity. Moreover, in certain embodiments in which the actuation electrode 142 is above the movable element 1340, the actuation electrode 142 may be formed towards the end of the fabrication process (e.g., after high temperature processes have been performed).

The thickness of an actuation electrode 102 in the optical path is limited in order to avoid adversely impacting the optical properties of the MEMS device, but an actuation electrode 142 above the movable element 1340 may have a variety of thicknesses because it is not in the optical path. Increasing the thickness of the actuation electrode 142 can, for example, advantageously increase conductivity, thereby reducing response time and/or power consumption of the MEMS device. Moreover, thick actuation electrodes 142 enable the use of alternative deposition methods (e.g., coating, inkjet printing, printable conductors), which can lower manufacturing costs.

In embodiments in which the actuation electrode 102 is in the optical path of the MEMS device such that it pulls the mirror 14 towards the substrate 20, the mirror 14 generally contacts the top surface 1306 of the substrate 20 (e.g., the top surface of an insulating layer 106 on the substrate 20) with the top surface 1306 of the substrate 20 acting as a "stop" for movement of the mirror 14. In embodiments in which the reflective surface of the mirror 14 and the top surface 1306 of the substrate 20 are flat (e.g., to enhance color gamut), stiction between the surfaces may disadvantageously affect operation of MEMS devices in which they contact. Certain features, such as surface roughening and anti-stiction layers, may be used to reduce such stiction, but those features can adversely impact the optical performance of the MEMS device. However, an actuation electrode 142 above the movable element 1340 allows configuration of the MEMS device 1300 such that a portion of the movable element 1340 contacts the actuation electrode 142 and acts as the stop for movement of the movable element 1340 rather than the top surface 1306 of the substrate 20. The interface where the portion of the movable element 1340 contacts the actuation electrode 142 can be advantageously adapted to reduce stiction without impacting optical performance because it is not in the optical path. For example, the surface topography of the insulating layer 144a may be roughened to reduce the number of contact points or an anti-stiction layer may be formed on the actuation electrode 142.

Transparent actuation electrodes 102 are generally under the entire reflective surface of the mirror 14 (e.g., as depicted in FIG. 8) such that the electrostatic forces created by applying voltages to the actuation electrode 102 are sufficient to actuate the MEMS device. Thus, in embodiments in which a capacitor of the MEMS device comprises the mirror 14 and the actuation electrode 102, the area of the capacitor and the capacitance of the MEMS device is high. In embodiments employing larger mirrors 14 (e.g., to enhance fill factor), the MEMS device can have even higher capacitances. A MEMS device 1300 in which the capacitor comprises the actuation electrode 142 and portions of an upper surface of the deformable layer 1302 (e.g., as depicted in FIG. 13A) can advantageously reduce the area of the capacitor and decrease the capacitance of the MEMS device 1300.

A MEMS device 1300 in which the capacitor comprises the actuation electrode 142 and portions of an upper surface of the deformable layer 1302 (e.g., as depicted in FIG. 13A) can also advantageously decrease a mechanical force used to operate the MEMS device and decrease certain dimensions of the deformable layer 1302 because the mechanical function is at least partially separated from the optical function. In certain embodiments in which the actuation electrode 142 of the MEMS device is between the deformable layer 1302 and the reflective element 1314 and acts a stop for the deformable layer 1302 or the reflective element 1314, the area of contact can be smaller than the area of the reflective surface 1301. The smaller area of contact results in less stiction, so lower mechanical forces may be used, allowing the dimensions of the deformable layer 1302 to be reduced. In embodiments in which the capacitor comprises the deformable layer 1302 and the actuation electrode 142, reduced dimensions of the deformable layer 1302 can decrease the area of the capacitor, and thus advantageously reduce the capacitance and power consumption of the MEMS device 1300.

High reflectivity broadband white, in which the distance between the first and second reflective layers of a MEMS device is negligible (e.g., less than about 100 Å), is not possible in embodiments in which the actuation electrode 102 is in the optical path electrical shorts may occur between the actuation electrode 102 and the mirror 14 when the insulating layer 106 is that thin. Low reflectivity black, in which the distance between the first and second reflective layers of a MEMS device is between about 90 and 110 nm (e.g., about 100 nm) and certain colors (e.g., red, green, blue, etc.) are also not possible in embodiments in which the actuation electrode 102 is in the optical path because the insulating layer 106 reduces reflectivity (e.g., as described above with respect to FIG. 9).

In the embodiment illustrated in FIG. 8, the mirror 14 is electrically insulated from the actuation electrode 102 and the first reflective layer 104 by the insulating layer 106, as described above. In certain embodiments in which the MEMS device comprises an actuation electrode 142 above the movable element 1340, the insulating layer 106 may optionally be eliminated from the MEMS device, for example in embodiments in which the reflective element 1314 does not contact the top surface 1306 of the substrate 20 (e.g., when the relaxed state is above the top of the substrate 20, as depicted by the MEMS device 1300 of FIG. 13A) and embodiments in which the reflective element 1314 contacts the first reflective layer 104 (e.g., due to negative launching, as depicted by the MEMS device 1300 of FIG. 13C). Elimination of the insulating layer 106 allows the reflective surface 1301 of the reflective element 1314 and the first reflective surface 104 to be separated by a negligible distance (e.g., by less than about 100 Å or touching). Each interface of reflective MEMS devices causes some reflectance, so embodiments without an insulating layer 106 may produce better colors (e.g., better black) than embodiments including an insulating layer 106. Gray may also be produced without temporal modulation by spacing the reflective surface 1301 of the reflective element 1314 from the first reflective layer 104 by between about 100 Å and 100 nm.

Referring again to FIG. 13C, the relaxed state may produce high reflectivity broadband white (e.g., by touching the first reflective layer 104 or being spaced less than about 100 Å from the first reflective layer 104), low reflectivity black (e.g., by being spaced from the first reflective layer 104 by about 100 nm), gray (e.g., by being spaced from the first reflective layer 104 by between about 100 Å and 100 nm), or a color (e.g., yellow, red, blue, etc.).

In embodiments in which the MEMS device 1300 is configured such that the reflective element 1314 and the first reflective layer 104 contact or nearly contact so as to produce broadband white, the reflective element 1314 and the first reflective layer 104 are preferably at the same potential in order to decrease any electrostatic forces or electric field therebetween that may cause arcing. In certain embodiments, the reflective element 1314 is in electrical communication with the first reflective layer 104 through the deformable layer 1302 such that they are at the same potential. In certain embodiments, the reflective element 1314 is electrically insulated from the deformable layer 1302 (e.g., using a dielectric connecting element 1319) and the first reflective layer 104 is also electrically insulated, such that they are at the same potential. In order to reduce stiction between the reflective element 1314 and the first reflective layer 104 in embodiments in which they contact, conductive features (e.g., bumps) may be applied to the first reflective layer 104 and/or the reflective surface 1301, although such features may negatively impact optical performance of the MEMS device.

In certain embodiments, a MEMS device comprises an actuation electrode 142 above the movable element and a second actuation electrode. The movable element is responsive to voltages applied to the actuation electrode 142 above the movable element by moving generally in a first direction, as described above. The movable element is further responsive to voltages applied to the second actuation electrode by moving generally in a second direction that is substantially opposite the first direction. The MEMS device is thus capable of stably producing at least three colors: a first color in the relaxed state, a second color in the actuated state in the first direction, and a third color in the actuated state in the second direction.

Figure 14A:
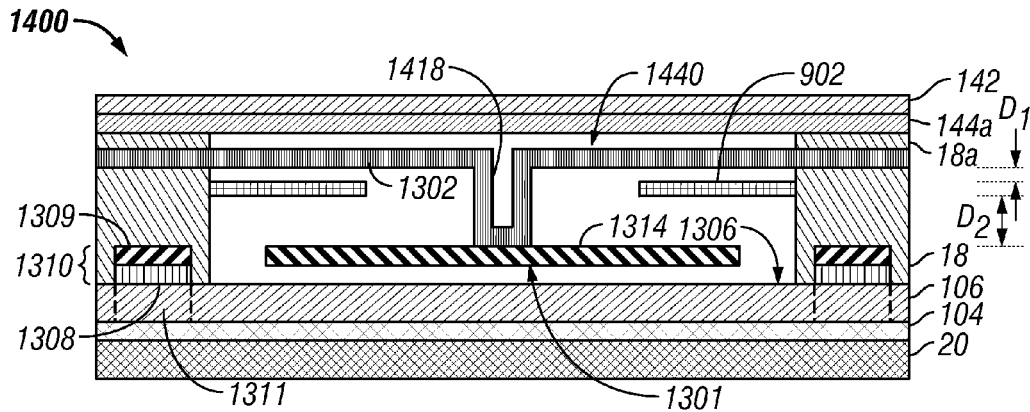
FIG. 14A is a cross-sectional view of yet another example embodiment of a MEMS device having the optical function separated from the electrical function and the mechanical function.

FIG. 14A illustrates a MEMS device 1400 comprising a movable element 1440 over a substrate 20. The movable element 1440 comprises a deformable layer 1302 and a reflective element 1314 spaced from the deformable layer 1302 and having a reflective surface 1301. The MEMS device 1400 further comprises an actuation electrode 142 above the movable element 1440 and a second actuation electrode 902 between the deformable layer 1302 and the reflective element 1314. In FIG. 14A, the second actuation electrode 902 is supported by support structures 18. In certain alternative embodiments, the second actuation electrode 902 is supported by other support structures (e.g., spaced from the support structures 18). However, certain such embodiments may reduce the fill factor of the MEMS device by occupying portions of the MEMS device that could more advantageously be used for the reflective element 1314.

In embodiments in which the deformable layer 1302 is in electrical communication with the reflective element 1314 (e.g., due to a conductive connecting element 1418 and/or conductive connecting element therebetween (not shown)), the deformable layer 1302 and the reflective element 1314 are at the same potential. In certain such embodiments, when a voltage is applied to the second actuation electrode 902, a first attractive force in a first direction (e.g., towards the reflective element 1314) acts on a first portion of the movable element 1440 (e.g., the deformable layer 1302) and a second attractive force in a second direction (e.g., away from the reflective element 1314) acts on a second portion of the movable element 1440 (e.g., the reflective element 1314). In certain other such embodiments, when a voltage is applied to the second actuation electrode 902, a first attractive force in a first direction (e.g., away from the reflective element 1314) acts on a first portion of the movable element 1440 (e.g., the reflective element 1314) and a second attractive force in a second direction (e.g., towards the reflective element 1314) acts on a second portion of the movable element 1440 (e.g., the deformable layer 1302). The second direction is substantially opposite to the first direction. In embodiments in which the first attractive force is greater than the second attractive force, the movable element 1440 is responsive to the first and second attractive forces by moving generally in the first direction, for example in a direction generally perpendicular to the substrate 20.

Figure 14B:
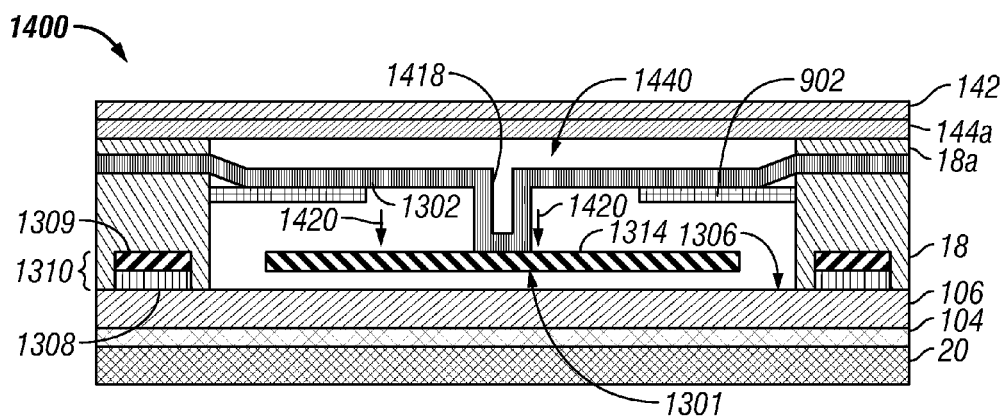
FIGS. 14B and 14C are cross-sectional views of the MEMS devices of FIG. 14A in actuated states.

FIG. 14B illustrates an embodiment of the MEMS device 1400 of FIG. 14A in a first actuated state. The first attractive force acts on the deformable layer 1302 and the second attractive force acts on the reflective element 1314. The movable element 1340 is responsive to the first and second attractive forces by moving generally in the first direction, for example in a direction generally perpendicular to the substrate 20 as illustrated by arrows 1420. A lower surface of the deformable layer 1302 contacts a stationary portion of the MEMS device 1400 (e.g., the second actuation electrode 902). In certain such embodiments, the reflective element 1314 does not contact the top surface 1306 of the substrate 20 (e.g., the top surface 1306 of the insulating layer 106 or the top surface 1306 of the first reflective layer 104) in the actuated state. Other embodiments are also possible. For example, the reflective surface 1301 of the reflective element 1314 may contact a stationary portion of the MEMS device 1400 (e.g., the top surface 1306 of the substrate 20) before the lower surface of the deformable layer 1302 contacts a stationary portion of the MEMS device 1400.

Figure 14C:
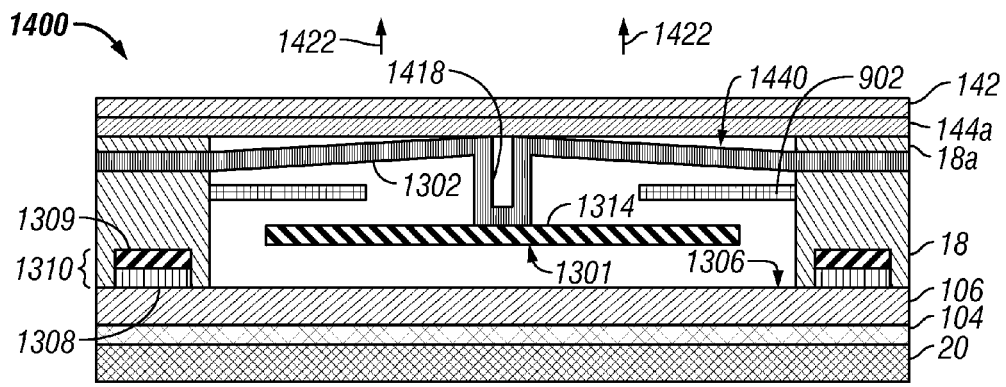

FIG. 14C illustrates an embodiment of the MEMS device 1400 of FIG. 14A in a second actuated state. The movable element 1440 is responsive an attractive force produced by applying voltages to the actuation electrode 142 by moving in a direction towards the actuation electrode 142, as indicated by arrows 1422. An upper surface of the deformable layer 1302 contacts a stationary portion of the MEMS device 1400 (e.g., the insulating layer 144a). In certain embodiments, the reflective element 1314 does not contact the second actuation electrode 902 in the actuated state. Other embodiments are also possible. For example, an upper surface of the reflective element 1314 may contact a stationary portion of the MEMS device 1400 (e.g., the second actuation electrode 902) before the deformable layer 1302 contacts a stationary portion of the MEMS device 1400.

In order to ensure that the displacement in response to voltages applied between the second actuation electrode 902 and the movable element 1440 occurs substantially only in the movable element 1440 (e.g., due to deformation of the deformable layer 1302) and substantially not in the second actuation electrode 902, the second actuation electrode 902 is preferably stiff or rigid. The stiffness of a layer is proportional to the cube of the thickness of the layer. In certain embodiments, the second actuation electrode 902 has a thickness such that it substantially does not deform. For example, in embodiments in which the second actuation electrode 902 comprises aluminum, the actuation electrode may have a thickness greater than about 2.15 times the thickness of the deformable layer 1302. It will be appreciated that other dimensions (e.g., length and width) may also influence the rigidity of the second actuation electrode 902.

Referring again to FIG. 14A, in certain embodiments, in the relaxed state, the deformable layer 1302 is separated from the second actuation electrode 902 by a distance $D_1$ and the reflective element 1314 is separated from the second actuation electrode 902 by a distance $D_2$ that is different than $D_1$. The electrostatic force between two conductive layers with a potential difference between the two conductive layers is inversely proportional to the distance between the two conductive layers. Thus, the smaller the distance between the second actuation electrode 902 and a portion of the movable element 1440, the greater the magnitude of the electrostatic forces acting on that portion of the movable element 1440. If the distance $D_2$ is greater than the distance $D_1$, the electrostatic forces per unit area acting on the deformable layer 1302 are greater than the electrostatic forces per unit area acting on the reflective element 1314. In certain such embodiments, application of voltages to the second actuation electrode 902 will cause the movable element 1440 to move towards the substrate 20. If the distance $D_1$ is greater than the distance $D_2$, the electrostatic forces per unit area acting on the reflective element 1314 are greater than the electrostatic forces per unit area acting on the deformable layer 1302. In certain such embodiments, application of voltages to the second actuation electrode 902 will cause the movable element 1440 to move away from the substrate 20. In embodiments comprising an actuation electrode 142, which causes the movable element 1440 to move away from the substrate 20, the distance $D_2$ is preferably greater than the distance $D_1$ such that the actuation electrodes 142, 902 cause deflection in different directions.

In certain embodiments, the percentage difference between the distances $D_1$, $D_2$ is greater than about 5%, greater than about 10%, greater than about 15%, or greater than about 20%. The difference between the distances $D_1$, $D_2$ should be balanced with certain other factors, for example the optical interference properties (e.g., the reflected color) and the thickness of the MEMS device, which also depend on the distances $D_1$, $D_2$. Once there is some amount of imbalance (i.e., a suitable difference between the distances $D_1$, $D_2$), application of voltages to the second actuation electrode 902 will attract the portion of the movable element 1440 with the shorter distance towards the actuation electrode 902, thereby decreasing that distance while also increasing the distance from the portion of the movable element 1440 with the larger distance. Thus, even in embodiments having a small amount of imbalance (e.g., due to distance differences below about 10%), the electrostatic forces can suitably cause actuation of the movable element 1440.

Regardless of the distances between the second actuation electrode 902 and the first and second portions of the movable element 1440, electrostatic forces may be at least partially reduced by a conductive layer that shields at least a portion of the voltage difference between the actuation electrode 902 and the movable element 1440. For example, shielding the first portion of the movable element 1440 from the second actuation electrode 902 can cause the electrostatic forces to act more substantially on the second portion of the movable element 1440. If the first portion of the movable element 1440 that is at least partially shielded from the actuation electrode 902 comprises the reflective element 1314, application of voltages to the second actuation electrode 902 will cause the movable element 1440 to move towards the substrate 20. If the first portion of the movable element 1440 that is at least partially shielded from the actuation electrode 902 comprises the deformable layer 1302, application of voltages to the second actuation electrode 902 will cause the movable element 1440 to move away from the substrate 20. In embodiments comprising an actuation electrode 142, which causes the movable element 1440 to move away from the substrate 20, a second conductive layer 1558, described in detail below, is preferably on a side of the first conductive layer 1552 such that the actuation electrodes 142, 902 cause deflection in different directions. In certain such embodiments, shielding can reduce the thickness of a display device comprising the MEMS device 1400 because there does not need to be a difference between the distances $D_1$, $D_2$, although shielding may also increase design complexity and fabrication costs.

Figure 15A:
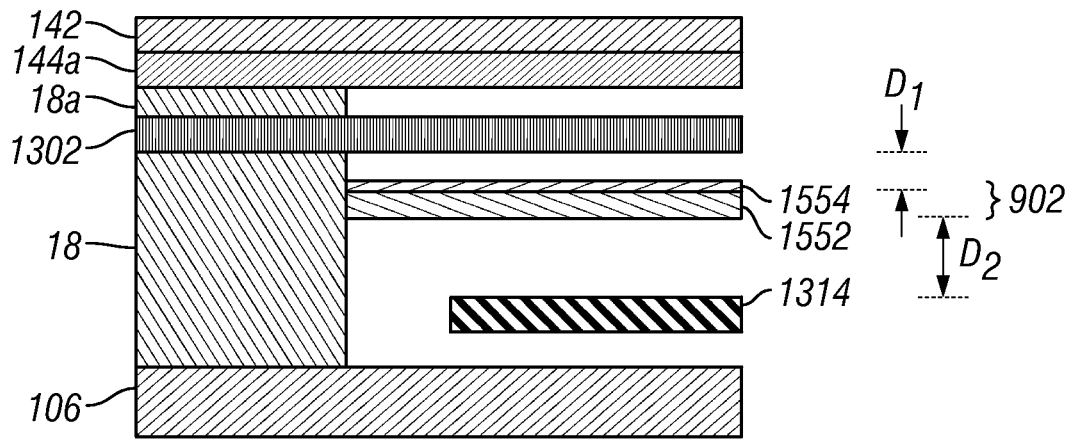
FIGS. 15A and 15B are blown up cross-sectional views of embodiments of actuation electrodes for a MEMS device having the optical function separated from the electrical function and the mechanical function.

FIG. 15A illustrates a portion of an embodiment in which the second actuation electrode 902 comprises a multi-layer stack including a conductive layer 1552 and an insulating layer 1554. In certain embodiments, the conductive layer 1552 comprises a conductive material to which voltages are applied, and the insulating layer 1554 provides the desired rigidity to the second actuation electrode 902 and provides electrical insulation to inhibit shorts between the second actuation electrode 902 and the movable element 1440. For example, a layer of $SiO_2$ greater than about 1,500 Å thick is sufficiently rigid. In certain alternative embodiments, the conductive layer 1552 comprises a conductive material to which voltages are applied and provides the desired rigidity to the second actuation electrode 902, and the insulating layer 1554 provides electrical insulation to inhibit shorts between the second actuation electrode 902 and the movable element 1440. In embodiments in which the MEMS device 1400 is designed such that the movable element 1440 moves towards substrate 20 upon actuation, the insulating layer 1554 is preferably above the conductive layer 1552 (e.g., as illustrated in FIG. 15A) because a lower surface of the deformable layer 1302 may contact the second actuation electrode 902 when the MEMS device 1400 is in the actuated state. In embodiments in which the MEMS device 1400 is designed such that the movable element 1440 moves away from the substrate 20 upon actuation, the insulating layer 1554 is preferably below the conductive layer 1552 because an upper surface of the reflective element 1314 may contact the second actuation electrode 902 when the MEMS device 1400 is in the actuated state. Other configurations of multi-layer second actuation electrodes 902 are also possible. For example, the second actuation electrode 902 may comprise a single rigid layer of conductive material and an insulating layer may be formed on a lower surface of the deformable layer 1302 and/or an upper surface of the reflective element 1314. Other multi-layer stacks are also possible. For example, the second actuation electrode 902 may further comprise a second insulating layer on as side of the conductive layer 1552 opposite the insulating layer 1554 to provide electrical insulation to inhibit shorts between the second actuation electrode 902 and other portions of the movable element 1440.

The thickness of the insulating layer 1554 is included in the distance from the conductive portion 1552 of the second actuation electrode 902 to the deformable layer 1302, $D_1$ (e.g., when formed over the conductive portion 1552, as depicted in FIG. 15A) or to the reflective element 1314, $D_2$ (e.g., when formed under the conductive portion 1552). In certain embodiments, the insulating layer 2254 is selected to provide a desired dielectric permittivity to tailor the electrostatic force between the actuation electrode 902 and the movable element 1440.

Figure 15B:
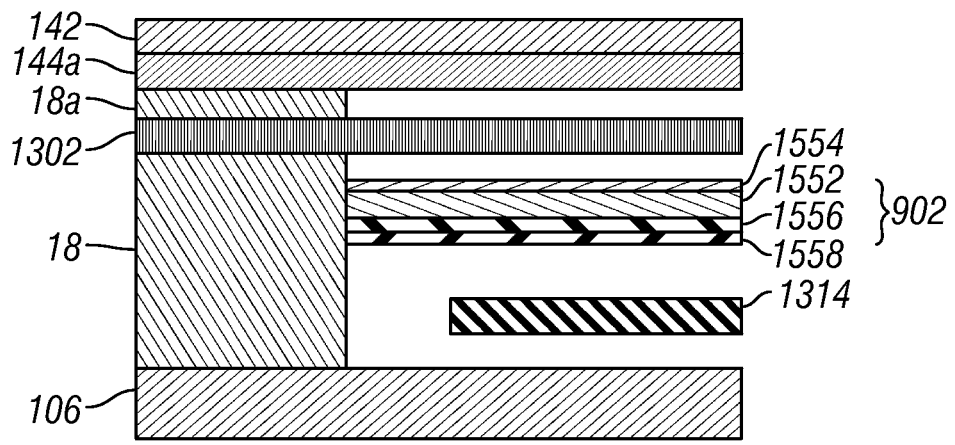

FIG. 15B illustrates another embodiment in which the second actuation electrode 902 comprises a multi-layer stack. The second actuation electrode 902 comprises a first conductive layer 1552 to which actuation voltages are applied, a first insulating layer 1554 that inhibits shorts between the second actuation electrode 902 and the movable element 1440, a second conductive layer 1558 that shields a layer of the movable element 1440 from the electrostatic forces, and a second insulating layer 1556 that insulates the first conductive layer 1552 from the second conductive layer 1558. The second conductive layer 1558 is on an opposite side of the first conductive layer 1552 from the first insulating layer 1554. In embodiments in which the MEMS device 1400 is designed such that the movable element 1440 moves towards the substrate 20 upon actuation, the first insulating layer 1554 is above the first conductive layer 1552 (e.g., as illustrated in FIG. 15B) because a lower surface of the deformable layer 1302 may contact the second actuation electrode 902 when the MEMS device 1400 is in the actuated state, and the second conductive layer 1558 is below the first conductive layer 1552 because the reflective element 1314 is at least partially shielded from the electrostatic forces by the second conductive layer 1558. In embodiments in which the MEMS device 1400 is designed such that the movable element 1440 moves away from the substrate 20 upon actuation, the first insulating layer 1554 is below the first conductive layer 1552 because an upper surface of the reflective element 1314 may contact the second actuation electrode 902 when the MEMS device 1400 is in the actuated state, and the second conductive layer 1558 is above the first conductive layer 1552 because the deformable layer 1302 is at least partially shielded from the electrostatic forces by the second conductive layer 1558. In certain such embodiments, the dimensions (e.g., thickness) of the second actuation electrode 902, comprising the layers 1552, 1554, 1556, 1558, is rigid enough that the second actuation electrode 902 substantially does not deform. Other multi-layer stacks are also possible. For example, the second actuation electrode 902 may further comprise a third insulating layer on a side of the second conductive layer 1558 opposite the first conductive layer 1552 to provide insulation to inhibit shorts between the second actuation electrode 902 and other portions of the movable element 1440.

An actuation electrode 902 between the deformable layer 1302 and the reflective element 1314 allows configuration of the MEMS device 1400 such that a portion of the movable element 1440 contacts the actuation electrode 902 (i.e., the actuation electrode 902 acts as the stop for movement of the movable element 1440 rather than the top surface 1306 of the substrate 20 or a lower surface of the insulating layer 144*a*). The interface where the portion of the movable element 1440 contacts the actuation electrode 902 can be advantageously adapted to reduce stiction without impacting optical performance because it is not in the optical path. For example, the surface topography of the insulating layer 1554 may be roughened to reduce the number of contact points or anti-stiction layer may be formed on the actuation electrode 902. For another example, the surface topography of an upper surface of the reflective element 1314 or a lower surface of the deformable layer 1302 may be roughened to reduce the number of contact points or an anti-stiction layer may be formed on the upper surface of the reflective element 1314 or the lower surface of the deformable layer 1302.

Electrostatic forces are due to electrical potential differences. In embodiments in which the movable element 1440 comprises an insulating connecting element (not shown), the potential of the reflective element 1314 can be about zero when the potential of the deformable layer 1302 is not zero. In certain such embodiments, the electrostatic forces acting on the deformable layer 1302 in response to voltages applied to the actuation electrode 902 may selectively be larger than the electrostatic forces acting on the reflective element 1314 in response to voltages applied to the actuation electrode 902. Thus, the movable element 1440 may be configured to actuate towards the substrate 20 in response to voltages applied to the second actuation electrode 902. Moreover, the area of a capacitor (e.g., between the second actuation electrode 902 and deformable layer 1302) can be advantageously small, thereby taking less time to discharge than large capacitors (e.g., between reflective elements and actuation electrodes in the optical path), which can decrease response time. However, in embodiments in which the reflective element 1314 is electrically insulated from the deformable layer 1302 or other structures, the reflective element 1314 may become charged, thereby creating an electrostatic force itself. In some embodiments, the reflective element 1314 is coated (e.g., with plastic) to selectively dissipate electrostatic discharge.

When voltages are applied to the second actuation electrode 902, electrostatic forces act on the movable element 1440. In response, the deformable layer 1302 flexes towards the second actuation electrode 902 if the attractive forces on the deformable layer 1302 are greater than the attractive forces on the reflective element 1314. The reflective element 1314 is mechanically coupled to the deformable layer 1302 such that, as the deformable layer 1302 moves towards the second actuation electrode 902, the reflective element 1314 moves a corresponding distance relative to and towards the substrate 20. A stationary portion of the MEMS device 1400 acts as a stop for movement of the movable element 1440.

In certain embodiments (e.g., embodiments in which a lower surface of the deformable layer 1302 contacts the second actuation electrode 902), the actuation electrode 902 comprises the stationary portion (e.g., as illustrated in FIG. 14B). In certain such embodiments, an insulating layer 106 is optional because the movable element 1440 does not contact the top surface 1306 of the substrate 20. In certain embodiments described above in which the MEMS device comprises an actuation electrode 104 in the optical path and an insulating layer 106, and in which the mirror 14 contacts the top surface of the insulating layer 106 in the actuated state, the area of contact includes a dielectric layer. To avoid trapping charges in the dielectric layer, the polarity of the voltages applied to the actuation electrode 104 and the mirror 14 can be alternately switched. Switching polarity dissipates charge, but consumes power. However, in certain embodiments in which the MEMS device 1400 does not comprise the insulating layer 106 and in which the reflective surface 1301 of the reflective element 1314 contacts the top surface 1306 of the first reflective layer 104 in the actuated state, the contact is advantageously free of an electric field. As such, the voltages applied to the second actuation electrode 902 and the movable element 1440 may remain the same, which advantageously saves power.

In some embodiments, an insulating layer 1554 insulates the movable element 1440 from the second actuation electrode 902. In some embodiments, an insulating layer formed on a lower surface of the deformable layer 1302 (not shown) insulates the movable element 1440 from the second actuation electrode 902. In certain alternative embodiments, the top surface 1306 of the substrate 20 comprises the stationary portion. In some embodiments, an insulating layer 106 insulates the movable element 1440 from the first reflective layer 104.

The movable element 1440 is responsive to voltages applied to the actuation electrode 142 by moving generally in a first direction, as described above. In embodiments in which the actuation electrode 142 provides the forces to move the movable element 1440 away from the substrate 20, the second actuation electrode 902 is configured such that the movable element 1440 moves towards the substrate 20 when voltages are applied to the second actuation electrode 902 (e.g., by positioning the second actuation electrode 902 closer to the deformable element 1302 than the reflective element 1314, by shielding the reflective element 1314 with a conductive layer 1558, etc.).

The second actuation electrode 902 preferably comprises a non-transparent conductive material, for example for the electrical properties described above. The second actuation electrode 902 is positioned above the reflective surface 1301 of the reflective element 1314 such that the second actuation electrode 902 is not in the optical path of the MEMS device 1400, so it may comprise a non-transparent conductive material. As such, the MEMS device 1400 is capable of fast response times and low power consumption.

In certain embodiments, a MEMS device comprises an actuation electrode 902 between the deformable layer 1302 and the reflective element 1314 and a second actuation electrode. The movable element is responsive to voltages applied to the actuation electrode 902 between the deformable layer 1302 and the reflective element 1314 by moving generally in a first direction, as described above. The movable element is further responsive to voltages applied to the second actuation electrode by moving generally in a second direction that is substantially opposite the first direction. The MEMS device is thus capable of stably producing at least three colors: a first color in the relaxed state, a second color in the actuated state in the first direction, and a third color in the actuated state in the second direction. In some embodiments, the actuation electrode 142 above the movable element 1440 may be characterized as the "second" actuation electrode (e.g., as illustrated in FIGS. 14A-14C).

Figure 16A:
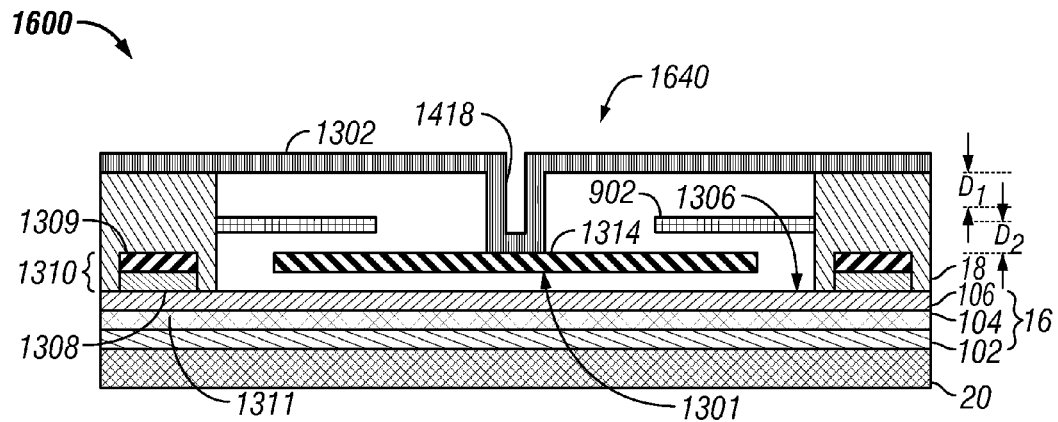
FIG. 16A is a cross-sectional view of still another example embodiment of a MEMS device having the optical function separated from the electrical function and the mechanical function.

FIG. 16A illustrates a MEMS device 1600 comprising a movable element 1640 over a substrate 20. The movable element 1640 comprises a deformable layer 1302 and a reflective element 1314 having a reflective surface 1301. The MEMS device 1600 further comprises an actuation electrode 902 between the deformable layer 1302 and the reflective element 1314, and the optical stack 20 comprises a second actuation electrode 102. In FIG. 16A, the second actuation electrode 102 is formed over the substrate 20.

Figure 16B:
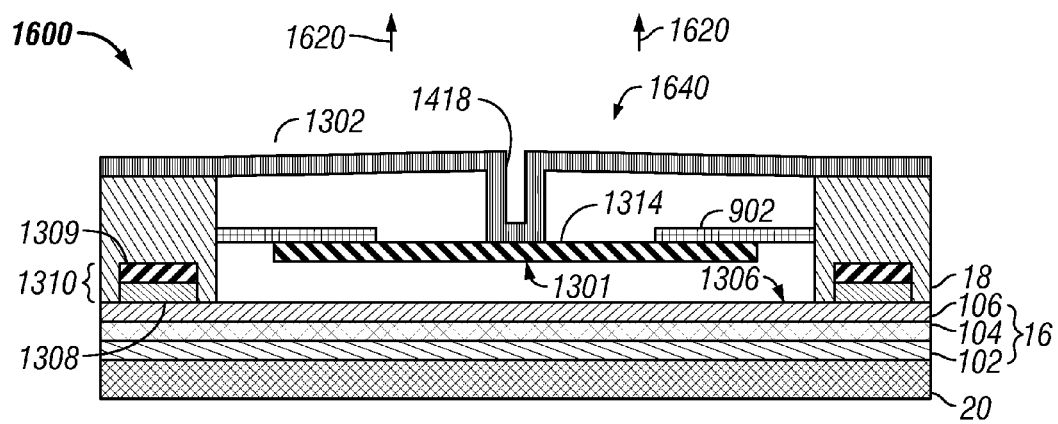
FIGS. 16B and 16C are cross-sectional views of the MEMS devices of FIG. 16A in actuated states.

FIG. 16B illustrates an embodiment of the MEMS device 1600 of FIG. 16A in a first actuated state. The first portion of the movable element 1640 acted on by the first attractive force comprises the deformable layer 1302 and the second portion of the movable element 1640 acted on by the second attractive force comprises the reflective element 1314. The movable element 1640 is responsive to the first and second attractive forces by moving generally in the first direction, for example in a direction generally perpendicular to the substrate 20 as illustrated by arrows 1620. In certain embodiments, an upper surface of the reflective element 1314 contacts a stationary portion of the MEMS device 1600 (e.g., the actuation electrode 902) in the actuated state (e.g., as illustrated in FIG. 16B). In certain alternative embodiments, an upper surface of the deformable layer 1302 contacts a stationary portion of the MEMS device 1600 (e.g., a layer above the movable element 1640).

Figure 16C:
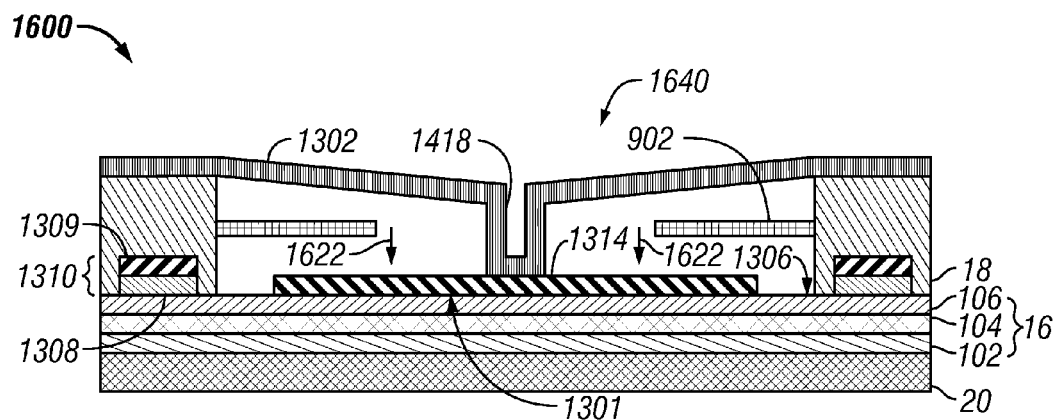

FIG. 16C illustrates an embodiment of the MEMS device 1600 of FIG. 16A in a second actuated state. When voltages are applied to the second actuation electrode 102, electrostatic forces act on the movable element 1440. In response, the deformable layer 1302 towards the second actuation electrode 102. The reflective element 1314 is mechanically coupled to the deformable layer 1302 such that, as the deformable layer 1302 moves towards the second actuation electrode 102, the reflective element 1314 moves a corresponding distance relative to and towards the second actuation electrode 102. The movable element 1640 is responsive to an attractive force produced by applying voltages to the second actuation electrode 102 by moving in a direction towards the second actuation electrode 102, as indicated by arrows 1622. In certain embodiments, the reflective element 1314 contacts a stationary portion of the MEMS device 1600 (e.g., the top surface 1306 of the substrate 20) in the actuated state (e.g., as illustrated in FIG. 16C). In certain alternative embodiments, a lower surface of the deformable layer 1302 contacts a stationary portion of the MEMS device 1600 (e.g., the actuation electrode 902). In certain such embodiments, the reflective element 1314 does not contact the top surface 1306 of the substrate 20 (e.g., the top surface 1306 of the insulating layer 106 or the top surface 1306 of the first reflective layer 104) in the actuated state. In embodiments in which the actuation electrode 902 provides the forces to move the movable element 1640 away from the substrate 20, the second actuation electrode 102 is configured such that the movable element 1640 moves towards the substrate 20 when voltages are applied to the second actuation electrode 102.

Other embodiments of MEMS devices comprising first and second actuation electrodes are also possible. For example, a MEMS device may comprise a first actuation electrode 142 above a movable element comprising a deformable layer 1302 and a reflective element 1314 and a second actuation electrode 102 below the movable element. Additionally, while not depicted in FIGS. 14A, 15A, and 16A, certain portions of the MEMS devices may be in electrical communication with certain other portions. For example, the reflective element 1314 and/or the deformable layer 1302 may be in electrical communication with the first reflective layer 104.

FIGS. 17A-17H illustrate an example embodiment of a method of manufacturing the MEMS device 1300 of FIG. 13A. The MEMS structure 1700 illustrated in FIG. 17A includes a substrate 20 (e.g., comprising glass, plastic), a first reflective layer 104 (e.g., comprising chromium), an optional insulating layer 106 (e.g., comprising $SiO_2$ and/or $Al_2O_3$), a first sacrificial layer 1702, and a reflective element 1314 (e.g., comprising aluminum) having a reflective surface 1301. As discussed above, the insulating layer 106 may be omitted in some embodiments. In some embodiments, the thickness of the first sacrificial layer 1702 influences the color of the MEMS device 1300 in the relaxed state.

In certain embodiments, one or more apertures 1704 are formed through the reflective element 1314 to allow for easier etching of the first sacrificial layer 1702. The amount of distance between the reflective element 1314 and the top surface 1306 of the substrate 20 is proportional to the amount of fluid (e.g., air) in the cavity between the reflective element 1314 and the top surface 1306 of the substrate 20. In certain embodiments of the MEMS device 1300 in which the reflective element 1314 does not contact the top surface 1306 of the substrate 20, the distance between the reflective element 1314 and the top surface 1306 of the substrate 20 becomes very small. For example, the distance is typically small in embodiments that can produce high reflectivity broadband white (e.g., because the distance is less than about 100 Å). Certain such small distances can affect the flow of the fluid (e.g., air) around the reflective element 914 during movement (e.g., relaxation) because some fluid may not have sufficient space to move around the sides of the reflective element 1314 and may instead may become compressed between the reflective element 1314 and the top surface 1306 of the substrate 20. In certain embodiments, the apertures 1704 in the reflective element 1314 provide an additional path for the fluid occupying the cavity between the reflective element 1314 and the top surface 1306 of the substrate 20 to flow from below the reflective element 1314 to above the reflective element 1314 during movement (e.g., relaxation). Thus, the at least one aperture 1704 can increase the speed of the MEMS device 1300. However, the portion of the reflective element 1314 comprising the at least one aperture 1704 is not reflective, which reduces the fill factor of the MEMS device 1300.

In embodiments in which the reflective element 1314 does not contact the top surface 1306 of the substrate 20, the reflective surface 1301 of the reflective element 1314 is preferably substantially smooth and flat, for example to increase color gamut. In some embodiments, the reflective surface 1301 is made substantially smooth and flat by forming the reflective element 1314 on a smooth and flat first sacrificial layer 1702 (e.g., comprising photoresist) or by polishing the first sacrificial layer 1702 (e.g., comprising molybdenum) prior to formation of the reflective element 1314. The reflective surface 1301 of the reflective element 1314 may also be smooth and flat in embodiments in which the reflective element 1314 contacts the top surface 1306 of the substrate 20 (e.g., the top surface 1306 of a 100 nm thick insulating layer 106 to create black or the top surface 1306 of the first reflective layer 104 to create broadband white), although the possible effects of stiction are considered in such embodiments (e.g., by adding insulating or conductive bumps).

In certain embodiments, a black mask 1310 is formed by using the first sacrificial layer 1702 as the first layer 1308 and the material for the reflective element 1314 as the reflective layer 1309. In certain alternative embodiments, the black mask 1310 is formed using one or more other layers. In some embodiments, the MEMS device does not comprise a black mask.

Figure 17A:
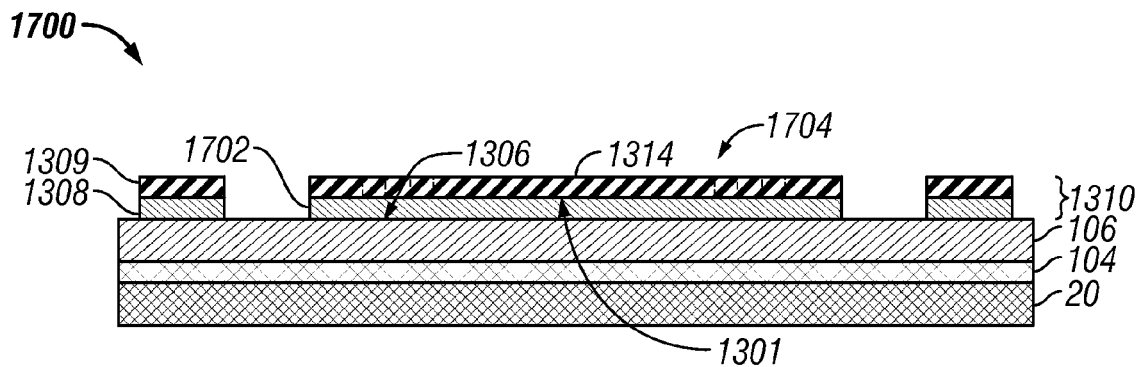
FIGS. 17A-17H schematically illustrate an example series of processing steps for forming an embodiment of a MEMS device having the optical function separated from the electrical function and the mechanical function.
Figure 17B:
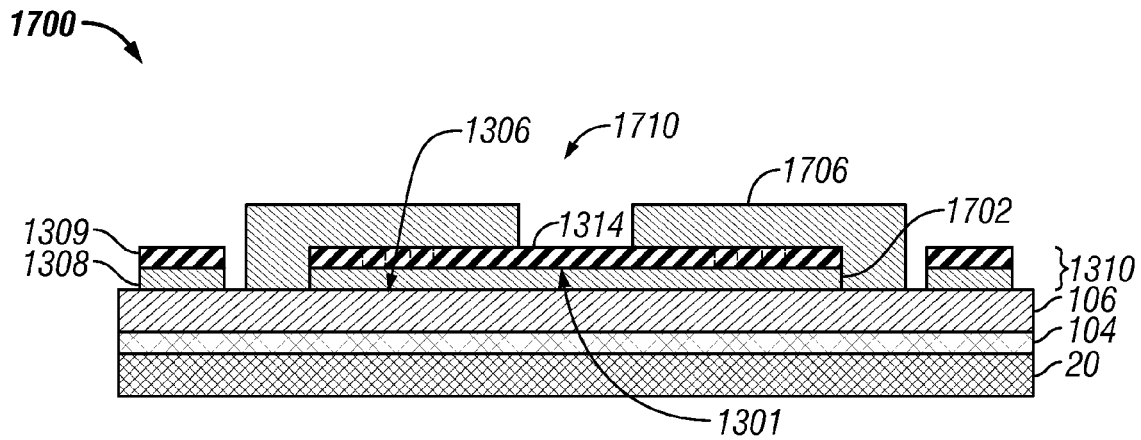

FIG. 17B illustrates the MEMS structure 1700 of FIG. 17A after a second sacrificial layer 1706 (e.g., comprising molybdenum) has been formed over the reflective element 1314. The second sacrificial layer 1706 spaces the reflective element 1314 from the deformable layer 1302. The second sacrificial layer 1706 may comprise the same material as the first sacrificial layer 1702 or a different material than the first sacrificial layer 1702. In some embodiments, formation of the second sacrificial layer 1706 forms an aperture 1710 through the second sacrificial layer 1706. In embodiments in which an insulating or other layer has been formed on an upper surface of the reflective element 1314, the aperture 1710 may allow removal of such layers without additional patterning steps.

Figure 17C:
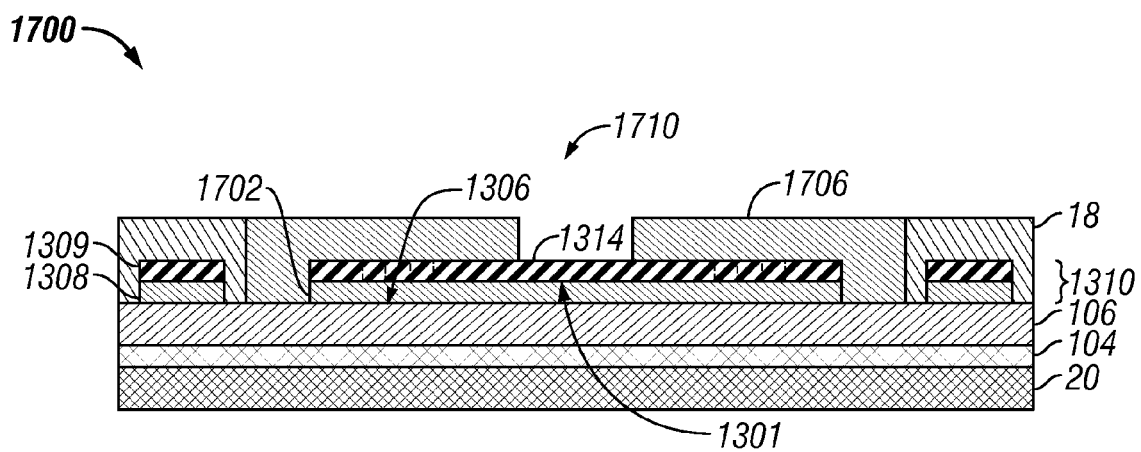

FIG. 17C illustrates the MEMS device 1700 of FIG. 17B after a support structure 18 has been formed. In embodiments comprising a black mask 1310, the support structure 18 may be formed around the black mask 1310 to insulate the conductive layer 1309. In certain alternative embodiments, the support structure 18 is formed before the second sacrificial layer 1706.

Figure 17D:
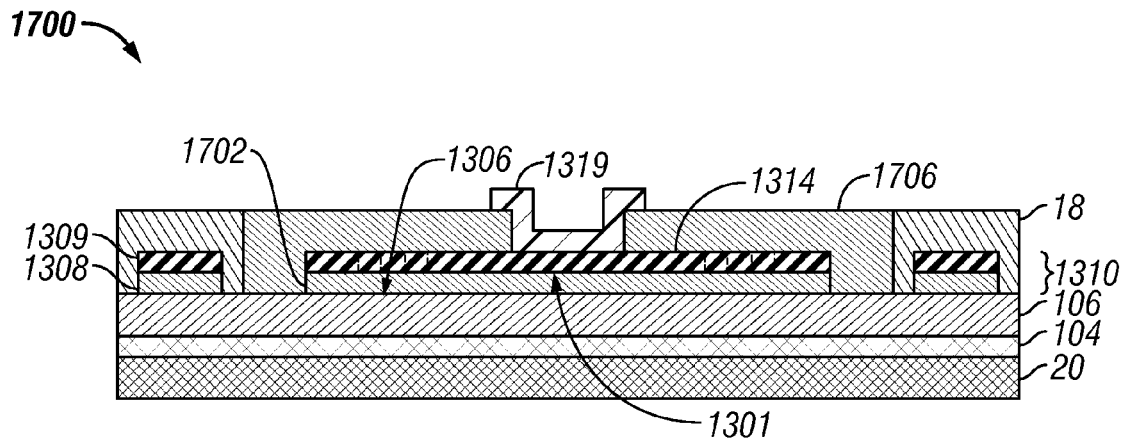

FIG. 17D illustrates the MEMS device 1700 of FIG. 17C after a connecting element 1319 has been formed over the second sacrificial layer 1706 and at least partially in the aperture 1710. The connecting element 1319 is mechanically coupled to the reflective element 1314 through the aperture 1710. In certain alternative embodiments, the support structure 18 is formed after the connecting element 1319.

Figure 17E:
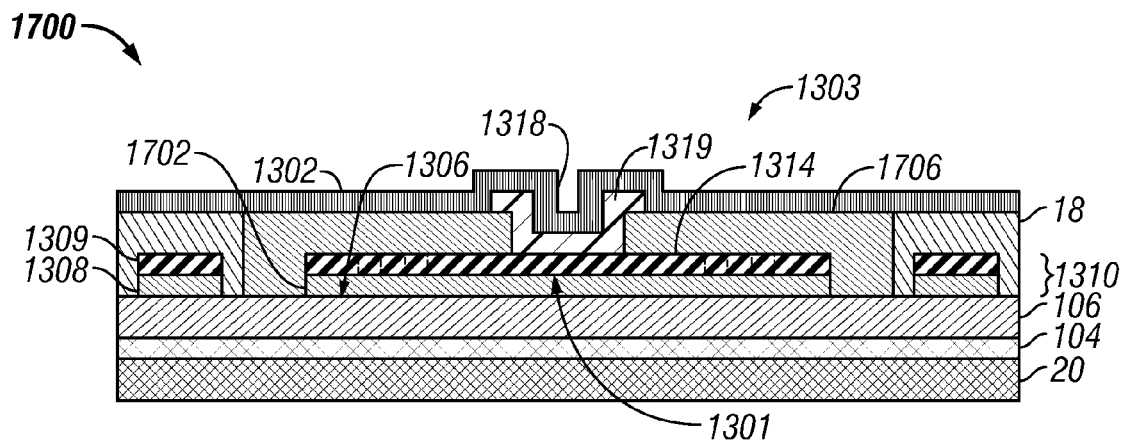

FIG. 17E illustrates the MEMS structure 1700 of FIG. 17D after a deformable layer 1302 (e.g., comprising nickel) has been formed over the support structure 18, the connecting element 1319, and the second sacrificial layer 1706. The deformable layer 1302 is mechanically coupled to the reflective element 1314 by a connecting element 1318 via the connecting element 1319. In certain embodiments, one or more apertures 1303 are formed through the deformable layer 1302 to allow for easier etching of the second sacrificial layer 1706.

Figure 17F:
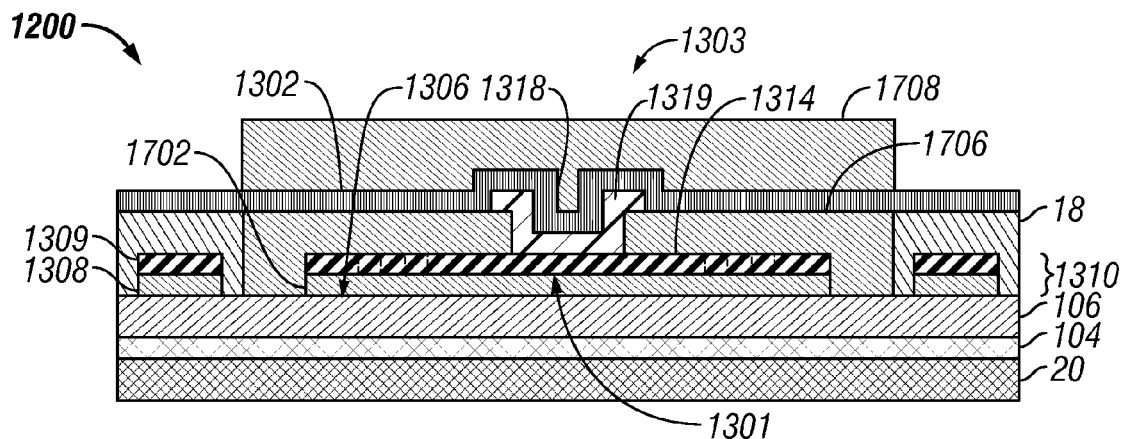

FIG. 17F illustrates the MEMS structure 1700 of FIG. 17E after a third sacrificial layer 1708 (e.g., comprising molybdenum) has been formed over the deformable layer 1302. The third sacrificial layer 1708 spaces the deformable layer 1302 from the actuation electrode 142. The third sacrificial layer 1708 may comprise the same material as one or both of the first and second sacrificial layers 1702, 1706 or a different material than one or both of the first and second sacrificial layers 1702, 1706. In certain embodiments, the thicknesses of the second sacrificial layer 1706 and the third sacrificial layer 1708 influence the color of the MEMS device 1300 in the actuated state.

Figure 17G:
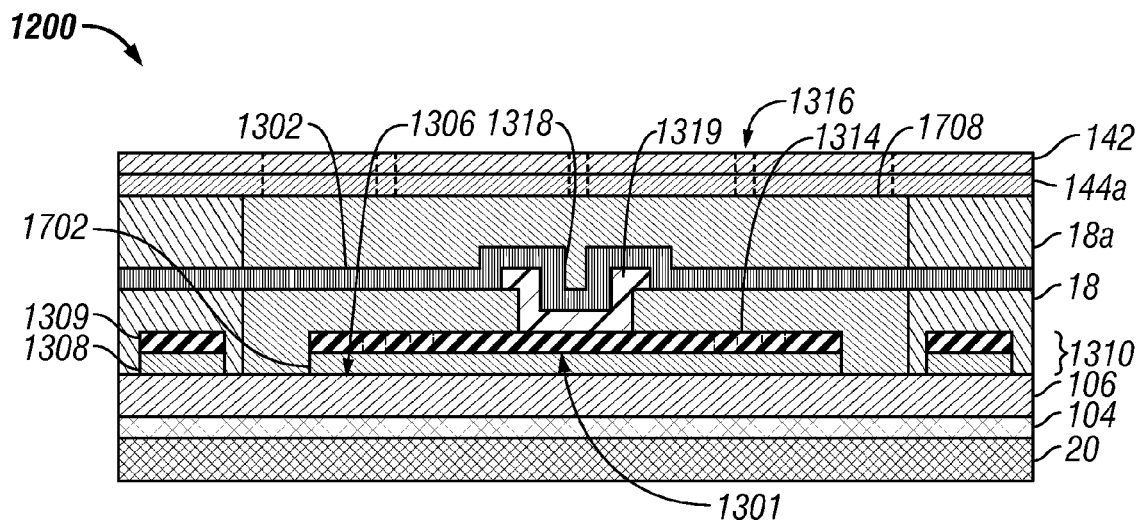

FIG. 17G illustrates the MEMS structure 1700 of FIG. 17F after formation of a support structure 18a over the deformable layer 1302, an insulating layer 144a over the third sacrificial layer 1708, and an actuation electrode 142 over the insulating layer 144a. In some alternative embodiments, the support structure 18a is formed before the third sacrificial layer 1708. In certain embodiments, the support structure 18a is formed while forming the insulating layer 144a (e.g., by depositing SiO$_2$ and patterning the SiO$_2$). In some embodiments, the actuation electrode 142 and the insulating layer 144a comprise at least one aperture 1316 to allow for easier etching of the third sacrificial layer 1708.

Figure 17H:
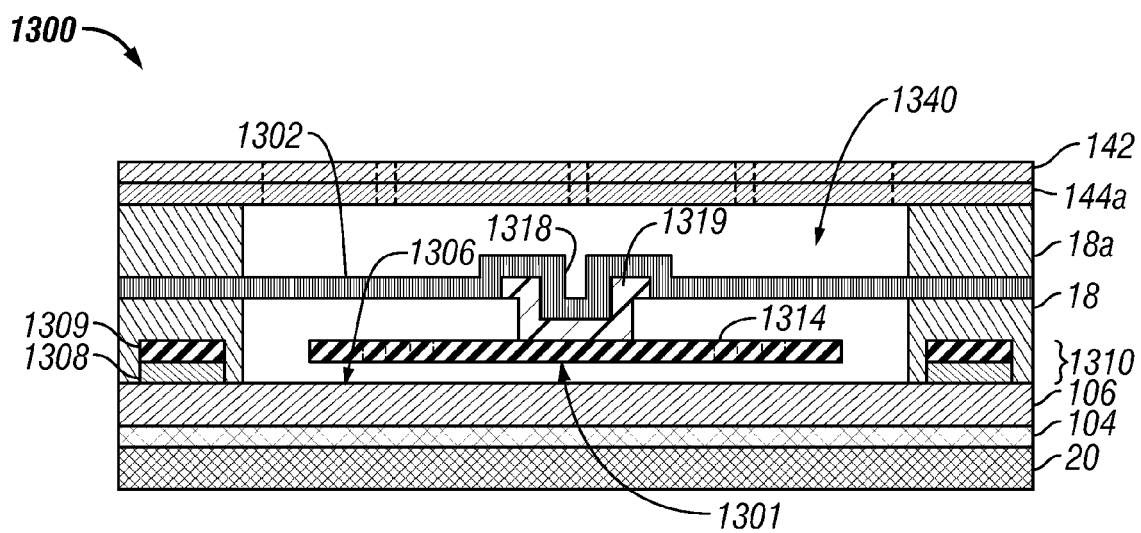

FIG. 17H illustrates the MEMS structure 1700 of FIG. 17G after the first, second, and third sacrificial layers 1702, 1706, 1708 have been removed, resulting in the MEMS device 1300 of FIG. 13A. In embodiments in which the sacrificial layers 1702, 1706, 1708 each comprise molybdenum, they may be removed, for example, by etching with XeF$_2$. In embodiments in which a sacrificial layer comprises photoresist, it may be removed, for example, by ashing (e.g., by etching with O$_2$ and/or H$_2$O). The apertures 1704 illustrated in FIG. 17A help the etchant to remove the first sacrificial layer 1702 under the reflective element 1314. The apertures 1303 illustrated in FIG. 17E help the etchant to remove the second sacrificial layer 1706 under the deformable layer 1302. The apertures 1316 illustrated in FIG. 17G help the etchant to remove the third sacrificial layer 1708 under the actuation electrode 142. Upon removal of the sacrificial layers, the movable element 1340 can move in response to voltages applied to the actuation electrode 142.

Figure 18A:
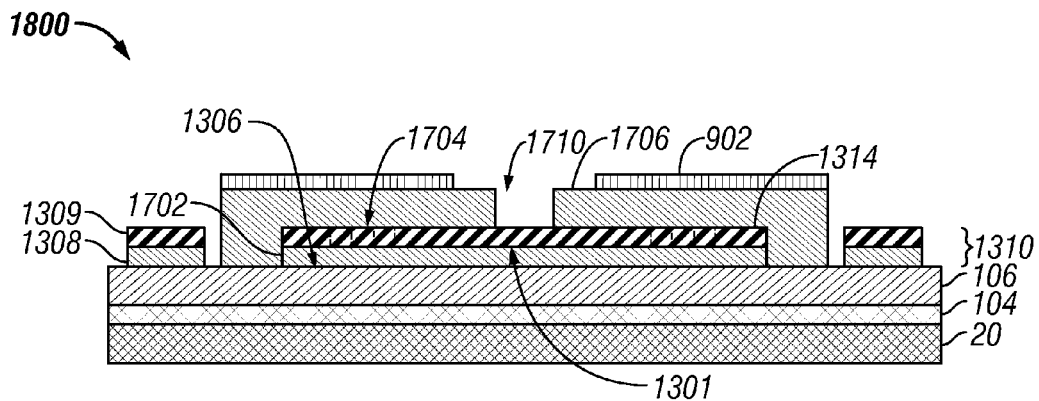
FIGS. 18A-18G schematically illustrate an example series of processing steps for forming another embodiment of a MEMS device having the optical function separated from the electrical function and the mechanical function.

FIGS. 18A-18G illustrate an example embodiment of a method of manufacturing the MEMS device 1400 of FIG. 14A. FIG. 18A illustrates the MEMS structure 1700 of FIG. 17B after the formation of a second actuation electrode 902 over the second sacrificial layer 1706. As described above, the second actuation electrode 902 may comprise a multi-layer stack. In such embodiments, formation of the second actuation electrode 902 may comprise a series of patterning steps (e.g., for each layer of the multi-layer stack, deposition, mask formation, etch, and mask removal) or a single patterning step comprising multiple etches (e.g., deposition of each layer of the multi-layer stack, mask formation, etch of each layer of the multi-layer stack, mask removal). Other sequences are also possible (e.g., deposition of each layer of the multi-layer stack, mask formation, etch of the top layer of the multi-layer stack, and use one or more upper layers as a mask for one or more lower layers). The thicknesses of the layers of the multi-layer stack may vary, although the resulting second actuation electrode 902 is preferably rigid enough that it does not substantially deform.

In embodiments in which the movable element 1440 is configured to move towards the substrate 20 upon application of voltages to the second actuation electrode 902, an insulating layer 1554 may be formed on the top of the conductive portion 1552 of the second actuation electrode 902 where contact is made with a lower surface of the deformable layer 1302 (e.g., as illustrated in FIGS. 15A and 15B). In certain such embodiments, the top surface of the second actuation electrode 902 may be roughened to reduce the number of contact points in order to decrease stiction with the deformable layer 1302. Other layers (e.g., an anti-stiction layer) may be also be formed on the top of the second actuation electrode 902.

Figure 18B:
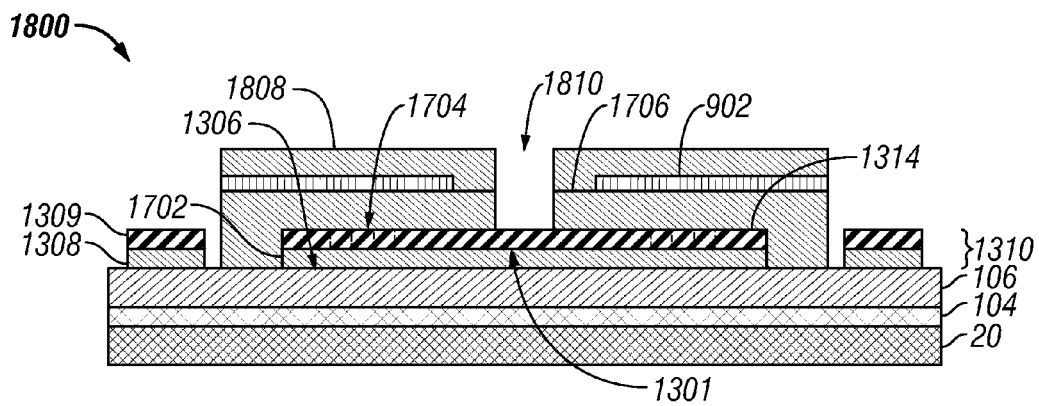

FIG. 18B illustrates the MEMS structure 1800 of FIG. 18A after a third sacrificial layer 1808 (e.g., comprising molybdenum) has been formed over the second actuation electrode 902. The third sacrificial layer 1808 spaces the second actuation electrode 902 from the deformable layer 1302. The third sacrificial layer 1808 may comprise the same material as one or both of the first and second sacrificial layers 1702, 1706 or a different material than one or both of the first and second sacrificial layers 1702, 1706. In some embodiments, formation of the third sacrificial layer 1808 forms an aperture 1810 through the third sacrificial layer 1808. In embodiments in which an insulating or other layer has been formed on an upper surface of the reflective element 1314, the aperture 1810 may allow removal of such layers without additional patterning steps.

Figure 18C:
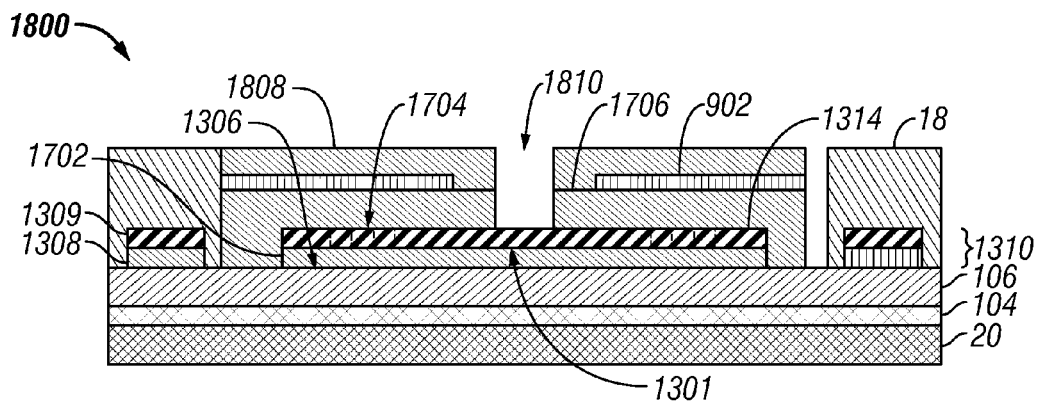

FIG. 18C illustrates the MEMS device 1800 of FIG. 18B after a support structure 18 has been formed. A portion of the second actuation electrode 902 is preferably exposed such that the actuation electrode 902 may be mechanically coupled to the support structure 18. In certain embodiments, the support structure 18 comprises one or more layers of the second actuation electrode 902 (e.g., to allow for electrical routing).

Figure 18D:
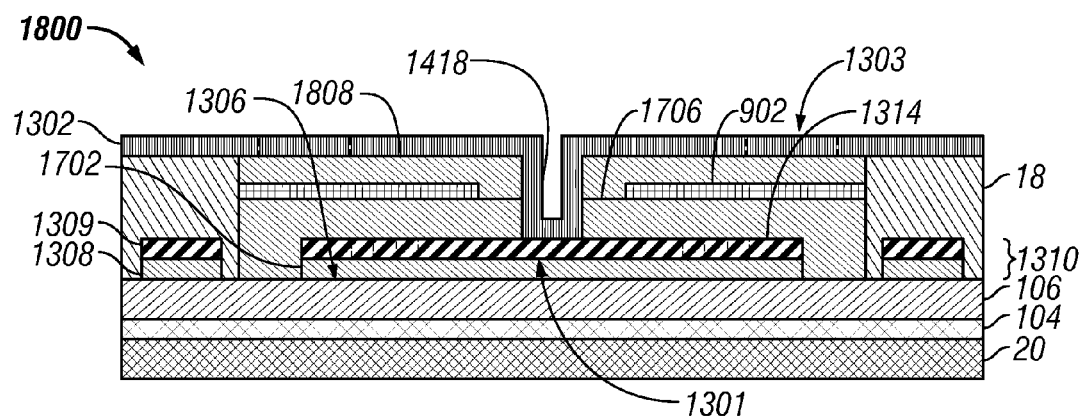

FIG. 18D illustrates the MEMS structure 1800 of FIG. 18C after a deformable layer 1302 (e.g., comprising nickel) has been formed over the support structure 18 and the third sacrificial layer 1808. The deformable layer 1302 is mechanically coupled to the reflective element 1314 by a connecting element 1418. In certain embodiments, a connecting element may be formed between the connecting element 1418 and the reflective element 1314.

Figure 18E:
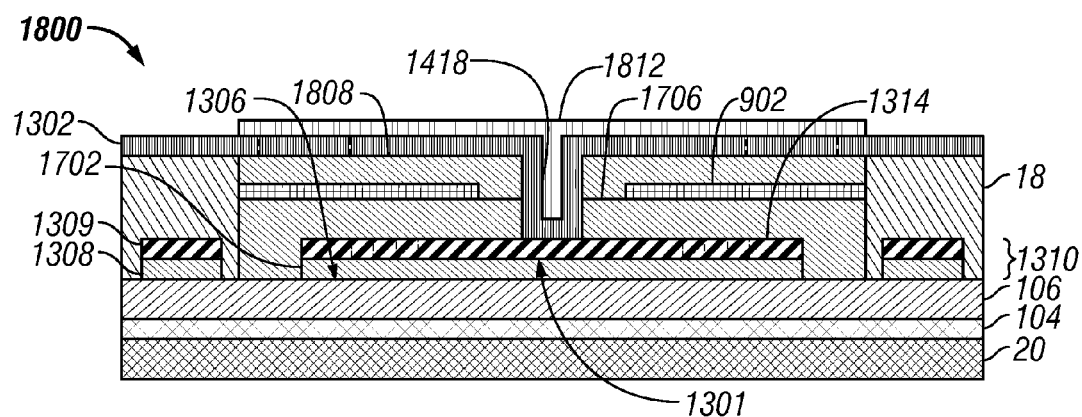

FIG. 18E illustrates the MEMS structure 1800 of FIG. 18D after a fourth sacrificial layer 1812 (e.g., comprising molybdenum) has been formed over the deformable layer 1302. The fourth sacrificial layer 1812 spaces the deformable layer 1302 from the actuation electrode 142. The fourth sacrificial layer 1812 may comprise the same material as one or more of the first, second, and third sacrificial layers 1702, 1706, 1808 or a different material than one or more of the first, second, and third sacrificial layers 1702, 1706, 1808.

Figure 18F:
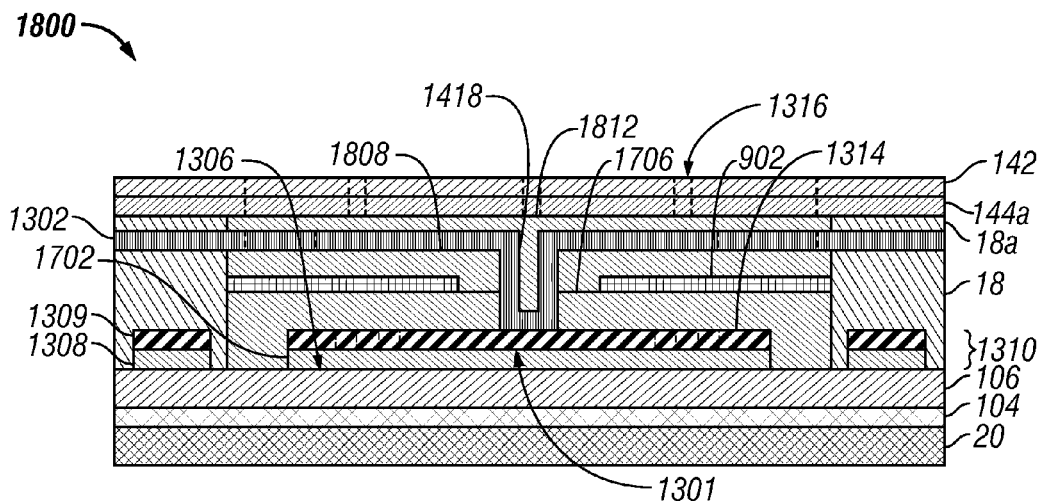

FIG. 18F illustrates the MEMS structure 1800 of FIG. 18E after formation of a support structure 18a over the deformable layer 1302, an insulating layer 144a over the fourth sacrificial layer 1812, and an actuation electrode 142 over the insulating layer 144a. In some alternative embodiments, the support structure 18a is formed before the third sacrificial layer 1808. In some embodiments, the support structure 18a is formed while forming the insulating layer 144a (e.g., by depositing SiO₂ and patterning the SiO₂). In some embodiments, the actuation electrode 142 and the insulating layer 144a comprise at least one aperture 1316 to allow for easier etching of the fourth sacrificial layer 1812.

Figure 18G:
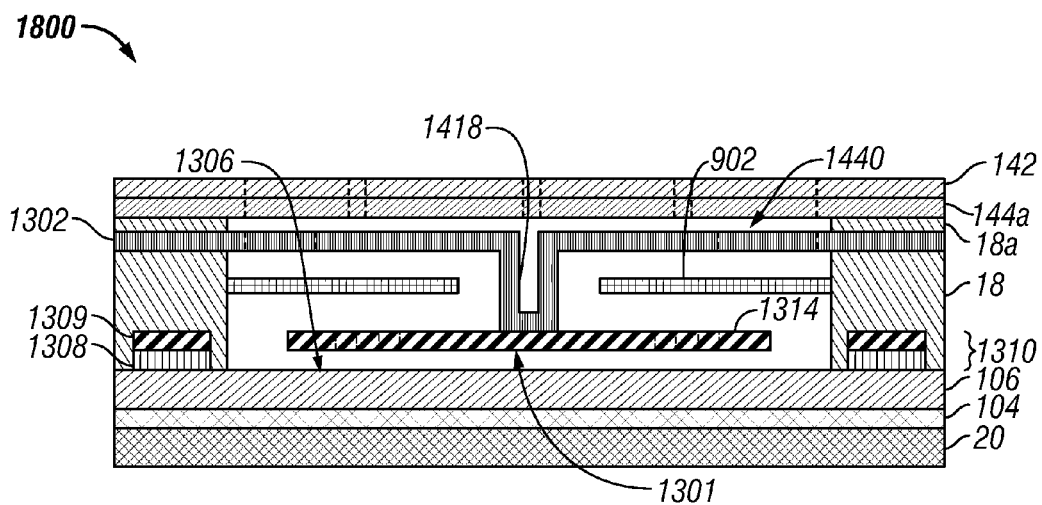

FIG. 18G illustrates the MEMS structure 1800 of FIG. 18F after the first, second, third, and fourth sacrificial layers 1702, 1706, 1808, 1812 have been removed, resulting in the MEMS device 1400 of FIG. 14A. Upon removal of the sacrificial layers, the movable element 1440 can move in response to voltages applied to the actuation electrode 142 and the second actuation electrode 902.

Figure 19A:
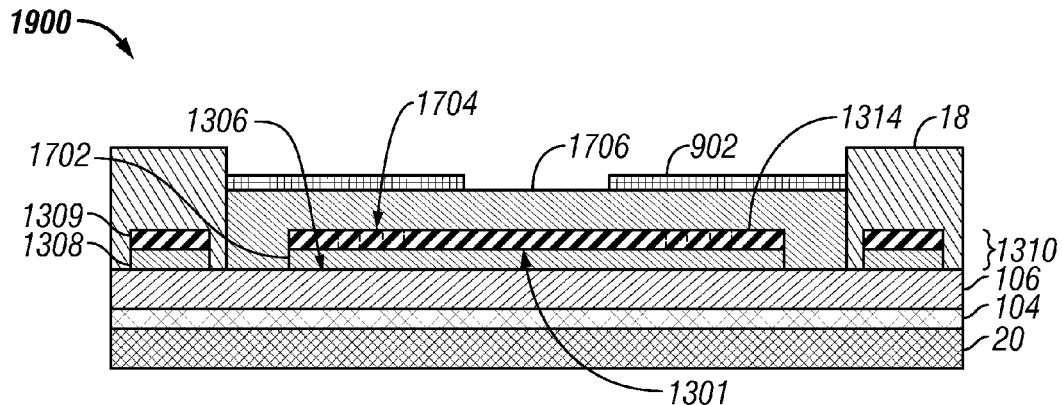
FIGS. 19A-19D schematically illustrate an example series of processing steps for forming yet another embodiment of a MEMS device having the optical function separated from the electrical function and the mechanical function.

FIGS. 19A-19D illustrate an example embodiment of a method of manufacturing the MEMS device 1600 of FIG. 16A. FIG. 19A illustrates the MEMS structure 1800 of FIG. 18A after a support structure 18 has been formed, although an aperture 1710 has not been formed in the second sacrificial layer 1706.

In embodiments in which the movable element 1640 is configured to move away from the substrate 20 upon application of voltages to the actuation electrode 902, an insulating layer 1554 may be formed on the bottom of the conductive portion 1552 of the actuation electrode 902 where contact is made with an upper surface of the reflective element 914. In certain such embodiments, the bottom surface of the actuation electrode 902 may be roughened to reduce the number of contact points in order to decrease stiction with the reflective element 914. Other layers (e.g., an anti-stiction layer) may be also be formed on the bottom of the actuation electrode 902.

Figure 19B:
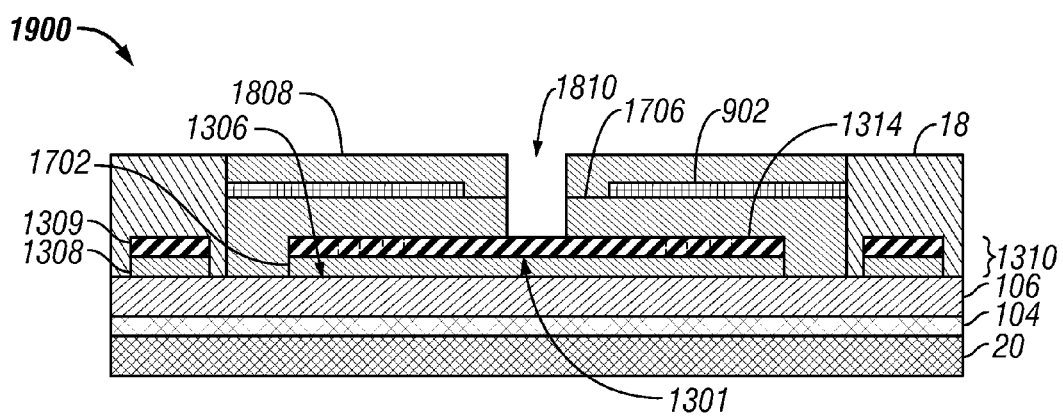

FIG. 19B illustrates the MEMS structure 1900 of FIG. 19A after a third sacrificial layer 1808 (e.g., comprising molybdenum) has been formed over the actuation electrode 902. The third sacrificial layer 1808 spaces the second actuation electrode 902 from the deformable layer 1302. The third sacrificial layer 1808 may comprise the same material as one or both of the first and second sacrificial layers 1702, 1706 or a different material than one or both of the first and second sacrificial layers 1702, 1706. In some embodiments, formation of the third sacrificial layer 1808 forms an aperture 1810 through the second and third sacrificial layer 1706, 1808. In embodiments in which an insulating or other layer has been formed on an upper surface of the reflective element 1314, the aperture 1810 may allow removal of such layers without additional patterning steps. In some alternative embodiments, the support structure 18a is formed before the third sacrificial layer 1808.

Figure 19C:
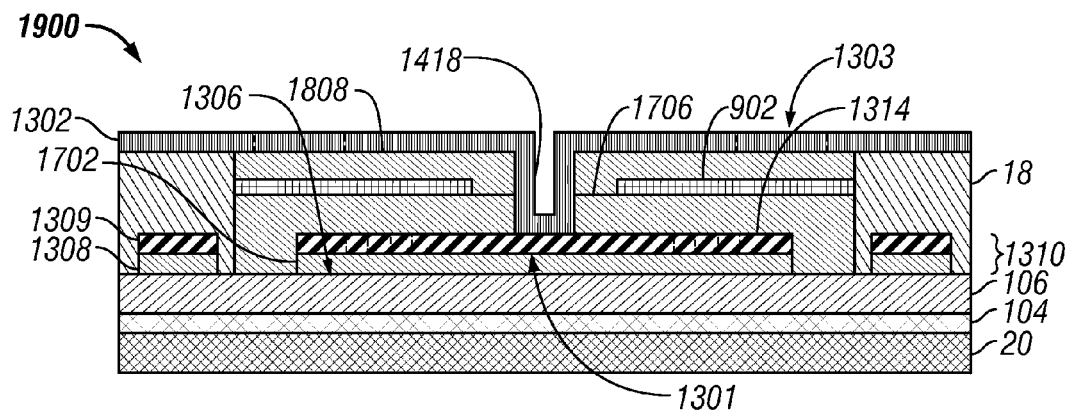

FIG. 19C illustrates the MEMS structure 1900 of FIG. 19C after a deformable layer 1302 (e.g., comprising nickel) has been formed over the support structure 18 and the third sacrificial layer 1808. The deformable layer 1302 is mechanically coupled to the reflective element 1314 by a connecting element 1418.

Figure 19D:
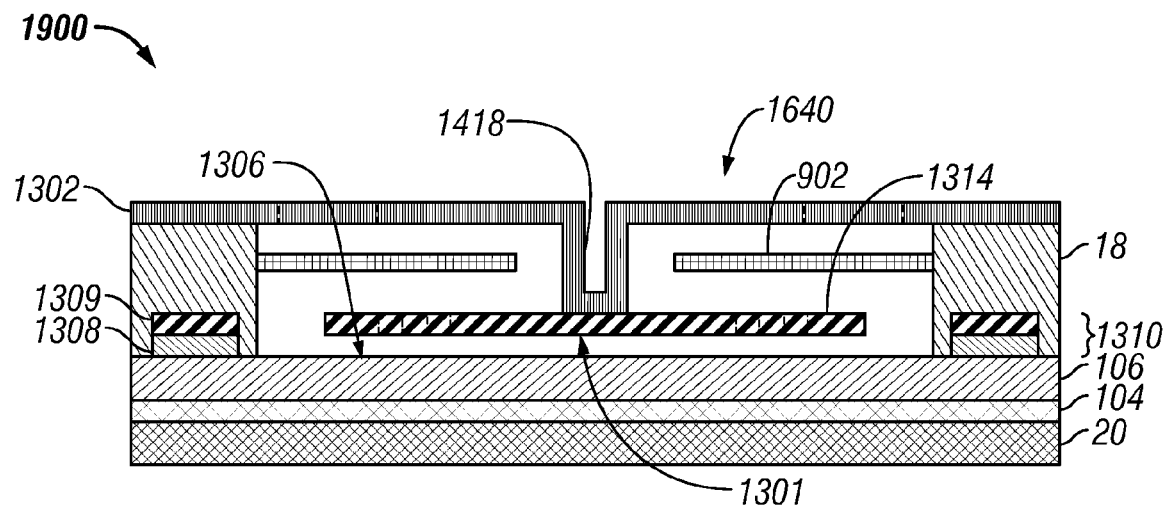

FIG. 19D illustrates the MEMS structure 1900 of FIG. 19C after the first, second, and third sacrificial layers 1702, 1706, 1808 have been removed, resulting in the MEMS device 1600 of FIG. 16A. Upon removal of the sacrificial layers, the movable element 1640 can move in response to voltages applied to the actuation electrode 902 and the second actuation electrode 102.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others. The scope of the invention is indicated by the appended claims rather than by the foregoing description. All changes which come within the meaning and range of equivalency of the claims are to be embraced within their scope.

What is claimed is:

1. An electromechanical device comprising:
a substrate;
an actuation electrode; and
a movable element between the substrate and the actuation electrode, the movable element including a deformable layer and a reflective element each being between the substrate and the actuation electrode, the deformable layer spaced from the reflective element along a direction generally perpendicular to the reflective element, wherein the movable element is configured to be selectively switched among at least a first state having a first spectral reflectance being a first color, a second state having a second spectral reflectance being a second color, and a third state having a third spectral reflectance being a black state,
wherein the first state includes the reflective element in a relaxed position, wherein the second state includes the reflective element in a first actuated position, and wherein the third state includes the reflective element in a second actuated position,
wherein the reflective element is movable to the second actuated position upon application of a voltage difference between the reflective element and a second actuation electrode, and
wherein the reflective element is movable to at least one of the first actuated position and the second actuated position upon application of voltage potential differences both between the reflective element and the actuation electrode and between the reflective element and the second actuation electrode.

2. The device of claim 1, wherein a top surface of the substrate is spaced from the reflective element when no voltage is applied to the actuation electrode.

3. The device of claim 1, further comprising a support structure between the substrate and the deformable layer, the support structure configured to support the deformable layer.

4. The device of claim 1, comprising a stationary element configured to be a stop for movement of the movable element.

5. The device of claim 4, further comprising a roughened surface between the stationary element and the movable element.

6. The device of claim 4, further comprising an anti-stiction layer between the stationary element and the movable element.

7. The device of claim 4, wherein the stationary element includes an insulating layer between the deformable layer and the actuation electrode.

8. The device of claim 1, wherein an interference display element includes the device.

9. The device of claim 1, wherein the first color is substantially yellow and the second color is substantially blue, or wherein the first color is substantially yellow and the second color is substantially cyan.

10. The device of claim 1, wherein the first color has an order and the second color has a same or higher order.

11. The device of claim 1, wherein the reflective element is movable to the first actuated position upon application of a voltage difference between the reflective element and the actuation electrode.

12. The device of claim 1, further comprising:
a display;
a processor configured to communicate with the display, the processor configured to process image data; and
a memory device configured to communicate with the processor.

13. The device of claim 12, further comprising:
a driver circuit configured to send at least one signal to the display; and
a controller configured to send at least a portion of the image data to the driver circuit.

14. The device of claim 12, further comprising an image source module configured to send the image data to the processor; wherein the image source module includes at least one of a receiver, a transceiver, and a transmitter.

15. The device of claim 12, further comprising an input device configured to receive input data and to communicate the input data to the processor.

16. The device of claim 1, wherein the substrate includes an optical stack.

17. The device of claim 16, wherein light incident on the reflective element is reflected from the reflective element, the incident light and the reflected light propagating through the optical stack and not propagating through the actuation electrode.

18. The device of claim 1, wherein the actuation electrode includes a non-transparent conductor.

19. The device of claim 18, wherein the non-transparent conductor includes at least one of aluminum (Al), copper (Cu), silver (Ag), and gold (Au).

20. The device of claim 1, wherein the substrate includes the second actuation electrode.

21. The device of claim 1, wherein the second actuation electrode is between the deformable layer and the reflective element.

22. An electromechanical device comprising:
means for moving a portion of the device, the moving means including means for deforming and means for reflecting, the deforming means spaced from the reflecting means along a direction generally perpendicular to the reflecting means;
means for supporting the moving means; and
means for actuating the moving means, the moving means including both the deforming means and the reflecting means each being between the supporting means and the actuating means, wherein the moving means is configured to be selectively switched among at least a first state having a first spectral reflectance being a first color, a second state having a second spectral reflectance being a second color, and a third state having a third spectral reflectance being a black state,
wherein the first state includes the reflecting means in a relaxed position, wherein the second state includes the reflecting means in a first actuated position, and wherein the third state includes the reflecting means in a second actuated position,
wherein the reflecting means is movable to the second actuated position upon application of a voltage difference between the reflecting means and second means for actuating the moving means, and
wherein the reflecting means is movable to at least one of the first actuated position and the second actuated position upon application of voltage potential differences both between the reflecting means and the actuating means and between the reflecting means and the second actuating means.

23. The device of claim 22, wherein the supporting means includes a substrate, or wherein the moving means includes a movable element, or wherein the deforming means includes a deformable layer, or wherein the reflecting means includes a reflective element, or wherein the actuating means includes an actuation electrode.

24. The device of claim 22, comprising means for stopping movement of the moving means.

25. The device of claim 24, further comprising a roughened surface between the stopping means and the moving means.

26. The device of claim 24, further comprising an anti-stiction layer between the stopping means and the moving means.

27. The device of claim 24, wherein the stopping means includes an insulating layer between the deforming means and the actuating means.

28. The device of claim 22, wherein the first color is substantially yellow and the second color is substantially blue, or wherein the first color is substantially yellow and the second color is substantially cyan.

29. The device of claim 22, wherein the first color has an order and the second color has a same or higher order.

30. The device of claim 22, wherein the reflecting means is movable to the first actuated position upon application of a voltage difference between the reflecting means and the actuating means.

31. The device of claim 22, wherein the second actuating means includes a second actuation electrode.

32. The device of claim 22, wherein the supporting means includes the second actuating means.

33. The device of claim 22, wherein the second actuating means is between the deforming means and the reflecting means.

34. A method for modulating light, comprising:
providing a display element including a substrate, a movable element, and an actuation electrode, the movable element including a deformable layer and a reflective element each being between the substrate and the actuation electrode, the deformable layer spaced from the reflective element along a direction generally perpendicular to the reflective element;
applying a voltage to the actuation electrode, the voltage generating an attractive force on the movable element, thereby causing the movable element to move away from the substrate; and
selectively switching the movable element among at least a first state having a first spectral reflectance being a first color, a second state having a second spectral reflectance being a second color, and a third state having a third spectral reflectance being a black state,
wherein selectively switching the movable element among the first state includes switching the reflective element to a relaxed position, wherein selectively switching the movable element among at least the second state includes switching the reflective element to a first actuated position, and wherein selectively switching the movable element among at least the third state includes switching the reflective element to a second actuated position, wherein switching the reflective element to the second actuated position includes applying a voltage difference between the reflective element and a second actuation electrode, and wherein switching the reflective element to at least one of the first actuated position and the second actuated position includes applying voltage potential differences both between the reflective element and the actuation electrode and between the reflective element and the second actuation electrode.

35. The method of claim 34, wherein the display element includes a stationary element, and wherein the method further comprises contacting the stationary element and stopping movement of the movable element.

36. The method of claim 35, wherein contacting the stationary element includes touching the deformable layer to the stationary element.

37. The method of claim 35, wherein contacting the stationary element includes touching the reflective element to the stationary element.

38. The method of claim 34, wherein the first color is substantially yellow and the second color is substantially blue, or wherein the first color is substantially yellow and the second color is substantially cyan.

39. The method of claim 34, wherein the first color has an order and the second color has a same or higher order.

40. The method of claim 34, wherein switching the reflective element to the first actuated position includes applying a voltage difference between the reflective element and the actuation electrode.

41. The method of claim 34, wherein the substrate includes the second actuation electrode.

42. The method of claim 34, wherein the second actuation electrode is between the deformable layer and the reflective element.

* * * * *